(12) United States Patent
Inoue et al.

(10) Patent No.: US 6,700,300 B2
(45) Date of Patent: Mar. 2, 2004

(54) SURFACE ACOUSTIC WAVE DEVICE AND PIEZOELECTRIC SUBSTRATE USED THEREFOR

(75) Inventors: Kenji Inoue, Tokyo (JP); Katsuo Sato, Tokyo (JP); Hiroki Morikoshi, Tokyo (JP); Katsumi Kawasaki, Tokyo (JP); Jun Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 49 days.

(21) Appl. No.: 09/968,820

(22) Filed: Oct. 2, 2001

(65) Prior Publication Data

US 2003/0164657 A1 Sep. 4, 2003

(30) Foreign Application Priority Data

Oct. 4, 2000 (JP) .......................................... 2000-305106

(51) Int. Cl.$^7$ .............................................. H01L 41/08
(52) U.S. Cl. ................................. 310/313 A; 310/360
(58) Field of Search ........................ 310/313 A, 313 R, 310/360

(56) References Cited

U.S. PATENT DOCUMENTS

| | | | | |
|---|---|---|---|---|
| 6,246,149 | B1 | * | 6/2001 | Inoue et al. ............. 310/313 A |
| 6,400,061 | B1 | * | 6/2002 | Inoue et al. ............. 310/313 A |
| 6,424,081 | B1 | * | 7/2002 | Chai et al. ................... 310/358 |
| 6,452,306 | B1 | * | 9/2002 | Inoue et al. ............. 310/313 A |

OTHER PUBLICATIONS

Yasutaka Shimizu—"Propagation Characteristics of SAW Materials and Their Current Application"—Transaction of The Institute of Electronics, Information and Communication Engineers A. vol. J76–A, No. 2, pp. 129–137 (1993) and English abstract thereof.

"4.1.2. Effective Electromechanical Coupling Factor of Surface Wave" in "Chapter I. Basis" in "Surface Acoustic Wave Device and its Application" (edited by Electronic Materials Manufacturers Association, published by The Nikkan Kogyo Shinbun, Ltd 1978). and English abstract thereof.

Bruce H.T. Chai—"Langasite Family Compounds for Bulk and Surface Acoustic Device Applications"—A Lecture from the 29th Annual Electromechanical Symposium. May 18–19, 2000—Chiba, Japan.

* cited by examiner

*Primary Examiner*—Mark Budd
(74) *Attorney, Agent, or Firm*—Brown Raysman Millstein Felder & Steiner LLP

(57) ABSTRACT

A compact and wide band surface acoustic wave device for intermediate-frequency is disclosed. A piezoelectric substrate for use in a surface acoustic wave device having high electromechanical coupling factor and low SAW velocity is also disclosed.

The surface acoustic wave device is constituted of a piezoelectric substrate 1 and inter-digital electrodes 2, 2 formed on the piezoelectric substrate 1. The piezoelectric substrate 1 has a crystal structure of $Ca_3Ga_2Ge_4O_{14}$ and is represented by the chemical formula, $Ca_3TaGa_3Si_2O_{14}$. A cut angle of the piezoelectric substrate 1 cut out of the single crystal and a direction of propagation of surface acoustic waves on the piezoelectric substrate represented in terms of Euler's angles ($\phi$, $\theta$, $\psi$) are found in an area represented by $-2.5° \leq \phi \leq 2.5°$, $30° \leq \theta \leq 90°$, and $-65° \leq \psi \leq 65°$.

59 Claims, 22 Drawing Sheets

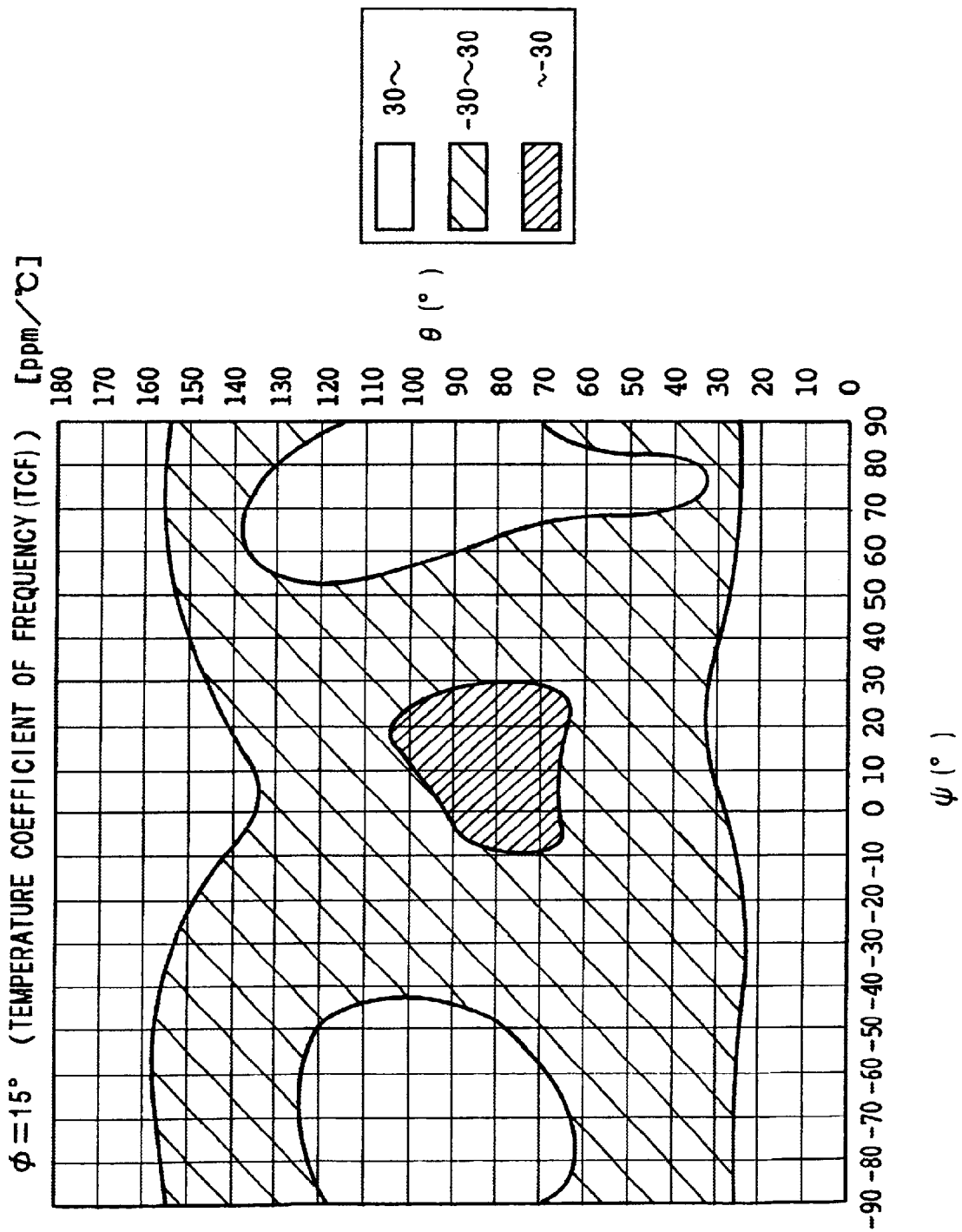

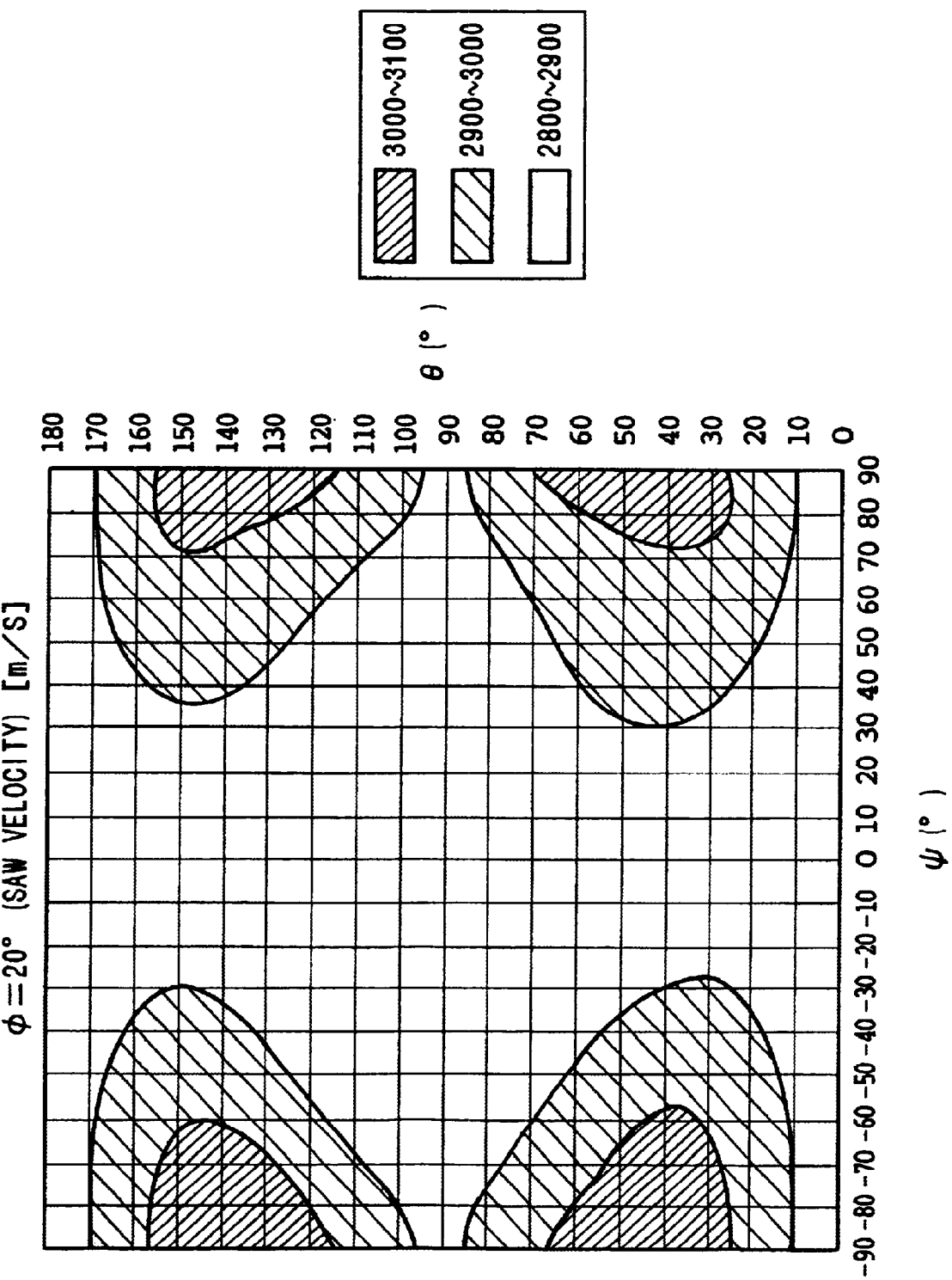

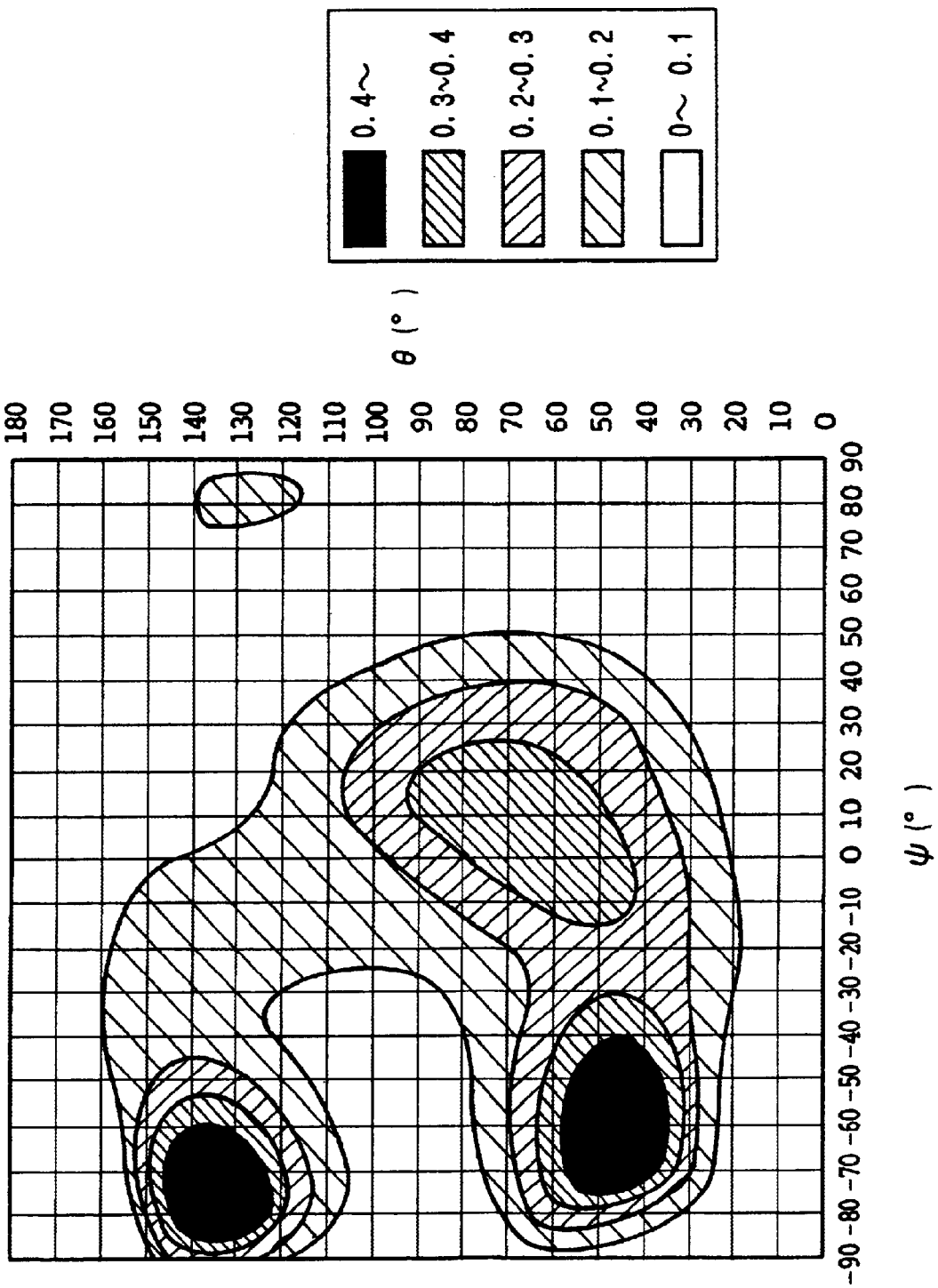

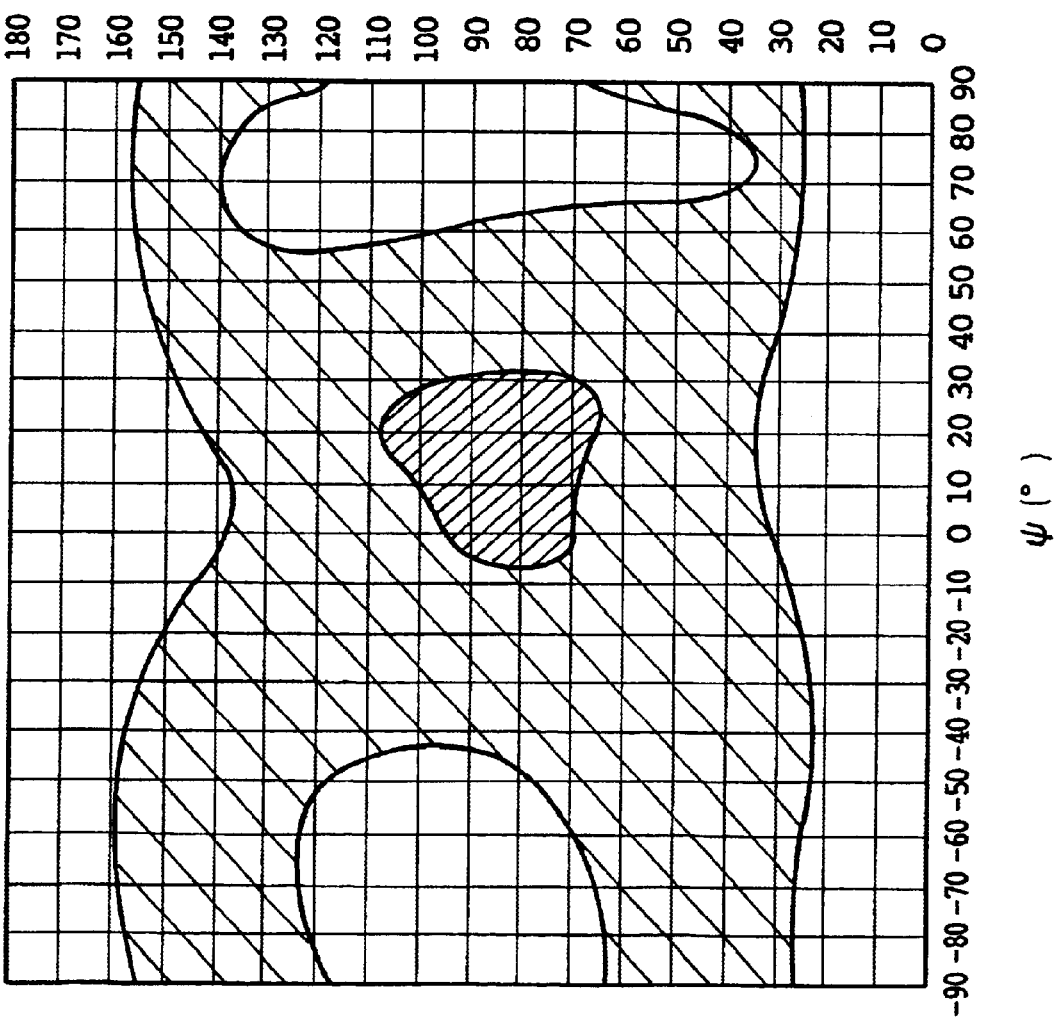

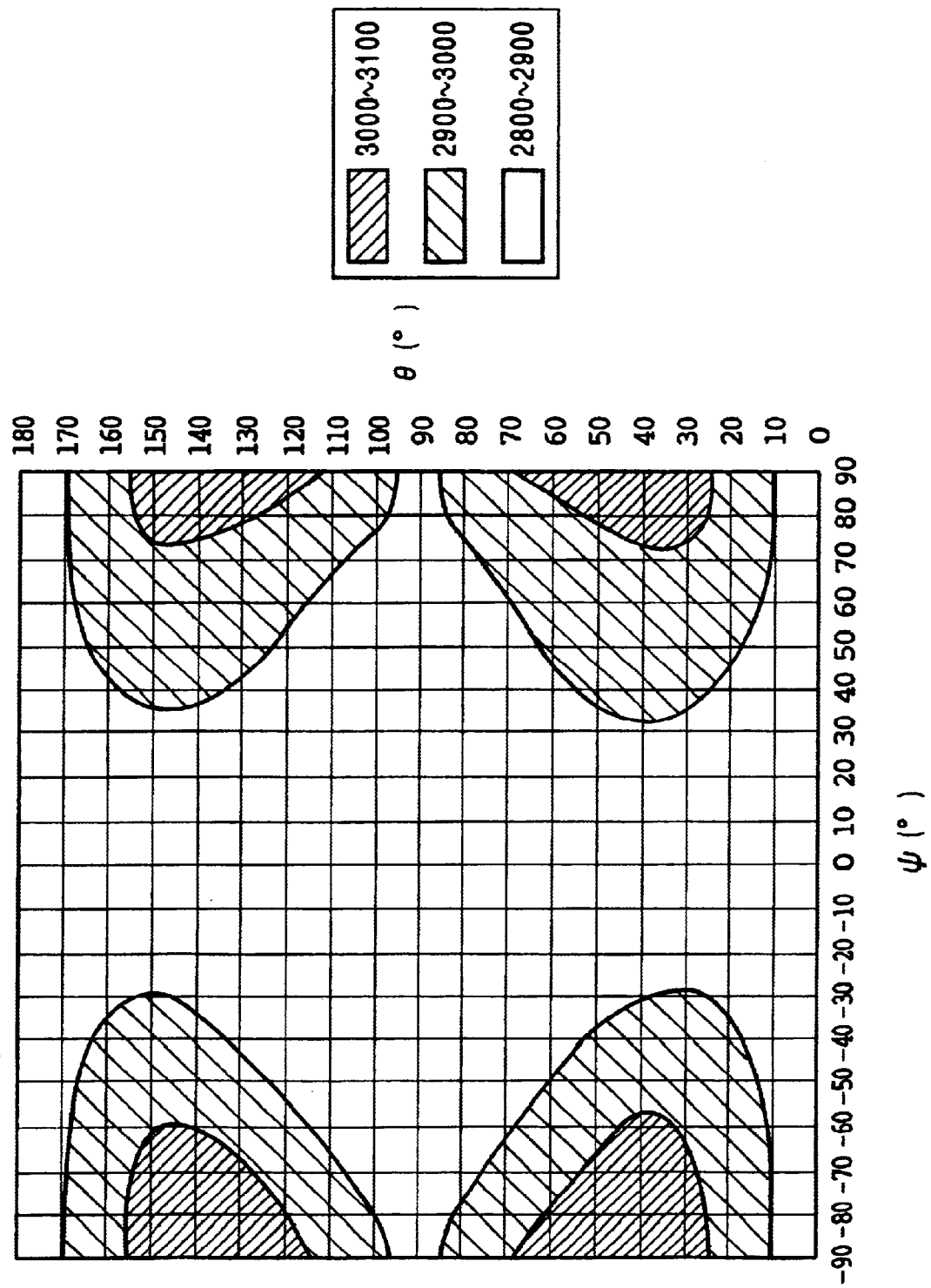

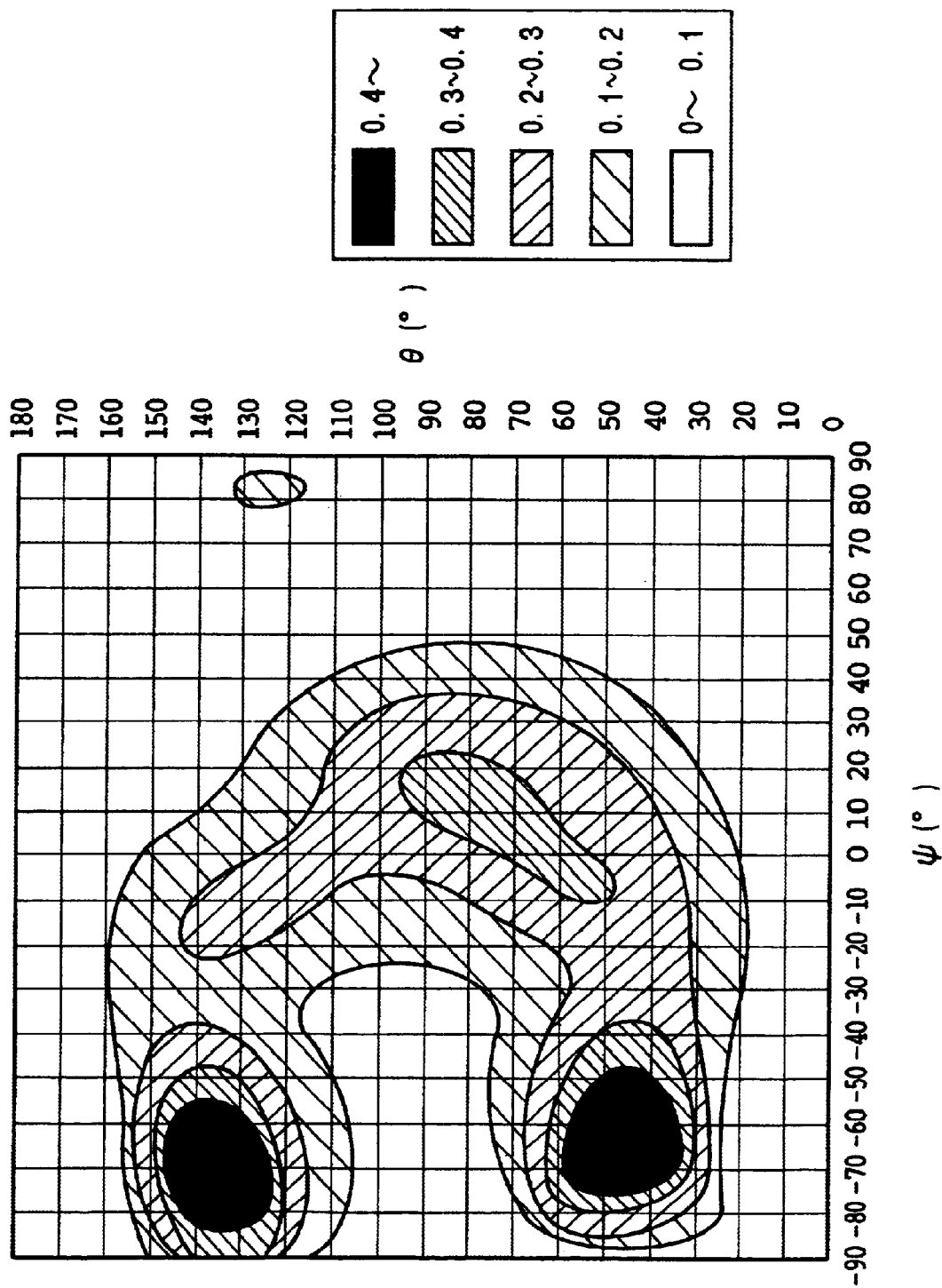

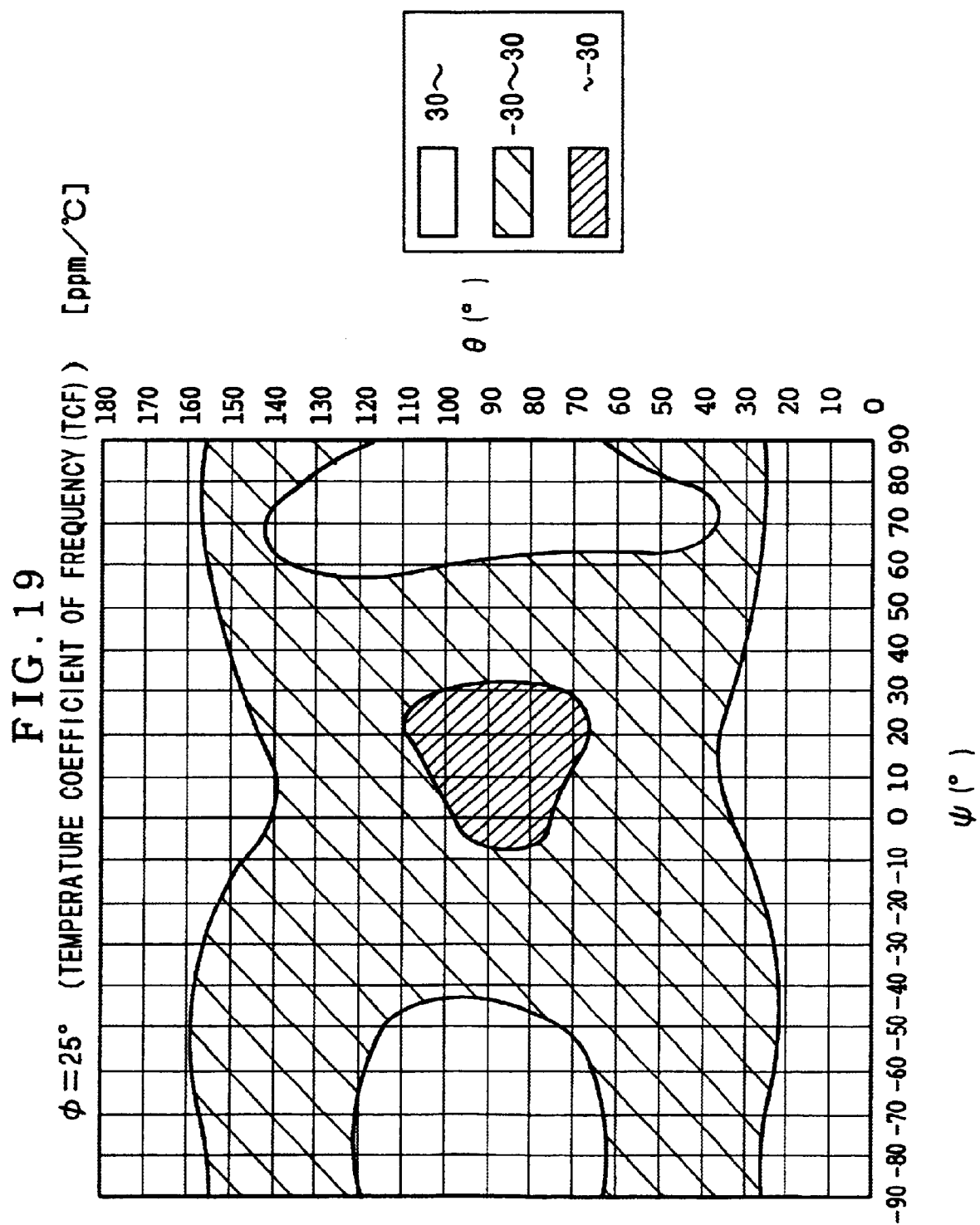

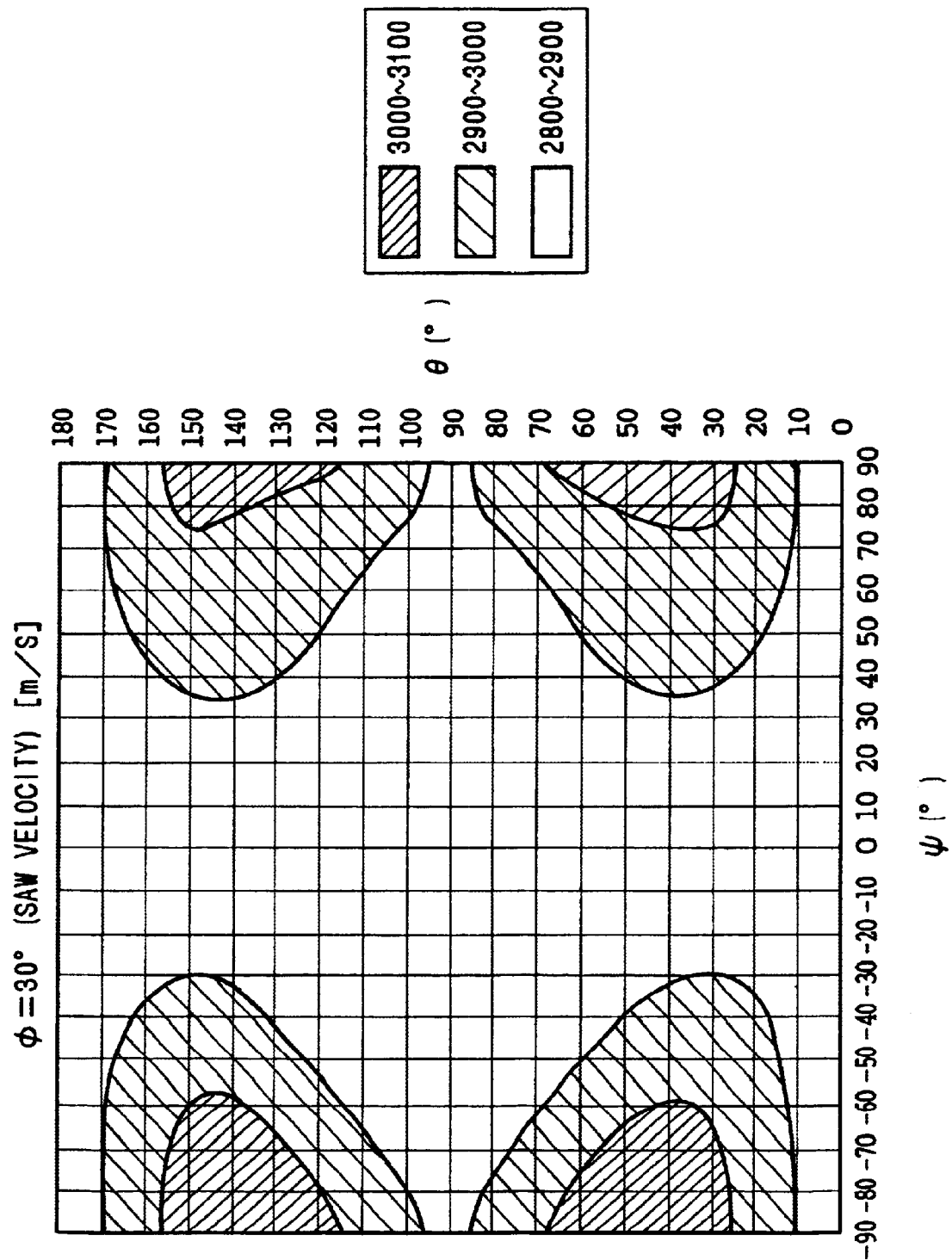

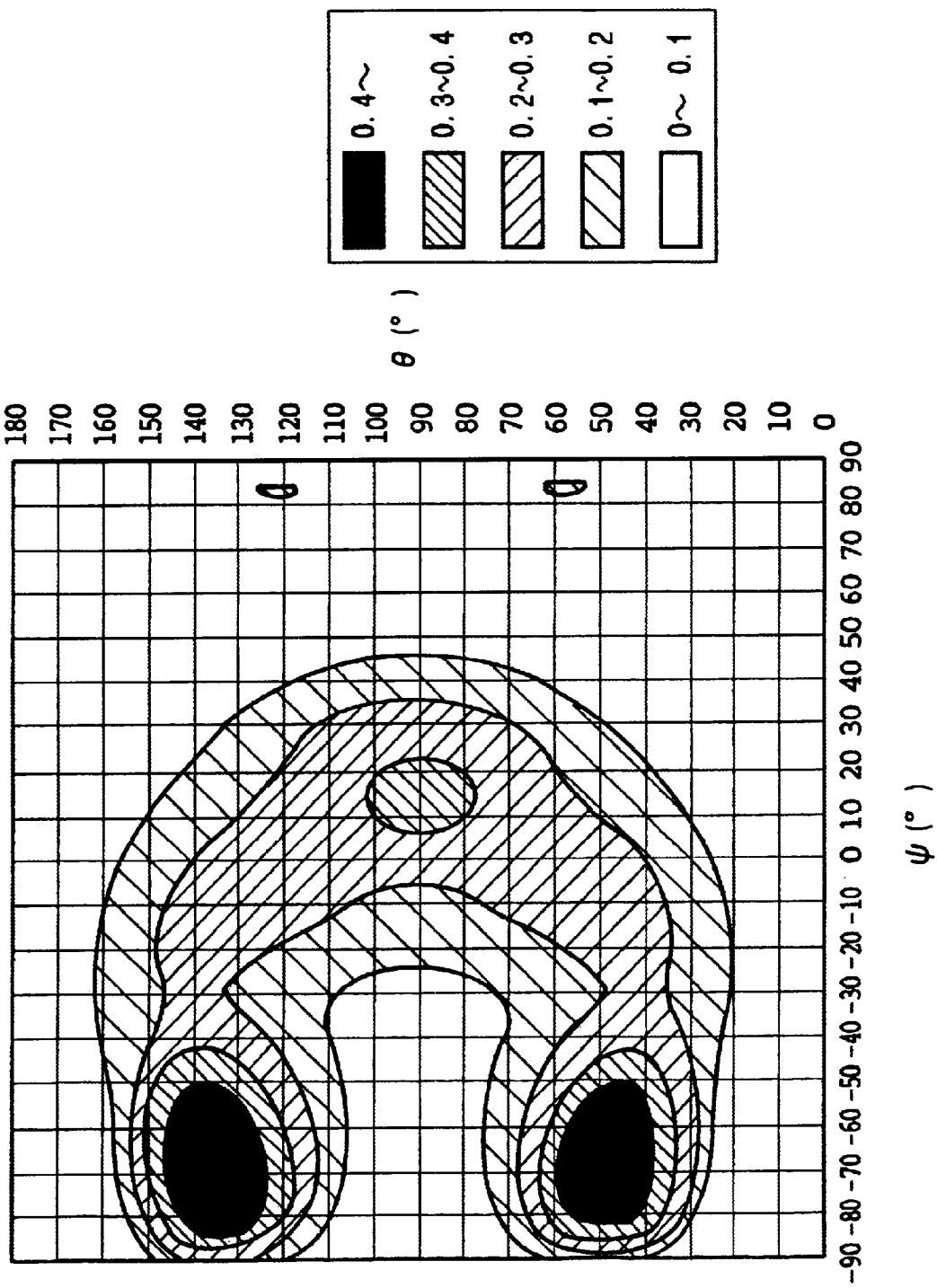

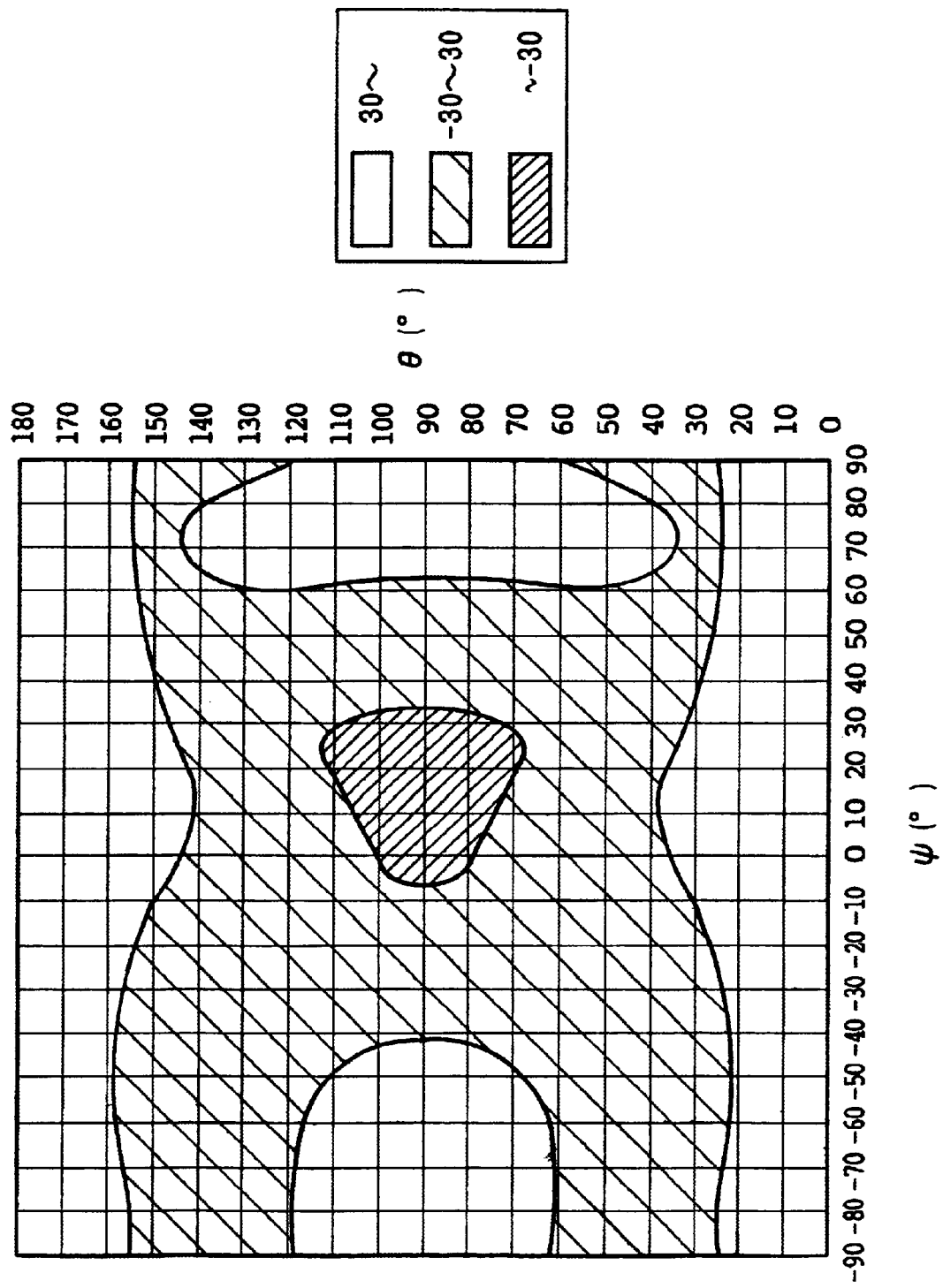

SURFACE ACOUSTIC WAVE DEVICE AND PIEZOELECTRIC SUBSTRATE USED THEREFOR

BACKGROUND OF THE INVENTION

The present invention relates to a surface acoustic wave device and a piezoelectric substrate used therefor.

DESCRIPTION OF THE PRIOR ART

In recent years, various kinds of mobile communication terminal devices, including cellular telephones, have come into widespread use. It is highly desirable to reduce this kind of terminal equipment in size and weight for enhanced portability. In order to reduce the size and weight of terminal devices, their electronic parts must be substantially reduced in size and weight. For this reason, surface acoustic wave devices enabling size and weight reduction, namely, surface acoustic wave filters, are often used for high- and intermediate-frequency parts of terminal devices. Such devices are formed with an inter-digital electrode for exciting, receiving, reflecting and propagating surface acoustic waves on the surface of a piezoelectric substrate thereof.

Among characteristics important to a piezoelectric substrate used for surface acoustic wave devices are surface wave velocity (SAW velocity), temperature coefficient of center frequency in the case of filters or of resonant frequency in the case of resonators (the temperature coefficient of frequency: TCF), and electromechanical coupling factor ($k^2$). The characteristics of typical piezoelectric substrates currently known for surface acoustic wave devices are set forth below in Table 1. For details regarding these characteristics, reference should be made to Yasutaka SHIMIZU, "Propagation characteristics of SAW materials and their current application", the Transactions of The Institute of Electronics, Information and Communication Engineers A, Vol. J76-A, No.2, pp. 129–137 (1993). Hereinafter, the piezoelectric substrates for surface acoustic wave devices are referred to using the designations in Table 1.

TABLE 1

| Symbol | Composition | Cut Angle | Propagation Direction | SAW Velocity (m/s) | $K^2$ (%) |
|---|---|---|---|---|---|
| 128LN | LiNbO$_3$ | 128°-Rotated Y | X | 3992 | 5.5 |
| 64LN | LiNbO$_3$ | 64°-Rotated Y | X | 4742 | 11.3 |
| 36LT | LiTaO$_3$ | 36°-Rotated Y | X | 4212 | 4.7 |
| LT112 | LiTaO$_3$ | X | 112°-Rotated Y | 3288 | 0.64 |
| ST Quartz Crystal | Quartz Crystal | ST | X | 3158 | 0.14 |

As can be seen from Table 1, currently known piezoelectric substrates are divided into the group including 128LN, 64LN, and 36LT which have high SAW velocities and high electromechanical coupling factor and the group including LT112 and ST quartz crystal which have low SAW velocities and low electromechanical coupling factor. The piezoelectric substrates which belong to the group with high SAW velocity and high electromechanical coupling factor (128LN, 64LN, and 36LT) are used for surface acoustic wave filters of high-frequency parts of terminal devices. The piezoelectric substrates which belong to the group with low SAW velocity and low electromechanical coupling factor (LT112 and ST quartz crystal) are used for surface acoustic wave filters of intermediate-frequency parts of terminal devices.

Various systems are practically employed all over the world for mobile communications devices, typically cellular telephones, and are all used at frequencies of the order of 1 GHz. Therefore, filters used for high-frequency parts of terminal devices have a center frequency of approximately 1 GHz. A surface acoustic wave filter has a center frequency substantially proportional to the SAW velocity of the piezoelectric substrate used and almost inversely proportional to the width of electrode fingers formed on the substrate. To enable such filters to be operated at high frequencies, therefore, it is preferable to utilize substrates having high SAW velocities, for instance, 128LN, 64LN, and 36LT. Also, a wide passband width of 20 MHz or more is required for filters used as high-frequency parts. To achieve such wide passband, however, it is essential for the piezoelectric substrate to have a large electromechanical coupling factor $k^2$. For these reasons, much use is made of 128LN, 64LN, and 36LT.

On the other hand, mobile communication terminal devices use an intermediate frequency in the 70 to 300 MHz band. When a filter having a center frequency in this frequency band is constructed using a surface acoustic wave device, if the aforementioned 128LN, 64LN, or 36 LT is used as the piezoelectric substrate, the widths of the electrode fingers formed on the substrate have to be much larger than those of the aforementioned filter used as a high-frequency part.

More specifically, the following equation (1) roughly applies to the relationship among the width d of an electrode finger of a surface acoustic wave transducer that forms a surface acoustic wave filter, the center frequency $f_0$ of the surface acoustic wave filter, and the SAW velocity V of the piezoelectric substrate used.

$$f_0 = V/(4d) \quad (1)$$

If a surface acoustic wave filter having a center frequency of 1 GHz is constructed on the assumption that the SAW velocity is 4000 m/s, the width of the electrode finger thereof is calculated from the equation (1) to be $$d = 4000(m/s)/(4 \times 1000(MHz)) = 1 \,\mu m$$

On the other hand, when an intermediate-frequency filter having a center frequency of 100 MHz is constructed using this piezoelectric substrate having a SAW velocity of 4000 m/s, the width of the electrode finger required for this is given by $$d = 4000(m/s)/(4 \times 100(MHz)) = 10 \,\mu m$$

Thus, the required width of the electrode finger is ten times as large as that for the high-frequency part filter. A large width of the electrode finger means that the surface acoustic wave intermediate-frequency filter itself becomes large. Therefore, in order to make a surface acoustic wave intermediate-frequency filter small, it is necessary to use a piezoelectric substrate having a low SAW velocity V, as can be appreciated from the equation (1).

For this reason, LT112 and ST quartz crystal, whose SAW velocities are low, are used for the piezoelectric substrates of surface acoustic wave intermediate-frequency filters. ST quartz crystal is particularly suitable because the primary temperature coefficient of frequency TCF is zero. Because the electromechanical coupling factor $k^2$ of ST quartz crystal is low, only a filter having a narrow passband is achievable. However, because it is a function of the intermediate-frequency filters to pass signals through a single narrow channel, the fact that the ST quartz crystal has a small electromechanical coupling factor has caused no problem.

In recent years, however, digital mobile communication systems have been developed and put into practical use. These systems have won very rapid acceptance because of their ability to make effective use of frequency resources, compatibility with digital data communications, and so on. The passband of the digital system is very wide, for instance, several hundred KHz to several MHz. In the case where an intermediate-frequency filter having such a wide passband is constructed using a surface acoustic wave device, it is difficult to use an ST quartz crystal substrate. In order to further reduce the size of mobile communication terminals for enhanced portability, it is required to reduce the mounting area of surface acoustic wave intermediate-frequency filters. However, because the SAW velocities of ST quartz crystal and LT112, which are considered to be suitable for surface acoustic wave intermediate-frequency filters, are over 3100 m/sec, further minimization is difficult.

As explained above, when surface acoustic wave devices for intermediate-frequency are constructed using piezoelectric substrates having high electromechanical coupling factor such as 128LN, 64LN, and 36LT, the device size must be large since the SAW velocities of the substrates are high, although a wide passband can be obtained. On the other hand, when surface acoustic wave devices for intermediate-frequency are constructed using piezoelectric substrates having low SAW velocities such as ST quartz crystal and LT112 in order to reduce the device size, a wide passband cannot be obtained since the electromechanical coupling factors of the substrates are low. Thus, surface acoustic wave devices for intermediate-frequency having excellent characteristics cannot be obtained in either case.

SUMMARY OF THE INVENTION

It is therefore an object of the present invention to provide a surface acoustic wave device for intermediate-frequency enabling miniaturization and band-widening.

Another object of the present invention is to provide a piezoelectric substrate for use in a surface acoustic wave device having high electromechanical coupling factor and low SAW velocity.

The above and other objects of the present invention can be accomplished by a surface acoustic wave device comprising a piezoelectric substrate and inter-digital electrodes formed on the piezoelectric substrate, wherein: the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles $(\phi, \theta, \psi)$ are found in one of a first area represented by $-2.5°\leq\phi\leq2.5°$, $30°\leq\theta\leq90°$, and $-65°\leq\psi\leq65°$, a second area represented by $-2.5°\leq\phi\leq2.5°$, $120°\leq\theta\leq155°$, and $65°\leq\psi\leq85°$, a third area represented by $-2.5°\leq\phi\leq2.5°$, $120°\leq\theta\leq155°$, and $-85°\leq\psi\leq-65°$, a fourth area represented by $2.5°\leq\phi\leq7.5°$, $30°\leq\theta\leq90°$, and $-75°\leq\psi\leq60°$, a fifth area represented by $2.5°\leq\phi\leq7.5°$, $120°\leq\theta\leq150°$, and $75°\leq\psi\leq85°$, a sixth area represented by $2.5°\leq\phi\leq7.5°$, $120°\leq\theta\leq155°$, and $-85°\leq\psi\leq-60°$, a seventh area represented by $7.5°\leq\phi\leq12.5°$, $30°\leq\theta\leq100°$, and $-80°\leq\psi\leq55°$, an eighth area represented by $7.5°\leq\phi\leq12.5°$, $120°\leq\theta\leq150°$, and $75°\leq\psi\leq85°$, a ninth area represented by $7.5°\leq\phi\leq12.5°$, $110°\leq\theta\leq155°$, and $-85°\leq\psi\leq-55°$, a tenth area represented by $12.5°\leq\phi\leq17.5°$, $20°\leq\theta\leq105°$, and $-85°\leq\psi\leq50°$, an eleventh area represented by $12.5°\leq\phi\leq17.5°$, $125°\leq\theta\leq140°$, and $80°\leq\psi\leq85°$, a twelfth area represented by $12.5°\leq\phi\leq17.5°$, $115°\leq\theta\leq155°$, and $-85°\leq\psi\leq-50°$, a thirteenth area represented by $17.5°\leq\phi\leq22.5°$, $25°\leq\theta\leq70°$, and $-80°\leq\psi\leq-20°$, a fourteenth area represented by $17.5°\leq\phi\leq22.5°$, $25°\leq\theta\leq110°$, and $-20°\leq\psi\leq40°$, a fifteenth area represented by $17.5°\leq\phi\leq22.5°$, $115°\leq\theta\leq155°$, and $-80°\leq\psi\leq-45°$, a sixteenth area represented by $22.5°\leq\phi\leq27.5°$, $25°\leq\theta\leq70°$, and $-85°\leq\psi\leq-20°$, a seventeenth area represented by $22.5°\leq\phi\leq27.5°$, $25°\leq\theta\leq145°$, and $-20°\leq\psi\leq40°$, an eighteenth area represented by $22.5°\leq\phi\leq27.5°$, $110°\leq\theta\leq155°$, and $-80°\leq\psi\leq-40°$, a nineteenth area represented by $27.5°\leq\phi\leq32.5°$, $25°\leq\theta\leq70°$, and $-85°\leq\psi\leq-30°$, a twentieth area represented by $27.5°\leq\phi\leq32.5°$, $30°\leq\theta\leq150°$, and $-30°\leq\psi\leq40°$, and a twenty-first area represented by $27.5°\leq\phi\leq32.5°$, $110°\leq\theta\leq155°$, and $-85°\leq\psi\leq-30°$.

The above and other objects of the present invention can also be accomplished by a piezoelectric substrate for use in a surface acoustic wave device, characterized in that the piezoelectric substrate has a crystal structure of $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles $(\phi, \theta, \psi)$ are found in one of a first area represented by $-2.5°\leq\phi\leq2.5°$, $30°\leq\theta\leq90°$, and $-65°\leq\psi\leq65°$, a second area represented by $-2.5°\leq\phi\leq2.5°$, $120°\leq\theta\leq155°$, and $65°\leq\psi\leq85°$, a third area represented by $-2.5°\leq\phi\leq2.5°$, $120°\leq\theta\leq155°$, and $-85°\leq\psi\leq-65°$, a fourth area represented by $2.5°\leq\phi\leq7.5°$, $30°\leq\theta\leq90°$, and $-75°\leq\psi\leq60°$, a fifth area represented by $2.5°\leq\phi\leq7.5°$, $120°\leq\theta\leq150°$, and $75°\leq\psi\leq85°$, a sixth area represented by $2.5°\leq\phi\leq7.5°$, $120°\leq\theta\leq155°$, and $-85°\leq\psi\leq-60°$, a seventh area represented by $7.5°\leq\phi\leq12.5°$, $30°\leq\theta\leq100°$, and $-80°\leq\psi\leq55°$, an eighth area represented by $7.5°\leq\phi\leq12.5°$, $120°\leq\theta150°$, and $75°\leq\psi\leq85°$, a ninth area represented by $7.5°\leq\phi\leq12.5°$, $110°\leq\theta\leq155°$, and $-85°\leq\psi\leq-55°$, a tenth area represented by $12.5°\leq\phi\leq17.5°$, $20°\leq\theta\leq105°$, and $-85°\leq\psi\leq50°$, an eleventh area represented by $12.5°\leq\phi\leq17.5°$, $125°\leq\theta\leq140°$, and $80°\leq\psi\leq85°$, a twelfth area represented by $12.5°\leq\phi\leq17.5°$, $115°\leq\theta\leq155°$, and $-85°\leq\psi\leq50°$, a thirteenth area represented by $17.5°\leq\phi\leq22.5°$, $25°\leq\theta\leq70°$, and $-80°\leq\psi\leq-20°$, a fourteenth area represented by $17.5°\leq\phi\leq22.5°$, $25°\leq\theta\leq110°$, and $-20°\leq\psi\leq40°$, a fifteenth area represented by $17.5°\leq\phi\leq22.5°$, $115°\leq\theta\leq155°$, and $-80°\leq\psi\leq-45°$, a sixteenth area represented by $22.5°\leq\phi\leq27.5°$, $25°\leq\psi\leq70°$, and $-85°\leq\psi\leq-20°$, a seventeenth area represented by $22.5°\leq\phi\leq27.5°$, $25°\leq\theta\leq145°$, and $-20°\leq\psi\leq40°$, an eighteenth area represented by $22.5°\leq\phi\leq27.5°$, $110°\leq\theta\leq155°$, and $-80°\leq\psi\leq-40°$, a nineteenth area represented by $27.5°\leq\phi\leq32.5°$, $25°\leq\theta\leq70°$, and $-85°\leq\psi\leq-30°$, a twentieth area represented by $27.5°\leq\phi\leq32.5°$, $30°\leq\theta\leq150°$, and $-30°\leq\psi\leq40°$, and a twenty-first area represented by $27.5°\leq\phi\leq32.5°$, $110°\leq\theta\leq155°$, and $-85°\leq\psi\leq-30°$.

The present invention is based on the experimentally acquired knowledge that when a single crystal represented by the chemical formula, $Ca_3TaGa_3Si_2O_{14}$ (hereinafter, a single crystal including Ca, Ta, Ga, and Si is referred to as "an CTGS single crystal") has a specifically combined cut angle and direction of propagation of surface acoustic waves such that when represented by φ, θ, and ψ in terms of Euler's angles (φ, θ, ψ), they are present within the first area to the twenty-first area, such properties as expressed in terms of a SAW velocity of less than 3100 m/s and an electromechanical coupling factor of greater than 0.2% can be obtained.

The present invention is intended to achieve a surface acoustic wave device having excellent characteristics by employing an CTGS single crystal as the substrate of the surface acoustic wave device and selecting the cut angle of the crystal and the direction of propagation of surface acoustic waves within a specific range.

In the present invention, the CTGS crystal is most preferably $Ca_3TaGa_3Si_2O_{14}$. However, the composition ratios between the respective elements may be slightly varied insofar as the technical advantages of the present invention are not diminished. Further, the CTGS single crystal may contain unavoidable impurities such as Al, Zr, Fe, Ce, Nd and Pt. Furthermore, the CTGS single crystal may contain oxygen defects. The method of manufacturing the CTGS single crystal is not particularly limited. An ordinary crystal growing process such as the CZ process can be employed for manufacturing the CTGS single crystal.

It is to be noted that the CTGS single crystal is a trigonal system, and so mutually equivalent combinations of Euler's angles exist due to crystal symmetry. In the trigonal system substrate, φ=120° to 240° and φ=240° to 360° (−120° to 0°) are equivalent to φ=0° to 120°; θ=360° to 180° (0° to −180°) is equivalent to θ=0° to 180°; and ψ=270° to 90° is equivalent to ψ=−90° to 90°. For example, φ=130° and φ=250° are equivalent to φ=10°; θ=330° is equivalent to θ=30°; and ψ=240° is equivalent to ψ=60°.

Further, in the trigonal system substrate, the characteristics thereof at all cut angles and in all propagation directions can be learned by determining the characteristics in the range of φ from 0° to 30°.

Therefore, in order to learn the characteristics thereof at all cut angles and in all propagation directions, it is sufficient to study the characteristics thereof only in the range of $φ_0=0°$ to 30° s, $θ_0=0°$ to 180° and $ψ_0=−90°$ to 90°. Based on the combination ($φ_0$, $θ_0$, $ψ_0$), an equivalent combination exhibiting the same characteristics in the range of φ=30° to 120° can be learned. Concretely, in the range of 30°≦φ≦60°, (φ, θ, ψ) equivalent to ($φ_0$, $θ_0$, $ψ_0$) can be obtained by φ=60°−$φ_0$, θ=180°−$θ_0$ and ψ=$ψ_0$; in the range of 60°≦φ≦90°, (φ, θ, ψ) equivalent to ($φ_0$, $θ_0$, $ψ_0$) can be obtained by φ=60°+$φ_0$, θ=180°−$θ_0$ and ψ=−$ψ_0$; and in the range of 90°≦φ≦120°, (φ, θ, ψ) equivalent to ($φ_0$, $θ_0$, $ψ_0$) can be obtained by φ=120°−$φ_0$, θ=$θ_0$ and ψ=−$ψ_0$. As a result, based on the aforementioned symmetrical property, the characteristics of the CTGS single crystal substrate for all (φ, θ, ψ) can be learned.

Set out below are exemplary equivalent combinations.

Equivalent to (0°, 140°, 25°) are (60°, 40°, 25°), (60°, 40°, −25°) and (120°, 140°, −25°) and since φ=120° is equivalent to φ=0°, (0°, 140°, −25°) is also equivalent to (0°, 140°, 25°).

The first area to the twenty-first area include all combinations of equivalent (φ, θ, ψ) obtained in the above described manner.

In general, the surface acoustic wave device according to the present invention lends itself well to filters used in the frequency band of 10 to 500 MHz particularly, 10 to 300 MHz.

Further, the surface acoustic wave device according to the present invention is also useful for making a surface acoustic wave delay element small, because of the low SAW velocity thereof.

BRIEF DESCRIPTION OF THE DRAWINGS

FIG. 13 is a contour map showing a temperature coefficient of frequency (TCF) of surface acoustic wave devices when φ, θ, and ψ of the piezoelectric substrates are 15°, a certain value between 0° and 180°, and a certain value between −90° to 90°, respectively.

FIG. 14 is a contour map showing a SAW velocity of surface acoustic wave devices when φ, θ, and ψ of the piezoelectric substrates are 20°, a certain value between 0° and 180°, and a certain value between −90° to 90°, respectively.

FIG. 15 is a contour map showing an electromechanical coupling factor of surface acoustic wave devices when φ, θ, and ψ of the piezoelectric substrates are 20°, a certain value between 0° and 180°, and a certain value between −90° to 90°, respectively.

FIG. 16 is a contour map showing a temperature coefficient of frequency (TCF) of surface acoustic wave devices when φ, θ, and ψ of the piezoelectric substrates are 20°, a certain value between 0° and 180°, and a certain value between −90° to 90°, respectively.

FIG. 17 is a contour map showing a SAW velocity of surface acoustic wave devices when φ, θ, and ψ of the piezoelectric substrates are 25°, a certain value between 0° and 180°, and a certain value between −90° to 90°, respectively.

FIG. 18 is a contour map showing an electromechanical coupling factor of surface acoustic wave devices when φ, θ, and ψ of the piezoelectric substrates are 25°, a certain value between 0° and 180°, and a certain value between −90° to 90°, respectively.

FIG. 19 is a contour map showing a temperature coefficient of frequency (TCF) of surface acoustic wave devices when φ, θ, and ψ of the piezoelectric substrates are 25°, a certain value between 0° and 180°, and a certain value between −90° to 90°, respectively.

FIG. 20 is a contour map showing a SAW velocity of surface acoustic wave devices when φ, θ, and ψ of the piezoelectric substrates are 30°, a certain value between 0° and 180°, and a certain value between −90° to 90°, respectively.

FIG. 21 is a contour map showing an electromechanical coupling factor of surface acoustic wave devices when φ, θ, and ψ of the piezoelectric substrates are 30°, a certain value between 0° and 180°, and a certain value between −90° to 90°, respectively.

FIG. 22 is a contour map showing a temperature coefficient of frequency (TCF) of surface acoustic wave devices when φ, θ, and ψ of the piezoelectric substrates are 30°, a certain value between 0° and 180°, and a certain value between −90° to 90°, respectively.

DESCRIPTION OF THE PREFERRED EMBODIMENTS

Preferred embodiments of the present invention will now be explained with reference to the drawings.

Figure 1:
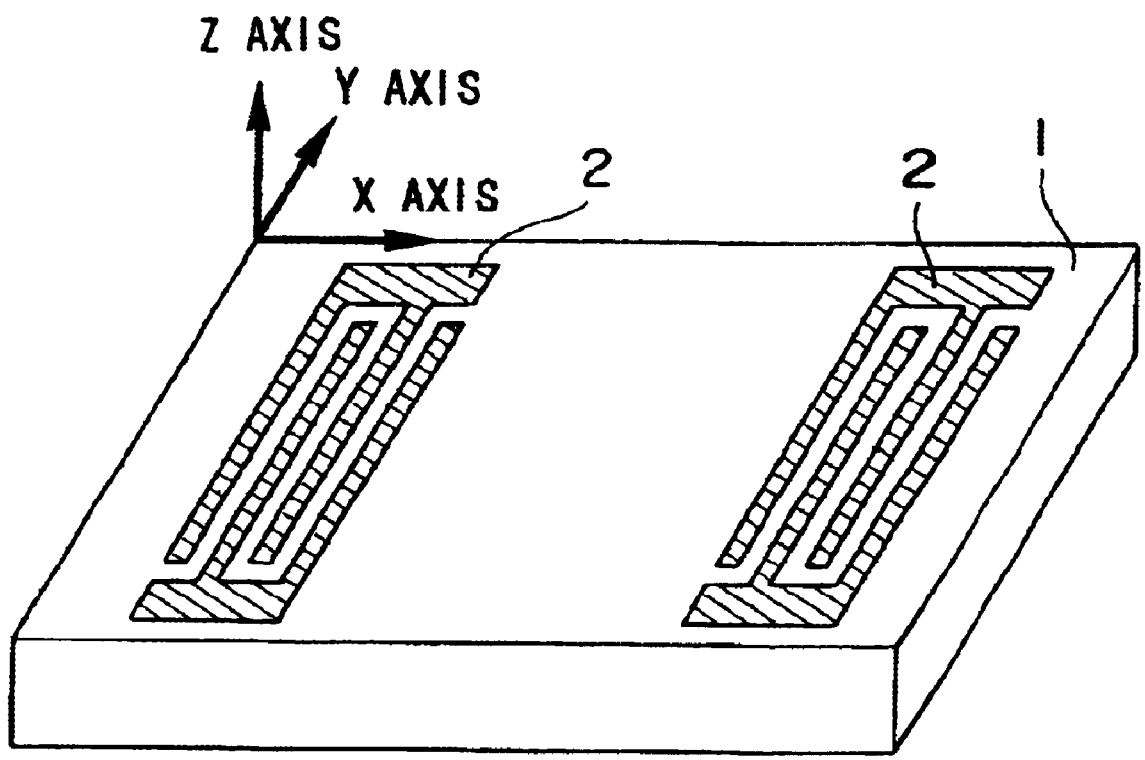
FIG. 1 is schematic perspective view showing a surface acoustic wave device which is a preferred embodiment of the present invention.

FIG. 1 is schematic perspective view showing a surface acoustic wave device which is a preferred embodiment of the present invention.

As shown in FIG. 1, a surface acoustic wave device which is a preferred embodiment of the present invention includes a pair of inter-digital electrodes 2, 2 on the surface of a piezoelectric substrate 1. An CTGS single crystal is used as the piezoelectric substrate 1 and the CTGS single crystal has a crystal form belonging to the point group 32. The x, y and z axes shown in FIG. 1 are perpendicular to each other. The x axis and y axis lie in a plane including the surface of the piezoelectric substrate 1 and the x axis defines the direction of propagation of surface acoustic waves.

The size of the piezoelectric substrate 1 is not limited but may generally be of the order of 4 to 10 mm in the direction of propagation of surface acoustic waves and of the order of 2 to 4 mm in the direction perpendicular thereto. The thickness of the piezoelectric substrate 1 may be of the order of 0.2 to 0.4 mm.

The inter-digital electrodes 2, 2 formed on the piezoelectric substrate 1 are thin layer electrodes for exciting, receiving, reflecting and propagating surface acoustic waves and are formed in a periodical stripe-like manner. The inter-digital electrodes 2, 2 are patterned so that the direction of propagation of surface acoustic waves coincides with the direction of the x axis. The inter-digital electrodes 2, 2 may be formed as by vacuum evaporation or sputtering, using Al or an Al alloy such as Al—Cu. The finger width of the inter-digital electrodes 2, 2 may be appropriately determined depending on the frequency to which the surface acoustic wave device is applied and may generally be of the order of 2 to 10 μm at the frequency band to which the present invention is applied.

The z axis perpendicular to the surface of the piezoelectric substrate 1 defines the cut angle (cut plane) of the piezoelectric substrate cut out of a single crystal. Relationships between the x axis, y axis and z axis and the X axis, Y axis and Z axis of the CTGS single crystal may be represented in terms of Euler's angles (φ, θ, ψ).

Figure 2:
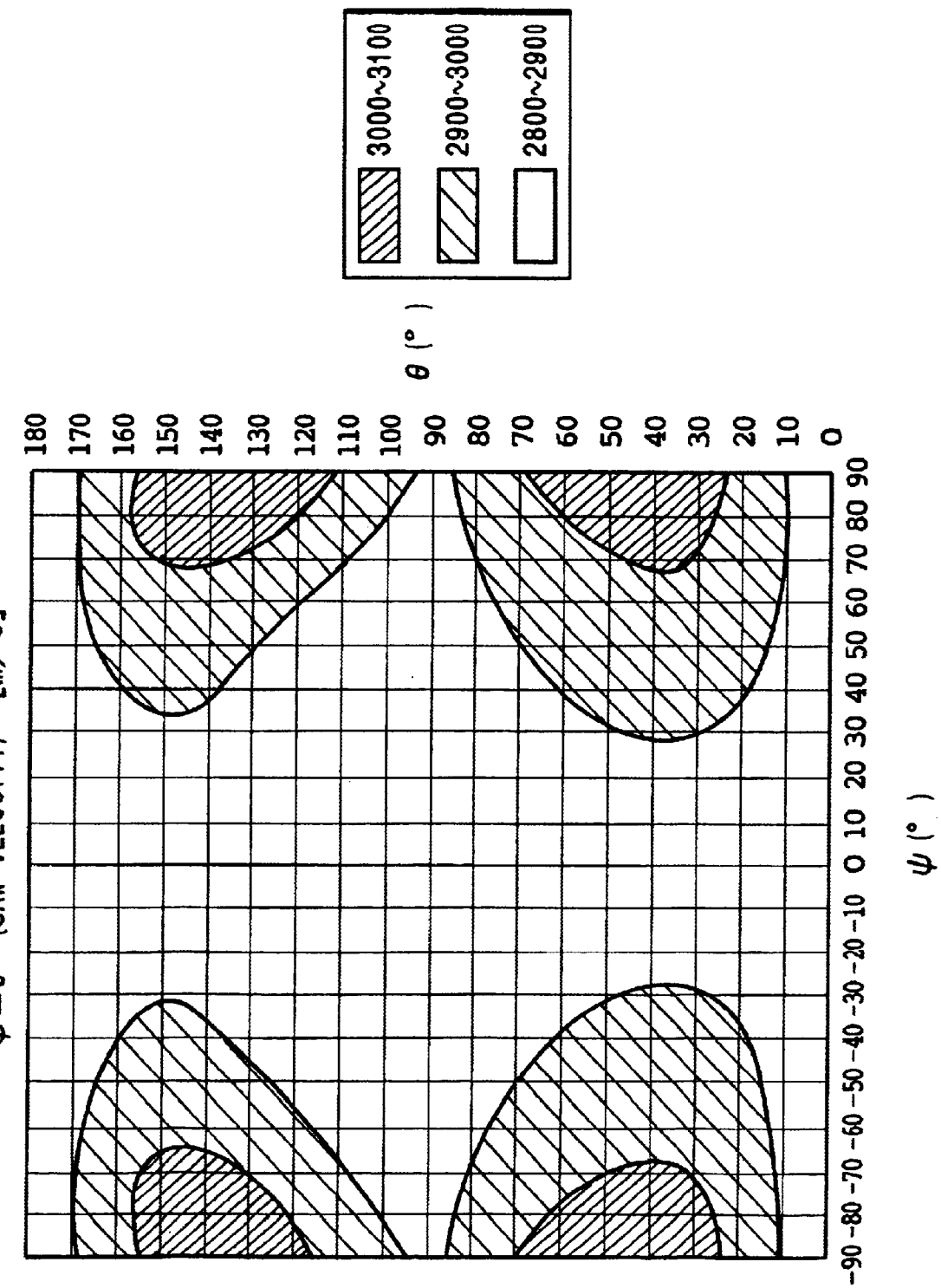
FIG. 2 is a contour map showing a SAW velocity of surface acoustic wave devices when φ, θ, and ψ of the piezoelectric substrates are 0°, a certain value between 0° and 180°, and a certain value between −90° to 90°, respectively.
Figure 3:
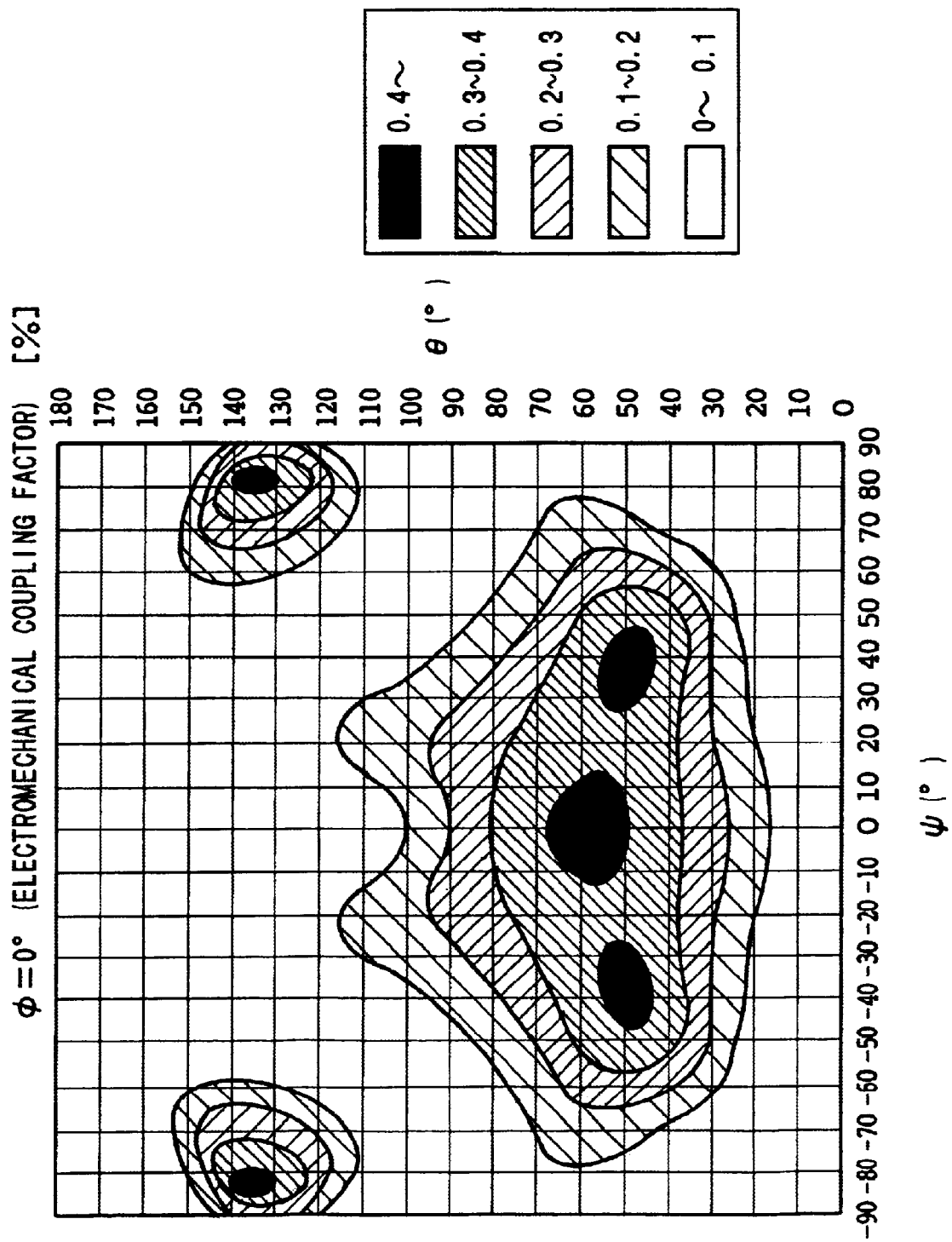
FIG. 3 is a contour map showing an electromechanical coupling factor of surface acoustic wave devices when φ, θ, and ψ of the piezoelectric substrates are 0°, a certain value between 0° and 180°, and a certain value between −90° to 90°, respectively.
Figure 4:
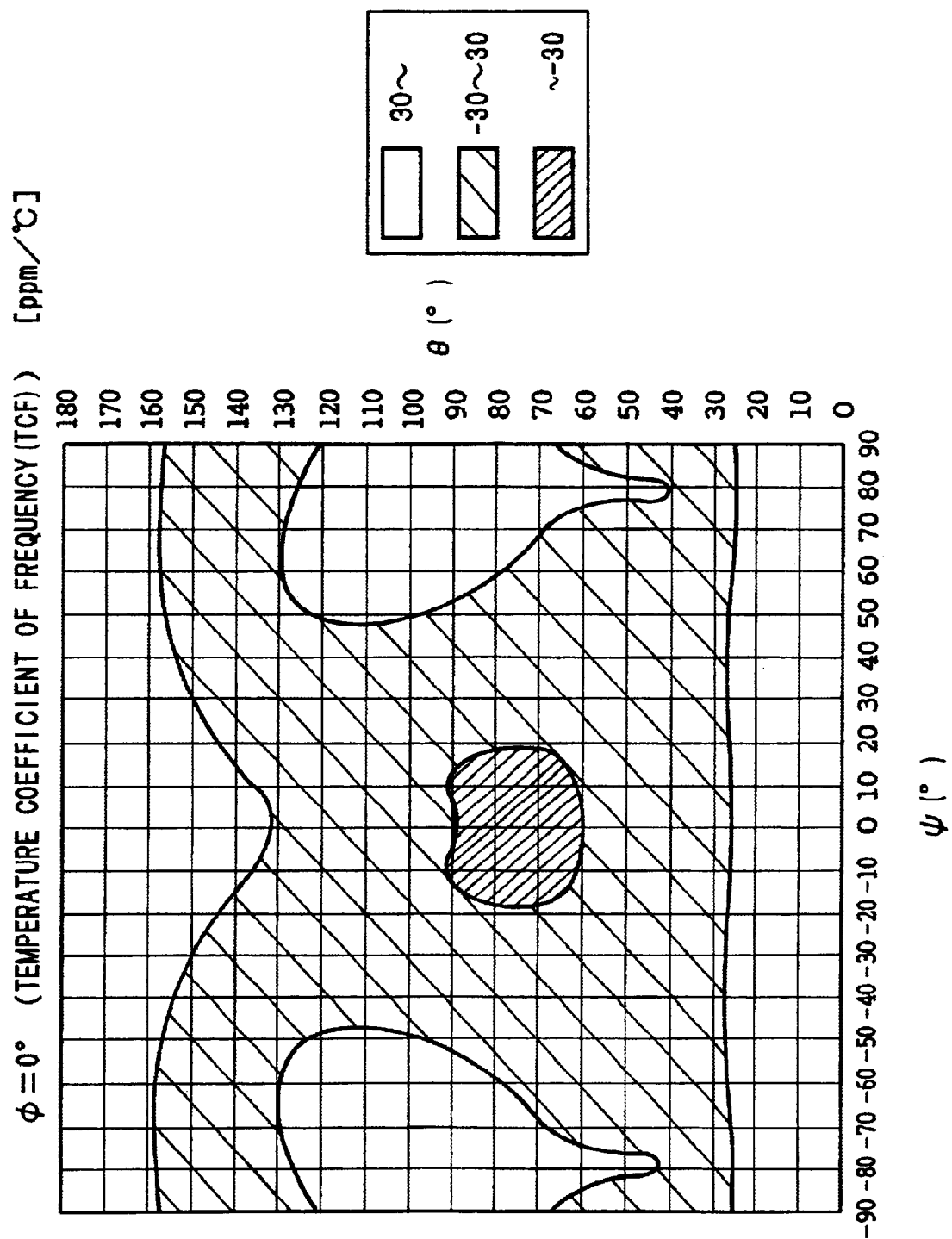
FIG. 4 is a contour map showing a temperature coefficient of frequency (TCF) of surface acoustic wave devices when φ, θ, and ψ of the piezoelectric substrates are 0°, a certain value between 0° and 180°, and a certain value between −90° to 90°, respectively.

FIGS. 2–4 are contour maps respectively showing the SAW velocity, the electromechanical coupling factor, and the temperature coefficient of frequency (TCF) of surface acoustic wave devices when φ, θ, and ψ of the piezoelectric substrates are 0°, a certain value between 0° and 180°, and a certain value between −90° to 90°, respectively.

Almost the same characteristics as those shown in FIGS. 2–4 can be obtained in the case where φ is 0±2.5°. Referring to FIGS. 2–4, therefore, there is a combination of φ, θ and ψ in the area 1-1 whereat the SAW velocity of the piezoelectric substrate 1 is at most 3000 m/s, which is markedly lower than that of ST quartz crystal, the electromechanical coupling factor of the piezoelectric substrate 1 is large and at least 0.2%, and the temperature coefficient of frequency (TCF) is good.

The area 1-1 is defined as follows:

φ=−2.5°~2.5°
θ=30°~90°
ψ=−65°~65°

The preferable range of the area 1-1, designated area 1-1-1, is defined as follows:

φ=−2.5°~2.5°
θ=35°~80°
ψ=−55°~55°

The preferable range of the area 1-1-1, designated area 1-1-1-1, is defined as follows:

φ=−2.5°~2.5°
θ=45°~70°
ψ=−15°~15°

Another preferable range of the area 1-1-1, designated area 1-1-1-2, is defined as follows:

φ=−2.5°~2.5°
θ=40°~60°
ψ=15°~50°

Still another preferable range of the area 1-1-1, designated area 1-1-1-3, is defined as follows:

φ=−2.5°~2.5°
θ=40°~60°
ψ=−50°~−15°

In the area 1-1, there is a combination of $\phi$, $\theta$ and $\psi$ whereat the SAW velocity of the piezoelectric substrate 1 is at most 3000 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 1-1-1, which is a preferable range of the area 1-1, there is a combination of $\phi$, $\theta$ and $\psi$ whereat the electromechanical coupling factor of the piezoelectric substrate 1 is at least 0.3%. Further, in each of the areas 1-1-1-1, 1-1-1-2, and 1-1-1-3, which are preferable ranges of the area 1-1-1, there is a combination of $\phi$, $\theta$ and $\psi$ whereat the electromechanical coupling factor of the piezoelectric substrate 1 is at least 0.4%. Particularly, in the area 1-1-1-1, there is a combination of $\phi$, $\theta$ and $\psi$ whereat the SAW velocity of the piezoelectric substrate 1 is at most 2900 m/s, which is extremely low.

Further referring to FIGS. 2–4, there is a combination of $\phi$, $\theta$ and $\psi$ in an area 1-2 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 1-2 is defined as follows:

$\phi=-2.5°\sim 2.5°$ $\theta=120°\sim 155°$ $\psi=65°\sim 85°$

The preferable range of the area 1-2, designated area 1-2-1, is defined as follows:

$\phi=-2.5°\sim 2.5°$ $\theta=125°\sim 145°$ $\psi=75°\sim 85°$

In the area 1-2, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 1-2-1, which is a preferable range of the area 1-2, there is a combination of $\phi$, $\theta$ and $\psi$ whereat the electromechanical coupling factor of the piezoelectric substrate 1 is at least 0.3%.

Further referring to FIGS. 2–4, there is a combination of $\phi$, $\theta$ and $\psi$ in an area 1-3 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 1-3 is defined as follows:

$\phi=-2.5°\sim 2.5°$ $\theta=120°\sim 155°$ $\psi=-85°\sim -65°$

The preferable range of the area 1-3, designated area 1-3-1, is defined as follows:

$\phi=-2.5°\sim 2.5°$ $\theta=125°\sim 145°$ $\psi=-85°\sim -75°$

In the area 1-3, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 1-3-1, which is a preferable range of the area 1-3, there is a combination of $\phi$, $\theta$ and $\psi$ whereat the electromechanical coupling factor of the piezoelectric substrate 1 is at least 0.3%.

Figure 5:
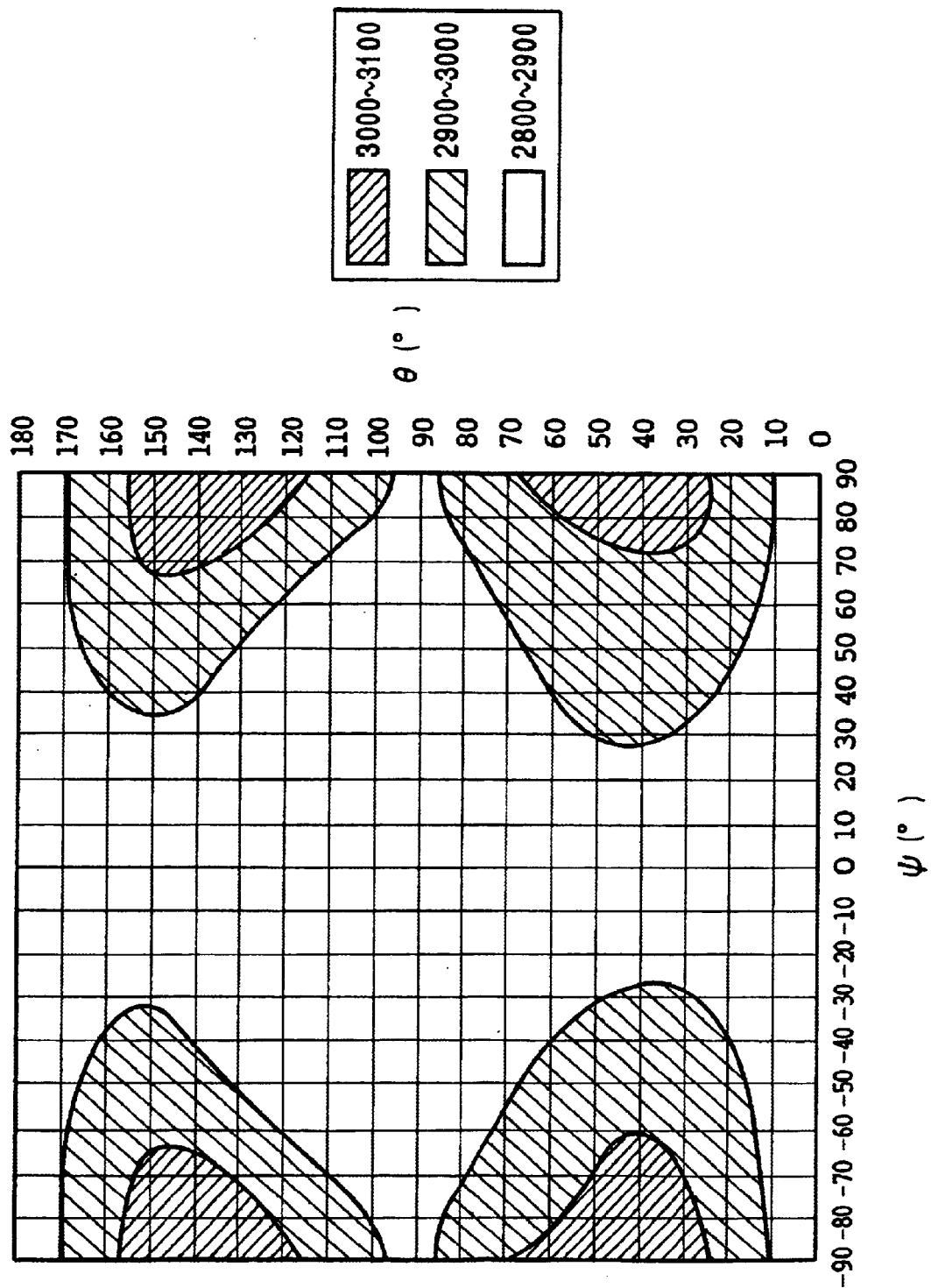
FIG. 5 is a contour map showing a SAW velocity of surface acoustic wave devices when φ, θ, and ψ of the piezoelectric substrates are 5°, a certain value between 0° and 180°, and a certain value between −90° to 90°, respectively.
Figure 6:
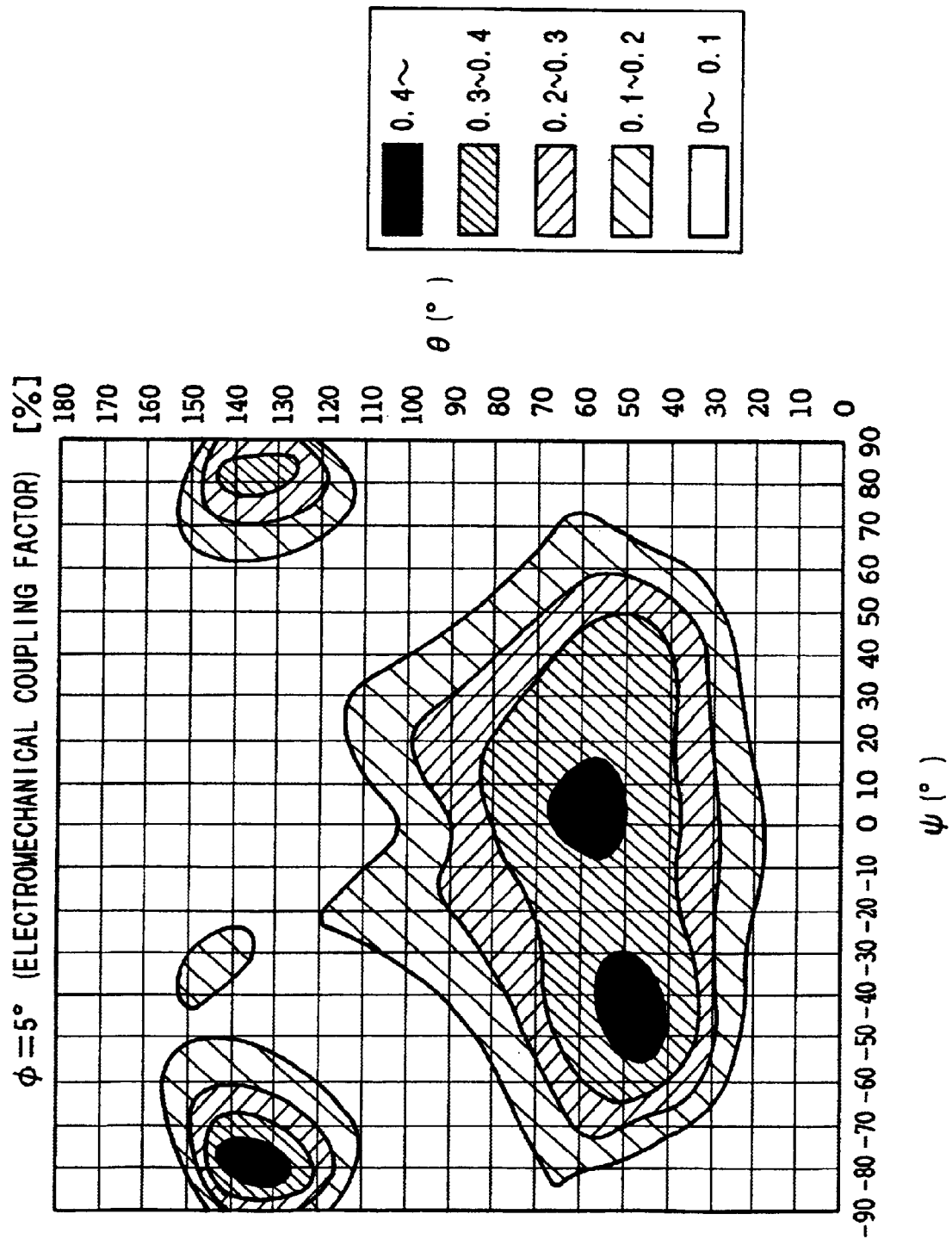
FIG. 6 is a contour map showing an electromechanical coupling factor of surface acoustic wave devices when φ, θ, and ψ of the piezoelectric substrates are 5°, a certain value between 0° and 180°, and a certain value between −90° to 90°, respectively.
Figure 7:
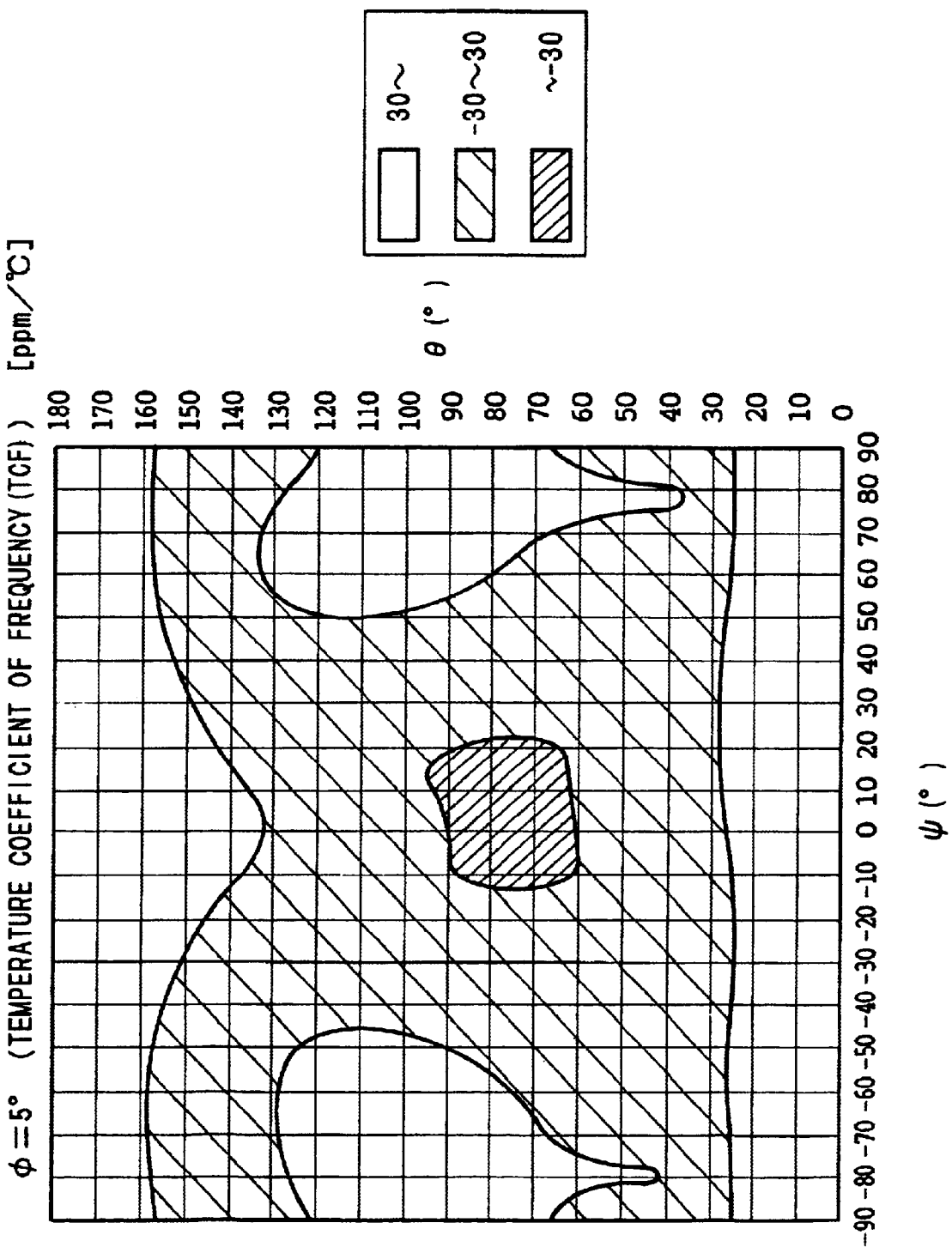
FIG. 7 is a contour map showing a temperature coefficient of frequency (TCF) of surface acoustic wave devices when φ, θ, and ψ of the piezoelectric substrates are 5°, a certain value between 0° and 180°, and a certain value between −90° to 90°, respectively.

FIGS. 5–7 are contour maps respectively showing the SAW velocity, the electromechanical coupling factor, and the temperature coefficient of frequency (TCF) of surface acoustic wave devices when $\phi$, $\theta$, and $\psi$ of the piezoelectric substrates are 5°, a certain value between 0° and 180°, and a certain value between −90° to 90°, respectively.

Almost the same characteristics as those shown in FIGS. 5–7 can be obtained in the case where $\phi$ is 5±2.5°. Referring to FIGS. 5–7, therefore, there is a combination of $\phi$, $\theta$ and $\psi$ in the area 2-1 whereat the SAW velocity of the piezoelectric substrate 1 is at most 3000 m/s, which is markedly lower than that of ST quartz crystal, the electromechanical coupling factor of the piezoelectric substrate 1 is large and at least 0.2%, and the temperature coefficient of frequency (TCF) is good.

The area 2-1 is defined as follows:

$\phi=2.5°\sim 7.5°$ $\theta=30°\sim 90°$ $\psi=-75°\sim 60°$

The preferable range of the area 2-1, designated area 2-1-1, is defined as follows:

$\phi=2.5°\sim 7.5°$ $\theta=35°\sim 80°$ $\psi=-65°\sim -50°$

The preferable range of the area 2-1-1, designated area 2-1-1-1, is defined as follows:

$\phi=2.5°\sim 7.5°$ $\theta=45°\sim 70°$ $\psi=-10°\sim 20°$

Another preferable range of the area 2-1-1, designated area 2-1-1-2, is defined as follows:

$\phi=2.5°\sim 7.5°$ $\theta=35°\sim 60°$ $\psi=-60°\sim -25°$

In the area 2-1, there is a combination of $\phi$, $\theta$ and $\psi$ whereat the SAW velocity of the piezoelectric substrate 1 is at most 3000 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 2-1-1, which is a preferable range of the area 2-1, there is a combination of $\phi$, $\theta$ and $\psi$ whereat the electromechanical coupling factor of the piezoelectric substrate 1 is at least 0.3%. Further, in each of the areas 2-1-1-1 and 2-1-1-2, which are preferable ranges of the area 2-1-1, there is a combination of $\phi$, $\theta$ and $\psi$ whereat the electromechanical coupling factor of the piezoelectric substrate 1 is at least 0.4%. Particularly, in the area 2-1-1-1, there is a combination of $\phi$, $\theta$ and $\psi$ whereat the SAW velocity of the piezoelectric substrate 1 is at most 2900 m/s, which is extremely low.

Further referring to FIGS. 5–7, there is a combination of $\phi$, $\theta$ and $\psi$ in an area 2-2 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 2-2 is defined as follows:

$\phi=2.5°\sim7.5°$ $\theta=120°\sim150°$ $\psi=75°\sim85°$

The preferable range of the area 2-2, designated area 2-2-1, is defined as follows:

$\phi=2.5°\sim7.5°$ $\theta=125°\sim145°$ $\psi=80°\sim85°$

In the area 2-2, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 2-2-1, which is a preferable range of the area 2-2, there is a combination of $\phi$, $\theta$ and $\psi$ whereat the electromechanical coupling factor of the piezoelectric substrate 1 is at least 0.3%.

Further referring to FIGS. 5–7, there is a combination of $\phi$, $\theta$ and $\psi$ in an area 2-3 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 2-3 is defined as follows:

$\phi=2.5°\sim7.5°$ $\theta=120°\sim155°$ $\psi=-85°\sim-60°$

The preferable range of the area 2-3, designated area 2-3-1, is defined as follows:

$\phi=2.5°\sim7.5°$ $\theta=120°\sim145°$ $\psi=-85°\sim-70°$

The preferable range of the area 2-3-1, designated area 2-3-1-1, is defined as follows:

$\phi=2.5°\sim7.5°$ $\theta=130°\sim140°$ $\psi=-80°\sim-75°$

In the area 2-3, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 2-3-1, which is a preferable range of the area 2-3, there is a combination of $\phi$, $\theta$ and $\psi$ whereat the electromechanical coupling factor of the piezoelectric substrate 1 is at least 0.3%. Further, in the area 2-3-1-1, which is a preferable range of the area 2-3-1, there is a combination of $\phi$, $\theta$ and $\psi$ whereat the electromechanical coupling factor of the piezoelectric substrate 1 is at least 0.4%.

Figure 8:
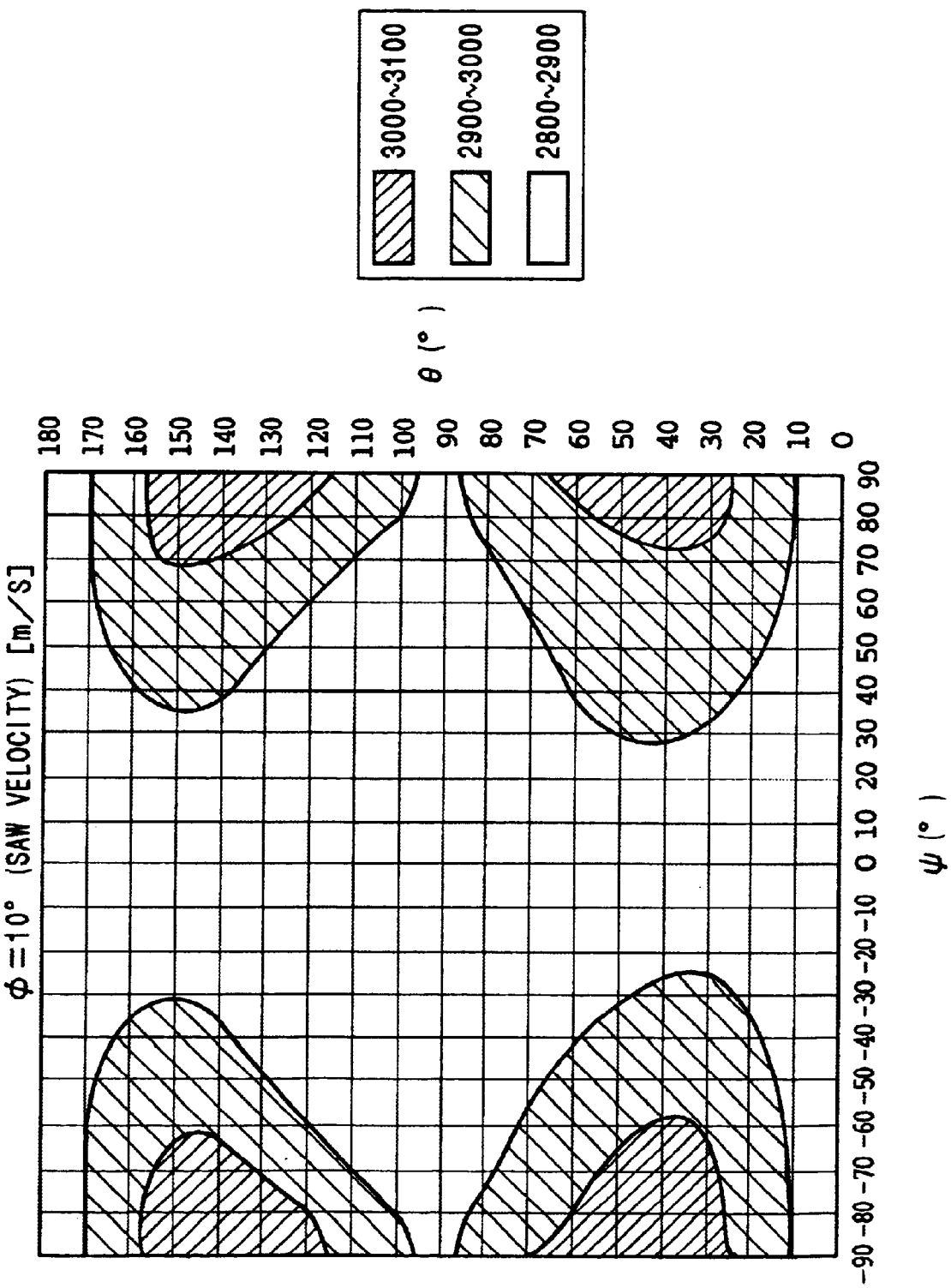
FIG. 8 is a contour map showing a SAW velocity of surface acoustic wave devices when φ, θ, and ψ of the piezoelectric substrates are 10°, a certain value between 0° and 180°, and a certain value between −90° to 90°, respectively.
Figure 9:
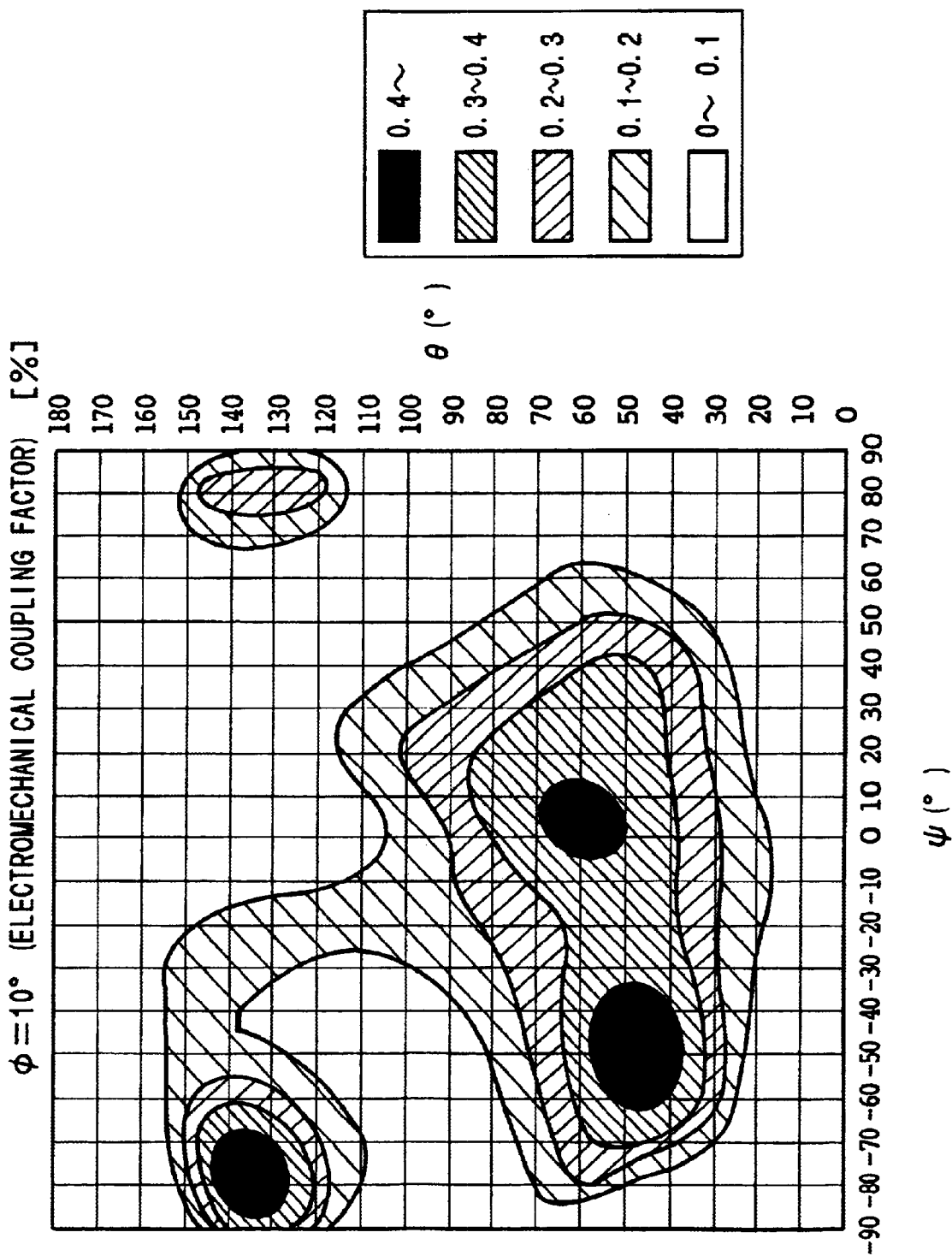
FIG. 9 is a contour map showing an electromechanical coupling factor of surface acoustic wave devices when φ, θ, and ψ of the piezoelectric substrates are 10°, a certain value between 0° and 180°, and a certain value between −90° to 90°, respectively.
Figure 10:
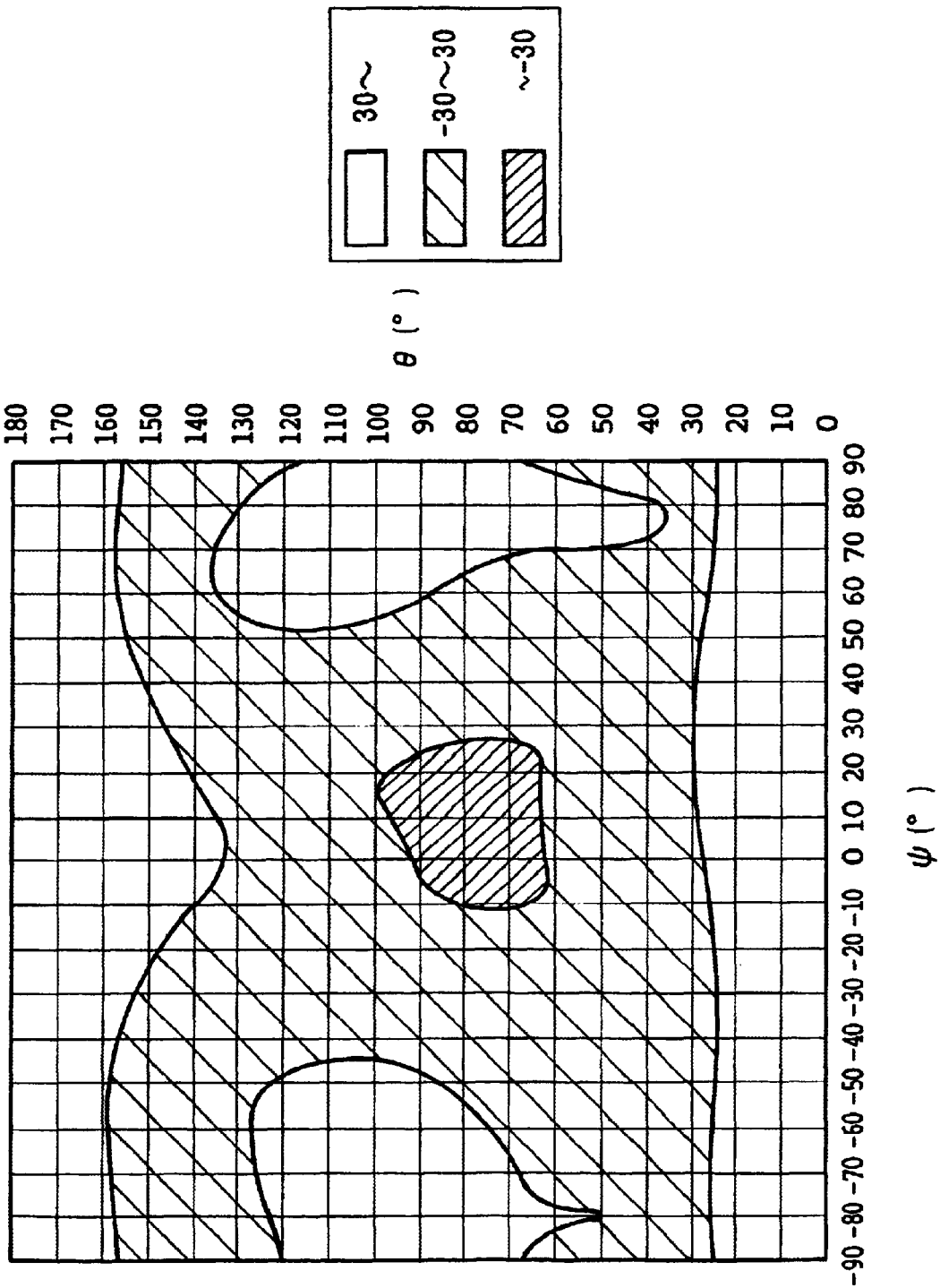
FIG. 10 is a contour map showing a temperature coefficient of frequency (TCF) of surface acoustic wave devices when φ, θ, and ψ of the piezoelectric substrates are 10°, a certain value between 0° and 180°, and a certain value between −90° to 90°, respectively.

FIGS. 8–10 are contour maps respectively showing the SAW velocity, the electromechanical coupling factor, and the temperature coefficient of frequency (TCF) of surface acoustic wave devices when $\phi$, $\theta$, and $\psi$ of the piezoelectric substrates are 10°, a certain value between 0° and 180°, and a certain value between −90° to 90°, respectively.

Almost the same characteristics as those shown in FIGS. 8–10 can be obtained in the case where $\phi$ is 10±2.5°. Referring to FIGS. 8–10, therefore, there is a combination of $\phi$, $\theta$ and $\psi$ in the area 3-1 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 3-1 is defined as follows:

$\phi=7.5°\sim12.5°$ $\theta=30°\sim100°$ $\psi=-80°\sim55°$

The preferable range of the area 3-1, designated area 3-1-1, is defined as follows:

$\phi=7.5°\sim12.5°$ $\theta=30°\sim85°$ $\psi=-75°\sim40°$

The preferable range of the area 3-1-1, designated area 3-1-1-1, is defined as follows:

$\phi=7.5°\sim12.5°$ $\theta=45°\sim70°$ $\psi=-10°\sim20°$

Another preferable range of the area 3-1-1, designated area 3-1-1-2, is defined as follows:

$\phi=7.5°\sim12.5°$ $\theta=35°\sim60°$ $\psi=-60°\sim-30°$

In the area 3-1, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 3-1-1, which is a preferable range of the area 3-1, there is a combination of $\phi$, $\theta$ and $\psi$ whereat the electromechanical coupling factor of the piezoelectric substrate 1 is at least 0.3%. Further, in each of the areas 3-1-1-1 and 3-1-1-2, which are preferable ranges of the area 3-1-1, there is a combination of $\phi$, $\theta$ and $\psi$ whereat the electromechanical coupling factor of the piezoelectric substrate 1 is at least 0.4%. Particularly, in the area 3-1-1-1, there is a combination of $\phi$, $\theta$ and $\psi$ whereat the SAW velocity of the piezoelectric substrate 1 is at most 2900 m/s, which is extremely low. Further, in the area 3-1-1-2, there is a combination of $\phi$, $\theta$ and $\psi$ whereat the SAW velocity of the piezoelectric substrate 1 is at most 3000 m/s, which is markedly low.

Further referring to FIGS. 8–10, there is a combination of $\phi$, $\theta$ and $\psi$ in an area 3-2 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 3-2 is defined as follows:

$\phi=7.5°\sim12.5°$ $\theta=120°\sim145°$ $\psi=75°\sim85°$

Further referring to FIGS. 8–10, there is a combination of $\phi$, $\theta$ and $\psi$ in an area 3-3 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 3-3 is defined as follows:

$\phi = 7.5° \sim 12.5°$
$\theta = 110° \sim 155°$
$\psi = -85° \sim -55°$

The preferable range of the area 3-3, designated area 3-3-1, is defined as follows:

$\phi = 7.5° \sim 12.5°$
$\theta = 125° \sim 145°$
$\psi = -85° \sim 65°$

The preferable range of the area 3-3-1, designated area 3-3-1-1, is defined as follows:

$\phi = 7.5° \sim 12.5°$
$\theta = 125° \sim 145°$
$\psi = -80° \sim -70°$

In the area 3-3, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 3-3-1, which is a preferable range of the area 3-3, there is a combination of $\phi$, $\theta$ and $\psi$ whereat the electromechanical coupling factor of the piezoelectric substrate 1 is at least 0.3%. Further, in the area 3-3-1-1, which is a preferable range of the area 3-3-1, there is a combination of $\phi$, $\theta$ and $\psi$ whereat the electromechanical coupling factor of the piezoelectric substrate 1 is at least 0.4%.

Figure 11:
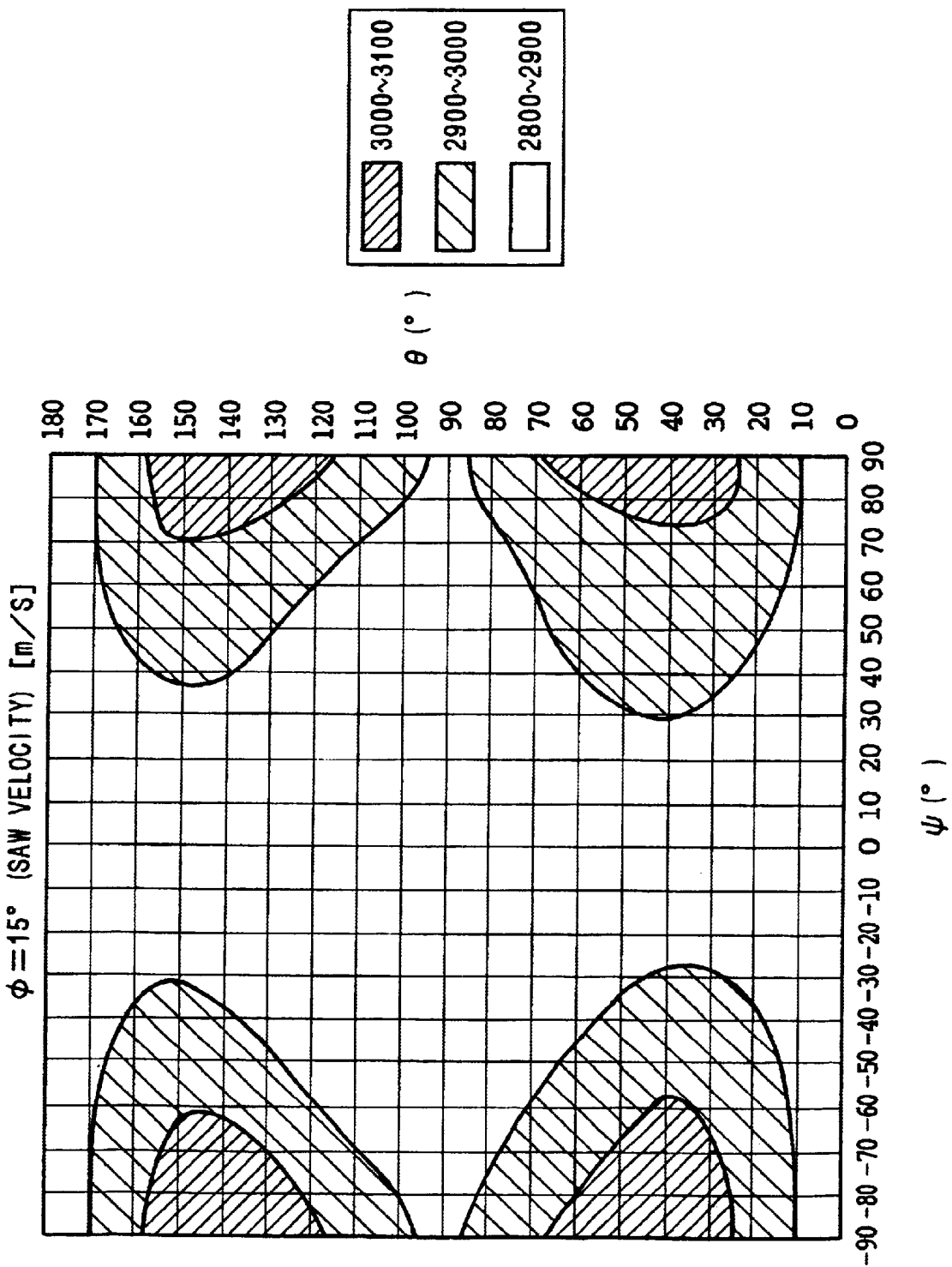
FIG. 11 is a contour map showing a SAW velocity of surface acoustic wave devices when φ, θ, and ψ of the piezoelectric substrates are 15°, a certain value between 0° and 180°, and a certain value between −90° to 90°, respectively.
Figure 12:
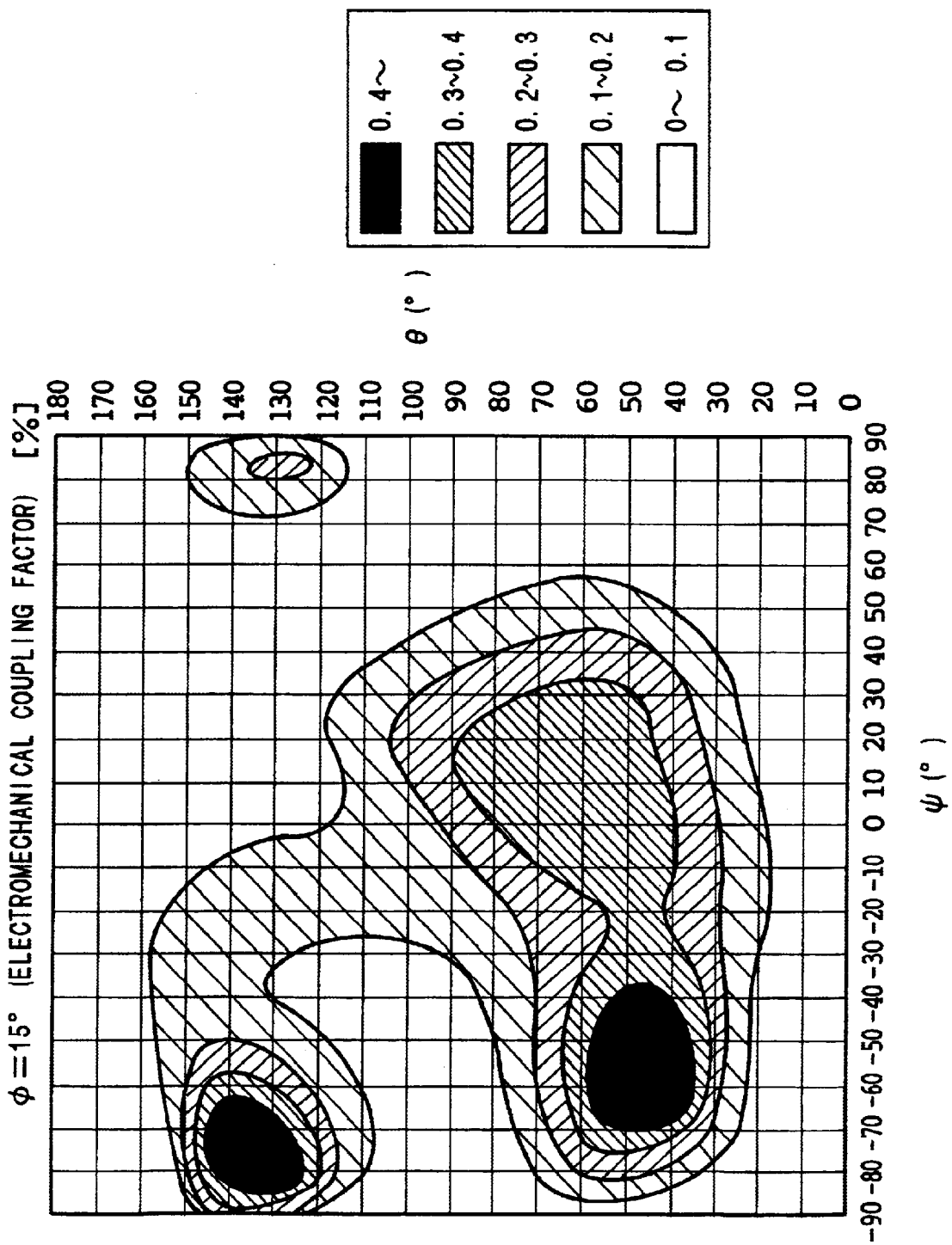
FIG. 12 is a contour map showing an electromechanical coupling factor of surface acoustic wave devices when φ, θ, and ψ of the piezoelectric substrates are 15°, a certain value between 0° and 180°, and a certain value between −90° to 90°, respectively.

FIGS. 11–13 are contour maps respectively showing the SAW velocity, the electromechanical coupling factor, and the temperature coefficient of frequency (TCF) of surface acoustic wave devices when $\phi$, $\theta$, and $\psi$ of the piezoelectric substrates are 15°, a certain value between 0° and 180°, and a certain value between –90° to 90°, respectively.

Almost the same characteristics as those shown in FIGS. 11–13 can be obtained in the case where $\phi$ is 15±2.5°. Referring to FIGS. 11–13, therefore, there is a combination of $\phi$, $\theta$ and $\psi$ in the area 4-1 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 4-1 is defined as follows:

$\phi = 12.5° \sim 17.5°$
$\theta = 20° \sim 105°$
$\psi = -85° \sim 50°$

The preferable range of the area 4-1, designated area 4-1-1, is defined as follows:

$\phi = 12.5° \sim 17.5°$
$\theta = 35° \sim 90°$
$\psi = -10° \sim 30°$

Another preferable range of the area 4-1, designated area 4-1-2, is defined as follows:

$\phi = 12.5° \sim 17.5°$
$\theta = 35° \sim 60°$
$\psi = -70° \sim -15°$

The preferable range of the area 4-1-2, designated area 4-1-2-1, is defined as follows:

$\phi = 12.5° \sim 17.5°$
$\theta = 40° \sim 55°$
$\psi = -70° \sim -40°$

In the area 4-1, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 4-1-1, which is a preferable range of the area 4-1, there is a combination of $\phi$, $\theta$ and $\psi$ whereat the electromechanical coupling factor of the piezoelectric substrate 1 is at least 0.3% and the SAW velocity of the piezoelectric substrate 1 is at most 2900 m/s, which is markedly low. Further, in the area 4-1-2, which is another preferable range of the area 4-1, there is a combination of $\phi$, $\theta$ and $\psi$ whereat the electromechanical coupling factor of the piezoelectric substrate 1 is at least 0.3%. Further, in the area 4-1-2-1, which is preferable range of the area 4-1-2, there is a combination of $\phi$, $\theta$ and $\psi$ whereat the electromechanical coupling factor of the piezoelectric substrate 1 is at least 0.4%.

Further referring to FIGS. 11–13, there is a combination of $\phi$, $\theta$ and $\psi$ in an area 4-2 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 4-2 is defined as follows:

$\phi = 12.5° \sim 17.5°$
$\theta = 125° \sim 140°$
$\psi = 80° \sim 85°$

Further referring to FIGS. 11–13, there is a combination of $\phi$, $\theta$ and $\psi$ in an area 4-3 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 4-3 is defined as follows:

$\phi = 12.5° \sim 17.5°$
$\theta = 115° \sim 155°$
$\psi = -85° \sim -50°$

The preferable range of the area 4-3, designated area 4-3-1, is defined as follows:

$\phi = 12.5° \sim 17.5°$
$\theta = 120° \sim 145°$
$\psi = -80° \sim -60°$

The preferable range of the area 4-3-1, designated area 4-3-1-1, is defined as follows:

$\phi = 12.5° \sim 17.5°$
$\theta = 125° \sim 145°$
$\psi = -80° \sim -65°$

In the area 4-3, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 4-3-1, which is a preferable range of the area 4-3, there is a combination of $\phi$, $\theta$ and $\psi$ whereat the electromechanical coupling factor of the piezoelectric substrate 1 is at least 0.3%. Further, in the area 4-3-1-1, which is a preferable range of the area 4-3-1, there is a combination of $\phi$, $\theta$ and $\psi$ whereat the electromechanical coupling factor of the piezoelectric substrate 1 is at least 0.4%.

FIGS. 14–16 are contour maps respectively showing the SAW velocity, the electromechanical coupling factor, and the temperature coefficient of frequency (TCF) of surface acoustic wave devices when $\phi$, $\theta$, and $\psi$ of the piezoelectric substrates are 20°, a certain value between 0° and 180°, and a certain value between −90° to 90°, respectively.

Almost the same characteristics as those shown in FIGS. 14–16 can be obtained in the case where $\phi$ is 20±2.5°. Referring to FIGS. 14–16, therefore, there is a combination of $\phi$, $\theta$ and $\psi$ in the area 5-1 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 5-1 is defined as follows:
$\phi$=17.5°~22.5°
$\theta$=25°~70°
$\psi$=−80°~−20°

The preferable range of the area 5-1, designated area 5-1-1, is defined as follows:
$\phi$=17.5°~22.5°
$\theta$=35°~60°
$\psi$=−75°~−35°

The preferable range of the area 5-1-1, designated area 5-1-1-1, is defined as follows:
$\phi$=17.5°~22.5°
$\theta$=35°~55°
$\psi$=−70°~−45°

In the area 5-1, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 5-1-1, which is a preferable range of the area 5-1, there is a combination of $\phi$, $\theta$ and $\psi$ whereat the electromechanical coupling factor of the piezoelectric substrate 1 is at least 0.3%. Further, in the area 5-1-1-1, which is preferable range of the area 5-1-1, there is a combination of $\phi$, $\theta$ and $\psi$ whereat the electromechanical coupling factor of the piezoelectric substrate 1 is at least 0.4%.

Further referring to FIGS. 14–16, there is a combination of $\phi$, $\theta$ and $\psi$ in an area 5-2 whereat the SAW velocity of the piezoelectric substrate 1 is at most 2900 m/s, which is markedly lower than that of ST quartz crystal, the electromechanical coupling factor of the piezoelectric substrate 1 is large and at least 0.2%, and the temperature coefficient of frequency (TCF) is good.

The area 5-2 is defined as follows:
$\phi$=17.5°~22.5°
$\theta$=25°~110°
$\psi$=−20°~40°

The preferable range of the area 5-2, designated area 5-2-1, is defined as follows:
$\phi$=17.5°~22.5°
$\theta$=45°~90°
$\psi$=−15°~25°

In the area 5-2, there is a combination of $\phi$, $\theta$ and $\psi$ whereat the SAW velocity of the piezoelectric substrate 1 is at most 2900 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 5-2-1, which is a preferable range of the area 5-2, there is a combination of $\phi$, $\theta$ and $\psi$ whereat the electromechanical coupling factor of the piezoelectric substrate 1 is at least 0.3%.

Further referring to FIGS. 14–16, there is a combination of $\phi$, $\theta$ and $\psi$ in an area 5-3 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 5-3 is defined as follows:
$\phi$=17.5°~22.5°
$\theta$=115°~145°
$\psi$=−80°~−45°

The preferable range of the area 5-3, designated area 5-3-1, is defined as follows:
$\phi$=17.5°~22.5°
$\theta$=120°~145°
$\psi$=−80°~−55°

The preferable range of the area 5-3-1, designated area 5-3-1-1, is defined as follows:
$\phi$=17.5°~22.5°
$\theta$=125°~145°
$\psi$=−80°~−65°

In the area 5-3, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 5-3-1, which is a preferable range of the area 5-3, there is a combination of $\phi$, $\theta$ and $\psi$ whereat the electromechanical coupling factor of the piezoelectric substrate 1 is at least 0.3%. Further, in the area 5-3-1-1, which is a preferable range of the area 5-3-1, there is a combination of $\phi$, $\theta$ and $\psi$ whereat the electromechanical coupling factor of the piezoelectric substrate 1 is at least 0.4%.

FIGS. 17–19 are contour maps respectively showing the SAW velocity, the electromechanical coupling factor, and the temperature coefficient of frequency (TCF) of surface acoustic wave devices when $\phi$, $\theta$, and $\psi$ of the piezoelectric substrates are 25°, a certain value between 0° and 180°, and a certain value between −90° to 90°, respectively.

Almost the same characteristics as those shown in FIGS. 17–19 can be obtained in the case where $\phi$ is 25±2.5°. Referring to FIGS. 17–19, therefore, there is a combination of $\phi$, $\theta$ and $\psi$ in the area 6-1 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 6-1 is defined as follows:
$\phi$=22.5° 27.5°
$\theta$=25°~70°
$\psi$=−85°~−20°

The preferable range of the area 6-1, designated area 6-1-1, is defined as follows:
$\phi$=22.5°~27.5°
$\theta$=30°~60°
$\psi$=−80°~−40°

The preferable range of the area 6-1-1, designated area 6-1-1-1, is defined as follows:
$\phi$=22.5°~27.5°
$\theta$=35°~55°
$\psi$=−75°~−50°

In the area 6-1, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 6-1-1, which is a preferable range of the area 6-1, there is a combination of $\phi$, $\theta$ and $\psi$ whereat the electromechanical coupling factor of the piezoelectric substrate 1 is at least 0.3%. Further, in the area 6-1-1-1, which is preferable range of the area 6-1-1, there is a combination of $\phi$, $\theta$ and $\psi$ whereat the electromechanical coupling factor of the piezoelectric substrate 1 is at least 0.4%.

Further referring to FIGS. 17–19, there is a combination of $\phi$, $\theta$ and $\psi$ in an area 6-2 whereat the SAW velocity of the piezoelectric substrate 1 is at most 2900 m/s, which is markedly lower than that of ST quartz crystal, the electromechanical coupling factor of the piezoelectric substrate 1 is large and at least 0.2%, and the temperature coefficient of frequency (TCF) is good.

The area 6-2 is defined as follows:

$\phi=22.5°\sim27.5°$ $\theta=25°\sim145°$ $\psi=-20°\sim40°$

The preferable range of the area 6-2, designated area 6-2-1, is defined as follows:

$\phi=22.5°\sim27.5°$ $\theta=50°\sim95°$ $\psi=-10°\sim20°$

In the area 6-2, there is a combination of $\phi$, $\theta$ and $\psi$ whereat the SAW velocity of the piezoelectric substrate 1 is at most 2900 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 6-2-1, which is a preferable range of the area 6-2, there is a combination of $\phi$, $\theta$ and $\psi$ whereat the electromechanical coupling factor of the piezoelectric substrate 1 is at least 0.3%.

Further referring to FIGS. 17–19, there is a combination of $\phi$, $\theta$ and $\psi$ in an area 6-3 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 6-3 is defined as follows:

$\phi=22.5°\sim27.5°$ $\theta=110°\sim155°$ $\psi=-80°\sim-40°$

The preferable range of the area 6-3, designated area 6-3-1, is defined as follows:

$\phi=22.5°\sim27.5°$ $\theta=120°\sim145°$ $\psi=-80°\sim50°$

The preferable range of the area 6-3-1, designated area 6-3-1-1, is defined as follows:

$\phi=22.5°\sim27.5°$ $\theta=125°\sim145°$ $\psi=-80°\sim-60°$

In the area 6-3, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 6-3-1, which is a preferable range of the area 6-3, there is a combination of $\phi$, $\theta$ and $\psi$ whereat the electromechanical coupling factor of the piezoelectric substrate 1 is at least 0.3%. Further, in the area 6-3-1-1, which is a preferable range of the area 6-3-1, there is a combination of $\phi$, $\theta$ and $\psi$ whereat the electromechanical coupling factor of the piezoelectric substrate 1 is at least 0.4%.

FIGS. 20–22 are contour maps respectively showing the SAW velocity, the electromechanical coupling factor, and the temperature coefficient of frequency (TCF) of surface acoustic wave devices when $\phi$, $\theta$, and $\psi$ of the piezoelectric substrates are 30°, a certain value between 0° and 180°, and a certain value between −90° to 90°, respectively.

Almost the same characteristics as those shown in FIGS. 20–22 can be obtained in the case where $\phi$ is 30±2.5°. Referring to FIGS. 20–22, therefore, there is a combination of $\phi$, $\theta$ and $\psi$ in the area 7-1 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 7-1 is defined as follows:

$\phi=27.5°\sim32.5°$ $\theta=25°\sim70°$ $\psi=-85°\sim-30°$

The preferable range of the area 7-1, designated area 7-1-1, is defined as follows:

$\phi=27.5°\sim32.5°$ $\theta=35°\sim60°$ $\psi=-80°\sim-45°$

The preferable range of the area 7-1-1, designated area 7-1-1-1, is defined as follows:

$\phi=27.5°\sim32.5°$ $\theta=35°\sim55°$ $\psi=-80°\sim-55°$

In the area 7-1, there is a combination of $\phi$, $\theta$ and $\psi$ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 7-1-1, which is a preferable range of the area 7-1, there is a combination of $\phi$, $\theta$ and $\psi$ whereat the electromechanical coupling factor of the piezoelectric substrate 1 is at least 0.3%. Further, in the area 7-1-1-1, which is preferable range of the area 7-1-1, there is a combination of $\phi$, $\theta$ and $\psi$ whereat the electromechanical coupling factor of the piezoelectric substrate 1 is at least 0.4%.

Further referring to FIGS. 20–22, there is a combination of $\phi$, $\theta$ and $\psi$ in an area 7-2 whereat the SAW velocity of the piezoelectric substrate 1 is at most 2900 m/s, which is markedly lower than that of ST quartz crystal, the electromechanical coupling factor of the piezoelectric substrate 1 is large and at least 0.2%, and the temperature coefficient of frequency (TCF) is good.

The area 7-2 is defined as follows:

$\phi=27.5°\sim32.5°$ $\theta=30°\sim150°$ $\psi=-30°\sim40°$

The preferable range of the area 7-2, designated area 7-2-1, is defined as follows:

$\phi=27.5°\sim32.5°$ $\theta=80°\sim100°$ $\psi=10°\sim20°$

In the area 7-2, there is a combination of φ, θ and ψ whereat the SAW velocity of the piezoelectric substrate 1 is at most 2900 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 7-2-1, which is a preferable range of the area 7-2, there is a combination of φ, θ and ψ whereat the electromechanical coupling factor of the piezoelectric substrate 1 is at least 0.3%.

Further referring to FIGS. 20–22, there is a combination of φ, θ and ψ in an area 7-3 whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good.

The area 7-3 is defined as follows:

φ=27.5°~32.5°

θ=110°~155°

ψ=−85°~−30°

The preferable range of the area 7-3, designated area 7-3-1, is defined as follows:

φ=27.5°~32.5°

θ=120°~145°

ψ=−80°~−45°

The preferable range of the area 7-3-1, designated area 7-3-1-1, is defined as follows:

φ=27.5°~32.5°

θ=125°~145°

ψ=−80°~−55°

In the area 7-3, there is a combination of φ, θ and ψ whereat the SAW velocity of the piezoelectric substrate 1 is at most 3100 m/s, which is markedly lower than that of ST quartz crystal, the electromechanical coupling factor of the piezoelectric substrate 1 is large and at least 0.2%, and the temperature coefficient of frequency (TCF) is good. Particularly, in the area 7-3-1, which is a preferable range of the area 7-3, there is a combination of φ, θ and ψ whereat the electromechanical coupling factor of the piezoelectric substrate 1 is at least 0.3%. Further, in the area 7-3-1-1, which is a preferable range of the area 7-3-1, there is a combination of φ, θ and ψ whereat the electromechanical coupling factor of the piezoelectric substrate 1 is at least 0.4%.

Therefore, the surface acoustic wave device using the piezoelectric substrate 1 in which the combination of φ, θ and ψ falls in one of these areas has a wide passband because the piezoelectric substrate 1 has a high electromechanical coupling factor and is small in size because the piezoelectric substrate 1 has a low SAW velocity.

EXAMPLE

First, a single crystal (CTGS single crystal) belonging to the point group 32 and represented by the chemical formula, $Ca_3TaGa_3Si_2O_{14}$, was fabricated. The fabrication of the CTGS single crystal was performed by means of the CZ process using a high-frequency heating, i.e., Czochralski growth method. The substrate was cut out from the obtained CTGS single crystal to obtain the piezoelectric substrate used for the surface acoustic wave device.

Next, a pair of inter-digital electrodes 2, 2 was formed on the surface of the piezoelectric substrate cut out from the CTGS single crystal, thereby producing the surface acoustic wave device. The inter-digital electrodes 2, 2 were formed by vacuum evaporation of Al and patterning by photoetching process. An electrode finger pitch which corresponds to surface acoustic wavelength Λ was 60 μm. The number of electrode finger pairs was 20. The aperture width of electrode fingers was 60λ (3600 μm). The electrode thickness was 0.3 μm.

A plurality of surface acoustic wave devices of the foregoing structure having different cut angle of the piezoelectric substrate and/or the propagation direction of the surface acoustic waves were fabricated, and their SAW velocities, electromechanical coupling factors, and temperature coefficient of frequency (TCF) were measured. The SAW velocities were obtained by multiplying the measured center frequency of the filter having inter-digital electrodes 2, 2 configured in the foregoing manner by the length of the surface acoustic wave. The electromechanical coupling factors were determined from the conductance and susceptance of the two-terminal measured at one of the inter-digital electrodes 2, 2, the input side for example, using the well-known Smith's equivalent circuit model. This method is explained in detail at "4.1.2 effective electromechanical coupling factor of surface wave" in "Chapter I. Basis" in "Surface Acoustic Wave Device and its Application (edited by Electronic Materials Manufacturers Association, published by The Nikkan Kogyo Shinbun, Ltd 1978)." The measurements of SAW velocities and electromechanical coupling factors were performed with the temperature around the device kept at 25° C. The measurements of temperature coefficient of frequency (TCF) were performed over the temperature range of −20° C. to 80° C. under control of a thermostat.

EXAMPLE 1

Table 2 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 1-1 (excluding the area 1-1-1).

TABLE 2

(AREA 1-1)

| SAMPLE No. | φ | θ | ψ | SAW Velocity (m/s) | $K^2$ (%) | TCF (ppm/C.°) |
|---|---|---|---|---|---|---|
| 1-1(A) | 0° | 35° | 25° | 2892 | 0.21 | 23 |
| 1-1(B) | 0° | 30° | 0° | 2862 | 0.22 | 23 |
| 1-1(C) | 0° | 30° | −25° | 2895 | 0.21 | 23 |
| 1-1(D) | 0° | 50° | 65° | 2981 | 0.21 | 0 |
| 1-1(E) | 0° | 50° | −65° | 2981 | 0.21 | 0 |
| 1-1(F) | 0° | 90° | 15° | 2823 | 0.23 | −29 |
| 1-1(G) | 0° | 90° | −15° | 2823 | 0.23 | −29 |

As shown in Table 2, every specimen using a piezoelectric substrate falling in the area 1-1 (excluding the area 1-1-1) had a SAW velocity of at most 3000 m/s, an electromechanical coupling factor ($k^2$) of greater than 0.2%, and a good temperature coefficient of frequency (TCF).

EXAMPLE 2

Table 3 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 1-1-1 (excluding the areas 1-1-1-1, 1-1-1-2, and 1-1-1-3).

TABLE 3

(AREA 1-1-1)

| SAMPLE No. | φ | θ | ψ | SAW Velocity (m/s) | K² (%) | TCF (ppm/C.°) |
|---|---|---|---|---|---|---|
| 1-1-1(A) | 0° | 35° | 40° | 2938 | 0.30 | 7 |
| 1-1-1(B) | 0° | 35° | −40° | 2938 | 0.30 | 7 |
| 1-1-1(C) | 0° | 40° | 0° | 2851 | 0.33 | 2 |
| 1-1-1(D) | 0° | 80° | 5° | 2824 | 0.31 | −37 |
| 1-1-1(E) | 0° | 80° | −5° | 2824 | 0.31 | −37 |

As shown in Table 3, every specimen using a piezoelectric substrate falling in the area 1-1-1 (excluding the areas 1-1-1-1, 1-1-1-2, and 1-1-1-3) had a SAW velocity of at most 3000 m/s, an electromechanical coupling factor (k²) of greater than 0.3%, and a good temperature coefficient of frequency (TCF).

EXAMPLE 3

Table 4 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 1-1-1-1.

TABLE 4

(AREA 1-1-1-1)

| SAMPLE No. | φ | θ | ψ | SAW Velocity (m/s) | K² (%) | TCF (ppm/C.°) |
|---|---|---|---|---|---|---|
| 1-1-1-1(A) | 0° | 50° | 5° | 2841 | 0.40 | −16 |
| 1-1-1-1(B) | 0° | 50° | −5° | 2841 | 0.40 | −16 |
| 1-1-1-1(C) | 0° | 60° | 10° | 2837 | 0.41 | −29 |
| 1-1-1-1(D) | 0° | 60° | 0° | 2831 | 0.43 | −30 |
| 1-1-1-1(E) | 0° | 60° | −10° | 2837 | 0.41 | −29 |
| 1-1-1-1(F) | 0° | 70° | 0° | 2827 | 0.40 | −38 |

As shown in Table 4, every specimen using a piezoelectric substrate falling in the area 1-1-1-1 had a SAW velocity of at most 2900 m/s, an electromechanical coupling factor (k²) of greater than 0.4%, and a good temperature coefficient of frequency (TCF).

EXAMPLE 4

Table 5 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 1-1-1-2.

TABLE 5

(AREA 1-1-1-2)

| SAMPLE No. | φ | θ | ψ | SAW Velocity (m/s) | K² (%) | TCF (ppm/C.°) |
|---|---|---|---|---|---|---|
| 1-1-1-2(A) | 0° | 45° | 40° | 2936 | 0.42 | −15 |
| 1-1-1-2(B) | 0° | 50° | 45° | 2941 | 0.41 | −18 |
| 1-1-1-2(C) | 0° | 50° | 35° | 2912 | 0.42 | −19 |
| 1-1-1-2(D) | 0° | 50° | 25° | 2882 | 0.40 | −19 |
| 1-1-1-2(E) | 0° | 55° | 30° | 2888 | 0.40 | −22 |

As shown in Table 5, every specimen using a piezoelectric substrate falling in the area 1-1-1-2 had a SAW velocity of at most 3000 m/s, an electromechanical coupling factor (k²) of greater than 0.4%, and a good temperature coefficient of frequency (TCF).

EXAMPLE 5

Table 6 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 1-1-1-3.

TABLE 6

(AREA 1-1-1-3)

| SAMPLE No. | φ | θ | ψ | SAW Velocity (m/s) | K² (%) | TCF (ppm/C.°) |
|---|---|---|---|---|---|---|
| 1-1-1-3(A) | 0° | 45° | −40° | 2936 | 0.42 | −15 |
| 1-1-1-3(B) | 0° | 50° | −45° | 2941 | 0.41 | −18 |
| 1-1-1-3(C) | 0° | 50° | −35° | 2912 | 0.42 | −19 |
| 1-1-1-3(D) | 0° | 50° | −25° | 2882 | 0.40 | −19 |
| 1-1-1-3(E) | 0° | 55° | −30° | 2888 | 0.40 | −22 |

As shown in Table 6, every specimen using a piezoelectric substrate falling in the area 1-1-1-3 had a SAW velocity of at most 3000 m/s, an electromechanical coupling factor (k²) of greater than 0.4%, and a good temperature coefficient of frequency (TCF).

EXAMPLE 6

Table 7 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 1-2 (excluding the area 1-2-1).

TABLE 7

(AREA 1-2)

| SAMPLE No. | φ | θ | ψ | SAW Velocity (m/s) | K² (%) | TCF (ppm/C.°) |
|---|---|---|---|---|---|---|
| 1-2(A) | 0° | 120° | 75° | 2959 | 0.21 | 51 |
| 1-2(B) | 0° | 120° | 80° | 2986 | 0.24 | 47 |
| 1-2(C) | 0° | 120° | 85° | 3014 | 0.23 | 41 |
| 1-2(D) | 0° | 135° | 70° | 2995 | 0.27 | 16 |
| 1-2(E) | 0° | 145° | 70° | 3017 | 0.23 | −5 |

As shown in Table 7, every specimen using a piezoelectric substrate falling in the area 1-2 (excluding the area 1-2-1) had a SAW velocity of at most 3100 m/s, an electromechanical coupling factor (k²) of greater than 0.2%, and a good temperature coefficient of frequency (TCF).

EXAMPLE 7

Table 8 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 1-2-1.

TABLE 8

(AREA 1-2-1)

| SAMPLE No. | φ | θ | ψ | SAW Velocity (m/s) | $K^2$ (%) | TCF (ppm/C.°) |
|---|---|---|---|---|---|---|
| 1-2-1(A) | 0° | 130° | 80° | 3033 | 0.40 | 16 |
| 1-2-1(B) | 0° | 135° | 75° | 3022 | 0.36 | 9 |
| 1-2-1(C) | 0° | 135° | 80° | 3050 | 0.43 | 0 |
| 1-2-1(D) | 0° | 140° | 80° | 3061 | 0.42 | −12 |
| 1-2-1(E) | 0° | 145° | 85° | 3086 | 0.33 | −22 |

As shown in Table 8, every specimen using a piezoelectric substrate falling in the area 1-2-1 had a SAW velocity of at most 3100 m/s, an electromechanical coupling factor ($k^2$) of greater than 0.3%, and a good temperature coefficient of frequency (TCF).

EXAMPLE 8

Table 9 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 1-3 (excluding the area 1-3-1).

TABLE 9

(AREA 1-3)

| SAMPLE No. | φ | θ | ψ | SAW Velocity (m/s) | $K^2$ (%) | TCF (ppm/C.°) |
|---|---|---|---|---|---|---|
| 1-3(A) | 0° | 120° | −75° | 2959 | 0.21 | 51 |
| 1-3(B) | 0° | 120° | −80° | 2986 | 0.24 | 47 |
| 1-3(C) | 0° | 120° | −85° | 3014 | 0.23 | 41 |
| 1-3(D) | 0° | 135° | −70° | 2995 | 0.27 | 16 |
| 1-3(E) | 0° | 145° | −70° | 3017 | 0.23 | −5 |

As shown in Table 9, every specimen using a piezoelectric substrate falling in the area 1-3 (excluding the area 1-3-1) had a SAW velocity of at most 3100 m/s, an electromechanical coupling factor ($k^2$) of greater than 0.2%, and a good temperature coefficient of frequency (TCF).

EXAMPLE 9

Table 10 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 1-3-1.

TABLE 10

(AREA 1-3-1)

| SAMPLE No. | φ | θ | ψ | SAW Velocity (m/s) | $K^2$ (%) | TCF (ppm/C.°) |
|---|---|---|---|---|---|---|
| 1-3-1(A) | 0° | 130° | −80° | 3033 | 0.40 | 16 |
| 1-3-1(B) | 0° | 135° | −75° | 3022 | 0.36 | 9 |
| 1-3-1(C) | 0° | 135° | −80° | 3050 | 0.43 | 0 |
| 1-3-1(D) | 0° | 140° | −80° | 3061 | 0.42 | −12 |
| 1-3-1(E) | 0° | 145° | −85° | 3086 | 0.33 | −22 |

As shown in Table 10, every specimen using a piezoelectric substrate falling in the area 1-3-1 had a SAW velocity of at most 3100 m/s, an electromechanical coupling factor ($k^2$) of greater than 0.3%, and a good temperature coefficient of frequency (TCF).

EXAMPLE 10

Table 11 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 2-1 (excluding the area 2-1-1).

TABLE 11

(AREA 2-1)

| SAMPLE No. | φ | θ | ψ | SAW Velocity (m/s) | $K^2$ (%) | TCF (ppm/C.°) |
|---|---|---|---|---|---|---|
| 2-1(A) | 5° | 30° | 0° | 2862 | 0.22 | 24 |
| 2-1(B) | 5° | 30° | −45° | 2946 | 0.23 | 19 |
| 2-1(C) | 5° | 40° | 55° | 2973 | 0.20 | −6 |
| 2-1(D) | 5° | 55° | −70° | 2983 | 0.24 | 9 |
| 2-1(E) | 5° | 85° | −20° | 2822 | 0.23 | −23 |
| 2-1(F) | 5° | 90° | 30° | 2835 | 0.21 | −18 |

As shown in Table 11, every specimen using a piezoelectric substrate falling in the area 2-1 (excluding the area 2-1-1) had a SAW velocity of at most 3000 m/s, an electromechanical coupling factor ($k^2$) of greater than 0.2%, and a good temperature coefficient of frequency (TCF).

EXAMPLE 11

Table 12 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 2-1-1 (excluding the areas 2-1-1-1 and 2-1-1-2).

TABLE 12

(AREA 2-1-1)

| SAMPLE No. | φ | θ | ψ | SAW Velocity (m/s) | $K^2$ (%) | TCF (ppm/C.°) |
|---|---|---|---|---|---|---|
| 2-1-1(A) | 5° | 40° | 5° | 2852 | 0.33 | 5 |
| 2-1-1(B) | 5° | 40° | 35° | 2923 | 0.33 | −2 |
| 2-1-1(C) | 5° | 50° | 50° | 2949 | 0.30 | −15 |
| 2-1-1(D) | 5° | 50° | −65° | 2988 | 0.30 | −5 |
| 2-1-1(E) | 5° | 65° | −45° | 2892 | 0.31 | −5 |
| 2-1-1(F) | 5° | 80° | 15° | 2832 | 0.32 | −35 |

As shown in Table 12, every specimen using a piezoelectric substrate falling in the area 2-1-1 (excluding the areas 2-1-1-1 and 2-1-1-2) had a SAW velocity of at most 3000 m/s, an electromechanical coupling factor ($k^2$) of greater than 0.3%, and a good temperature coefficient of frequency (TCF).

EXAMPLE 12

Table 13 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 2-1-1-1.

TABLE 13

(AREA 2-1-1-1)

| SAMPLE No. | φ | θ | ψ | SAW Velocity (m/s) | K² (%) | TCF (ppm/C. °) |
|---|---|---|---|---|---|---|
| 2-1-1-1(A) | 5° | 50° | −5° | 2841 | 0.40 | −16 |
| 2-1-1-1(B) | 5° | 55° | 20° | 2865 | 0.40 | −23 |
| 2-1-1-1(C) | 5° | 60° | 5° | 2834 | 0.43 | −28 |
| 2-1-1-1(D) | 5° | 60° | 15° | 2848 | 0.40 | −28 |
| 2-1-1-1(E) | 5° | 65° | 0° | 2829 | 0.40 | −34 |
| 2-1-1-1(F) | 5° | 65° | 10° | 2836 | 0.42 | −32 |
| 2-1-1-1(G) | 5° | 70° | 5° | 2829 | 0.40 | −37 |

As shown in Table 13, every specimen using a piezoelectric substrate falling in the area 2-1-1-1 had a SAW velocity of at most 2900 m/s, an electromechanical coupling factor ($k^2$) of greater than 0.4%, and a good temperature coefficient of frequency (TCF).

EXAMPLE 13

Table 14 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 2-1-1-2.

TABLE 14

(AREA 2-1-1-2)

| SAMPLE No. | φ | θ | ψ | SAW Velocity (m/s) | K² (%) | TCF (ppm/C. °) |
|---|---|---|---|---|---|---|
| 2-1-1-2(A) | 5° | 40° | −50° | 2973 | 0.41 | −11 |
| 2-1-1-2(B) | 5° | 45° | −55° | 2979 | 0.41 | −15 |
| 2-1-1-2(C) | 5° | 50° | −30° | 2893 | 0.40 | −19 |
| 2-1-1-2(D) | 5° | 50° | −45° | 2940 | 0.45 | −17 |
| 2-1-1-2(E) | 5° | 55° | −40° | 2911 | 0.42 | −17 |

As shown in Table 14, every specimen using a piezoelectric substrate falling in the area 2-1-1-2 had a SAW velocity of at most 3000 m/s, an electromechanical coupling factor ($k^2$) of greater than 0.4%, and a good temperature coefficient of frequency (TCF).

EXAMPLE 14

Table 15 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 2-2 (excluding the area 2-2-1).

TABLE 15

(AREA 2-2)

| SAMPLE No. | φ | θ | ψ | SAW Velocity (m/s) | K² (%) | TCF (ppm/C. °) |
|---|---|---|---|---|---|---|
| 2-2(A) | 5° | 120° | 80° | 2981 | 0.21 | 51 |
| 2-2(B) | 5° | 120° | 85° | 3011 | 0.21 | 45 |
| 2-2(C) | 5° | 130° | 75° | 2996 | 0.26 | 30 |
| 2-2(D) | 5° | 135° | 75° | 3013 | 0.28 | 16 |
| 2-2(E) | 5° | 145° | 75° | 3032 | 0.23 | −7 |

As shown in Table 15, every specimen using a piezoelectric substrate falling in the area 2-2 (excluding the area 2-2-1) had a SAW velocity of at most 3100 m/s, an electromechanical coupling factor ($k^2$) of greater than 0.2%, and a good temperature coefficient of frequency (TCF).

EXAMPLE 15

Table 16 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 2-2-1.

TABLE 16

(AREA 2-2-1)

| SAMPLE No. | φ | θ | ψ | SAW Velocity (m/s) | K² (%) | TCF (ppm/C. °) |
|---|---|---|---|---|---|---|
| 2-2-1(A) | 5° | 125° | 85° | 3035 | 0.32 | 29 |
| 2-2-1(B) | 5° | 130° | 80° | 3025 | 0.34 | 22 |
| 2-2-1(C) | 5° | 130° | 85° | 3052 | 0.33 | 11 |
| 2-2-1(D) | 5° | 135° | 80° | 3041 | 0.35 | 7 |
| 2-2-1(E) | 5° | 145° | 85° | 3079 | 0.30 | −23 |

As shown in Table 16, every specimen using a piezoelectric substrate falling in the area 2-2-1 had a SAW velocity of at most 3100 m/s, an electromechanical coupling factor ($k^2$) of greater than 0.3%, and a good temperature coefficient of frequency (TCF).

EXAMPLE 16

Table 17 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 2-3 (excluding the area 2-3-1).

TABLE 17

(AREA 2-3)

| SAMPLE No. | φ | θ | ψ | SAW Velocity (m/s) | K² (%) | TCF (ppm/C. °) |
|---|---|---|---|---|---|---|
| 2-3(A) | 5° | 130° | −65° | 2959 | 0.23 | 26 |
| 2-3(B) | 5° | 135° | −65° | 2977 | 0.26 | 14 |
| 2-3(C) | 5° | 140° | −65° | 2992 | 0.26 | 2 |
| 2-3(D) | 5° | 145° | −65° | 3001 | 0.23 | −5 |

As shown in Table 17, every specimen using a piezoelectric substrate falling in the area 2-3 (excluding the area 2-3-1) had a SAW velocity of at most 3100 m/s, an electromechanical coupling factor ($k^2$) of greater than 0.2%, and a good temperature coefficient of frequency (TCF).

EXAMPLE 17

Table 18 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 2-3-1 (excluding the area 2-3-1-1).

TABLE 18

(AREA 2-3-1)

| SAMPLE No. | φ | θ | ψ | SAW Velocity (m/s) | K² (%) | TCF (ppm/C. °) |
|---|---|---|---|---|---|---|
| 2-3-1(A) | 5° | 125° | −75° | 2988 | 0.33 | 33 |
| 2-3-1(B) | 5° | 125° | −85° | 3045 | 0.37 | 19 |
| 2-3-1(C) | 5° | 130° | −70° | 2984 | 0.31 | 23 |
| 2-3-1(D) | 5° | 140° | −70° | 3018 | 0.35 | −3 |
| 2-3-1(E) | 5° | 145° | −85° | 3090 | 0.35 | −22 |

As shown in Table 18, every specimen using a piezoelectric substrate falling in the area 2-3-1 (excluding the area 2-3-1-1) had a SAW velocity of at most 3100 m/s, an electromechanical coupling factor ($k^2$) of greater than 0.3%, and a good temperature coefficient of frequency (TCF).

EXAMPLE 18

Table 19 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 2-3-1-1.

TABLE 19

(AREA 2-3-1-1)

| SAMPLE No. | φ | θ | ψ | SAW Velocity (m/s) | K² (%) | TCF (ppm/C. °) |
|---|---|---|---|---|---|---|
| 2-3-1-1(A) | 5° | 130° | −75° | 3011 | 0.40 | 18 |
| 2-3-1-1(B) | 5° | 130° | −80° | 3040 | 0.45 | 11 |
| 2-3-1-1(C) | 5° | 135° | −80° | 3057 | 0.49 | −5 |
| 2-3-1-1(D) | 5° | 140° | −75° | 3044 | 0.43 | −9 |
| 2-3-1-1(E) | 5° | 140° | −80° | 3069 | 0.48 | −17 |

As shown in Table 19, every specimen using a piezoelectric substrate falling in the area 2-3-1-1 had a SAW velocity of at most 3100 m/s, an electromechanical coupling factor ($k^2$) of greater than 0.4%, and a good temperature coefficient of frequency (TCF).

EXAMPLE 19

Table 20 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 3-1 (excluding the area 3-1-1).

TABLE 20

(AREA 3-1)

| SAMPLE No. | φ | θ | ψ | SAW Velocity (m/s) | K² (%) | TCF (ppm/C. °) |
|---|---|---|---|---|---|---|
| 3-1(A) | 10° | 45° | 45° | 2942 | 0.25 | −12 |
| 3-1(B) | 10° | 55° | 50° | 2932 | 0.22 | −13 |
| 3-1(C) | 10° | 60° | −80° | 2995 | 0.20 | 33 |
| 3-1(D) | 10° | 90° | 30° | 2841 | 0.22 | −23 |
| 3-1(E) | 10° | 90° | −10° | 2817 | 0.20 | −28 |
| 3-1(F) | 10° | 95° | 25° | 2834 | 0.24 | −31 |

As shown in Table 20, every specimen using a piezoelectric substrate falling in the area 3-1 (excluding the area 3-1-1) had a SAW velocity of at most 3100 m/s, an electromechanical coupling factor ($k^2$) of greater than 0.2%, and a good temperature coefficient of frequency (TCF).

EXAMPLE 20

Table 21 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 3-1-1 (excluding the areas 3-1-1-1 and 3-1-1-2).

TABLE 21

(AREA 3-1-1)

| SAMPLE No. | φ | θ | ψ | SAW Velocity (m/s) | K² (%) | TCF (ppm/C. °) |
|---|---|---|---|---|---|---|
| 3-1-1(A) | 10° | 50° | 30° | 2900 | 0.36 | −17 |
| 3-1-1(B) | 10° | 50° | −70° | 3004 | 0.32 | −1 |
| 3-1-1(C) | 10° | 55° | 40° | 2915 | 0.31 | −21 |
| 3-1-1(D) | 10° | 65° | −40° | 2875 | 0.30 | −5 |
| 3-1-1(E) | 10° | 85° | 10° | 2830 | 0.31 | −38 |

As shown in Table 21, every specimen using a piezoelectric substrate falling in the area 3-1-1 (excluding the areas 3-1-1-1 and 3-1-1-2) had a SAW velocity of at most 3100 m/s, an electromechanical coupling factor ($k^2$) of greater than 0.3%, and a good temperature coefficient of frequency (TCF).

EXAMPLE 21

Table 22 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 3-1-1-1.

TABLE 22

(AREA 3-1-1-1)

| SAMPLE No. | φ | θ | ψ | SAW Velocity (m/s) | K² (%) | TCF (ppm/C. °) |
|---|---|---|---|---|---|---|
| 3-1-1-1(A) | 10° | 55° | −5° | 2835 | 0.40 | −22 |
| 3-1-1-1(B) | 10° | 60° | 0° | 2831 | 0.42 | −26 |
| 3-1-1-1(C) | 10° | 60° | 10° | 2841 | 0.41 | −25 |
| 3-1-1-1(D) | 10° | 65° | 5° | 2832 | 0.42 | −31 |
| 3-1-1-1(E) | 10° | 70° | 5° | 2830 | 0.40 | −36 |

As shown in Table 22, every specimen using a piezoelectric substrate falling in the area 3-1-1-1 had a SAW velocity of at most 2900 m/s, an electromechanical coupling factor ($k^2$) of greater than 0.4%, and a good temperature coefficient of frequency (TCF).

EXAMPLE 22

Table 23 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 3-1-1-2.

TABLE 23

(AREA 3-1-1-2)

| SAMPLE No. | φ | θ | ψ | SAW Velocity (m/s) | K² (%) | TCF (ppm/C. °) |
|---|---|---|---|---|---|---|
| 3-1-1-2(A) | 10° | 40° | −55° | 2990 | 0.45 | −13 |
| 3-1-1-2(B) | 10° | 45° | −50° | 2967 | 0.49 | −16 |
| 3-1-1-2(C) | 10° | 45° | −60° | 2996 | 0.44 | −15 |
| 3-1-1-2(D) | 10° | 50° | −40° | 2921 | 0.44 | −16 |
| 3-1-1-2(E) | 10° | 55° | −45° | 2921 | 0.42 | −11 |

As shown in Table 23, every specimen using a piezoelectric substrate falling in the area 3-1-1-2 had a SAW velocity of at most 3000 m/s, an electromechanical coupling factor ($k^2$) of greater than 0.4%, and a good temperature coefficient of frequency (TCF).

EXAMPLE 23

Table 24 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 3-2.

TABLE 24

(AREA 3-2)

| SAMPLE No. | φ | θ | ψ | SAW Velocity (m/s) | K² (%) | TCF (ppm/C. °) |
|---|---|---|---|---|---|---|
| 3-2(A) | 10° | 120° | 85° | 3007 | 0.20 | 49 |
| 3-2(B) | 10° | 125° | 85° | 3029 | 0.28 | 34 |
| 3-2(C) | 10° | 130° | 75° | 2989 | 0.20 | 36 |
| 3-2(D) | 10° | 140° | 80° | 3041 | 0.26 | 0 |
| 3-2(E) | 10° | 145° | 85° | 3069 | 0.24 | −21 |

As shown in Table 24, every specimen using a piezoelectric substrate falling in the area 3-2 had a SAW velocity of at most 3100 m/s, an electromechanical coupling factor ($k^2$) of greater than 0.2%, and a good temperature coefficient of frequency (TCF).

EXAMPLE 24

Table 25 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 3-3 (excluding the area 3-3-1).

TABLE 25

(AREA 3-3)

| SAMPLE No. | φ | θ | ψ | SAW Velocity (m/s) | K² (%) | TCF (ppm/C. °) |
|---|---|---|---|---|---|---|
| 3-3(A) | 10° | 120° | −75° | 2968 | 0.28 | 42 |
| 3-3(B) | 10° | 120° | −85° | 3021 | 0.25 | 34 |
| 3-3(C) | 10° | 135° | −60° | 2961 | 0.25 | 11 |
| 3-3(D) | 10° | 145° | −60° | 2986 | 0.23 | −5 |
| 3-3(E) | 10° | 150° | −70° | 3021 | 0.20 | 0 |

As shown in Table 25, every specimen using a piezoelectric substrate falling in the area 3-3 (excluding the area 3-3-1) had a SAW velocity of at most 3100 m/s, an electromechanical coupling factor ($k^2$) of greater than 0.2%, and a good temperature coefficient of frequency (TCF).

EXAMPLE 25

Table 26 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 3-3-1 (excluding the area 3-3-1-1).

TABLE 26

(AREA 3-3-1)

| SAMPLE No. | φ | θ | ψ | SAW Velocity (m/s) | K² (%) | TCF (ppm/C. °) |
|---|---|---|---|---|---|---|
| 3-3-1(A) | 10° | 125° | −85° | 3048 | 0.38 | 15 |
| 3-3-1(B) | 10° | 130° | −65° | 2966 | 0.30 | 21 |
| 3-3-1(C) | 10° | 135° | −65° | 2985 | 0.34 | 8 |
| 3-3-1(D) | 10° | 145° | −65° | 3008 | 0.30 | −9 |
| 3-3-1(E) | 10° | 145° | −85° | 3090 | 0.36 | −26 |

As shown in Table 26, every specimen using a piezoelectric substrate falling in the area 3-3-1 (excluding the area 3-3-1-1) had a SAW velocity of at most 3100 m/s, an electromechanical coupling factor ($k^2$) of greater than 0.3%, and a good temperature coefficient of frequency (TCF).

EXAMPLE 26

Table 27 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 3-3-1-1.

TABLE 27

(AREA 3-3-1-1)

| SAMPLE No. | φ | θ | ψ | SAW Velocity (m/s) | K² (%) | TCF (ppm/C. °) |
|---|---|---|---|---|---|---|
| 3-3-1-1(A) | 10° | 125° | −80° | 3022 | 0.41 | 23 |
| 3-3-1-1(B) | 10° | 130° | −75° | 3018 | 0.46 | 12 |
| 3-3-1-1(C) | 10° | 135° | −80° | 3063 | 0.53 | −9 |
| 3-3-1-1(D) | 10° | 140° | −70° | 3026 | 0.43 | −8 |
| 3-3-1-1(E) | 10° | 145° | −80° | 3075 | 0.40 | −16 |

As shown in Table 27, every specimen using a piezoelectric substrate falling in the area 3-3-1-1 had a SAW velocity of at most 3100 m/s, an electromechanical coupling factor ($k^2$) of greater than 0.4%, and a good temperature coefficient of frequency (TCF).

EXAMPLE 27

Table 28 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 4-1 (excluding the areas 4-1-1 and 4-1-2).

TABLE 28

(AREA 4-1)

| SAMPLE No. | φ | θ | ψ | SAW Velocity (m/s) | K² (%) | TCF (ppm/C. °) |
|---|---|---|---|---|---|---|
| 4-1(A) | 15° | 30° | 5° | 2862 | 0.21 | 24 |
| 4-1(B) | 15° | 50° | 40° | 2920 | 0.24 | −18 |
| 4-1(C) | 15° | 55° | −80° | 3015 | 0.24 | 34 |
| 4-1(D) | 15° | 65° | 45° | 2898 | 0.20 | −15 |
| 4-1(E) | 15° | 70° | −25° | 2831 | 0.22 | −17 |
| 4-1(F) | 15° | 100° | 15° | 2834 | 0.23 | −30 |

As shown in Table 28, every specimen using a piezoelectric substrate falling in the area 4-1 (excluding the areas 4-1-1 and 4-1-2) had a SAW velocity of at most 3100 m/s, an electromechanical coupling factor ($k^2$) of greater than 0.2%, and a good temperature coefficient of frequency (TCF).

EXAMPLE 28

Table 29 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 4-1-1.

TABLE 29

(AREA 4-1-1)

| SAMPLE No. | φ | θ | ψ | SAW Velocity (m/s) | K² (%) | TCF (ppm/C. °) |
|---|---|---|---|---|---|---|
| 4-1-1(A) | 15° | 45° | −10° | 2850 | 0.33 | −10 |
| 4-1-1(B) | 15° | 50° | 5° | 2841 | 0.37 | −10 |
| 4-1-1(C) | 15° | 55° | 30° | 2892 | 0.32 | −23 |
| 4-1-1(D) | 15° | 65° | 20° | 2858 | 0.36 | −31 |
| 4-1-1(E) | 15° | 75° | 0° | 2827 | 0.35 | −38 |
| 4-1-1(F) | 15° | 90° | 15° | 2836 | 0.30 | −35 |

As shown in Table 29, every specimen using a piezoelectric substrate falling in the area 4-1-1 had a SAW velocity of at most 2900 m/s, an electromechanical coupling factor ($k^2$) of greater than 0.3%, and a good temperature coefficient of frequency (TCF).

EXAMPLE 29

Table 30 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 4-1-2 (excluding the area 4-1-2-1).

TABLE 30

(AREA 4-1-2)

| SAMPLE No. | φ | θ | ψ | SAW Velocity (m/s) | K² (%) | TCF (ppm/C. °) |
|---|---|---|---|---|---|---|
| 4-1-2(A) | 15° | 35° | −70° | 3028 | 0.30 | −5 |
| 4-1-2(B) | 15° | 35° | −40° | 2939 | 0.33 | 0 |
| 4-1-2(C) | 15° | 35° | −50° | 2974 | 0.38 | −2 |
| 4-1-2(D) | 15° | 55° | −35° | 2885 | 0.34 | −16 |
| 4-1-2(E) | 15° | 60° | −70° | 2970 | 0.31 | 14 |

As shown in Table 30, every specimen using a piezoelectric substrate falling in the area 4-1-2 (excluding the area 4-1-2-1) had a SAW velocity of at most 3100 m/s, an electromechanical coupling factor ($k^2$) of greater than 0.3%, and a good temperature coefficient of frequency (TCF).

EXAMPLE 30

Table 31 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 4-1-2-1.

TABLE 31

(AREA 4-1-2-1)

| SAMPLE No. | φ | θ | ψ | SAW Velocity (m/s) | K² (%) | TCF (ppm/C. °) |
|---|---|---|---|---|---|---|
| 4-1-2-1(A) | 15° | 40° | −65° | 3020 | 0.44 | −12 |
| 4-1-2-1(B) | 15° | 40° | −45° | 2955 | 0.44 | −12 |
| 4-1-2-1(C) | 15° | 45° | −55° | 2982 | 0.52 | −16 |
| 4-1-2-1(D) | 15° | 50° | −40° | 2915 | 0.41 | −16 |
| 4-1-2-1(E) | 15° | 50° | −65° | 2997 | 0.46 | −7 |
| 4-1-2-1(F) | 15° | 55° | −60° | 2963 | 0.43 | −4 |

As shown in Table 31, every specimen using a piezoelectric substrate falling in the area 4-1-2-1 had a SAW velocity of at most 3100 m/s, an electromechanical coupling factor ($k^2$) of greater than 0.4%, and a good temperature coefficient of frequency (TCF).

EXAMPLE 31

Table 32 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 4-2.

TABLE 32

(AREA 4-2)

| SAMPLE No. | φ | θ | ψ | SAW Velocity (m/s) | K² (%) | TCF (ppm/C. °) |
|---|---|---|---|---|---|---|
| 4-2(A) | 15° | 125° | 85° | 3022 | 0.23 | 34 |
| 4-2(B) | 15° | 130° | 80° | 3009 | 0.21 | 29 |
| 4-2(C) | 15° | 135° | 85° | 3045 | 0.20 | 1 |

As shown in Table 32, every specimen using a piezoelectric substrate falling in the area 4-2 had a SAW velocity of at most 3100 m/s, an electromechanical coupling factor ($k^2$) of greater than 0.2%, and a good temperature coefficient of frequency (TCF).

EXAMPLE 32

Table 33 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 4-3 (excluding the area 4-3-1).

TABLE 33

(AREA 4-3)

| SAMPLE No. | φ | θ | ψ | SAW Velocity (m/s) | K² (%) | TCF (ppm/C. °) |
|---|---|---|---|---|---|---|
| 4-3(A) | 15° | 115° | −75° | 2946 | 0.21 | 54 |
| 4-3(B) | 15° | 120° | −85° | 3024 | 0.26 | 34 |
| 4-3(C) | 15° | 140° | −55° | 2962 | 0.25 | 4 |
| 4-3(D) | 15° | 150° | −60° | 2988 | 0.20 | −1 |
| 4-3(E) | 15° | 150° | −70° | 3024 | 0.22 | 0 |

As shown in Table 33, every specimen using a piezoelectric substrate falling in the area 4-3 (excluding the area 4-3-1) had a SAW velocity of at most 3100 m/s, an electromechanical coupling factor ($k^2$) of greater than 0.2%, and a good temperature coefficient of frequency (TCF).

EXAMPLE 33

Table 34 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 4-3-1 (excluding the area 4-3-1-1).

TABLE 34

(AREA 4-3-1)

| SAMPLE No. | φ | θ | ψ | SAW Velocity (m/s) | K² (%) | TCF (ppm/C. °) |
|---|---|---|---|---|---|---|
| 4-3-1(A) | 15° | 120° | −80° | 2998 | 0.31 | 39 |
| 4-3-1(B) | 15° | 135° | −60° | 2969 | 0.32 | 11 |
| 4-3-1(C) | 15° | 140° | −60° | 2984 | 0.33 | 1 |

As shown in Table 34, every specimen using a piezoelectric substrate falling in the area 4-3-1 (excluding the area 4-3-1-1) had a SAW velocity of at most 3100 m/s, an electromechanical coupling factor ($k^2$) of greater than 0.3%, and a good temperature coefficient of frequency (TCF).

EXAMPLE 34

Table 35 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 4-3-1-1.

TABLE 35

(AREA 4-3-1-1)

| SAMPLE No. | φ | θ | ψ | SAW Velocity (m/s) | K² (%) | TCF (ppm/C. °) |
|---|---|---|---|---|---|---|
| 4-3-1-1(A) | 15° | 125° | −80° | 3026 | 0.44 | 23 |
| 4-3-1-1(B) | 15° | 130° | −70° | 2998 | 0.44 | 17 |
| 4-3-1-1(C) | 15° | 135° | −75° | 3044 | 0.56 | −2 |
| 4-3-1-1(D) | 15° | 140° | −65° | 3008 | 0.42 | −3 |
| 4-3-1-1(E) | 15° | 145° | −80° | 3077 | 0.43 | −16 |

As shown in Table 35, every specimen using a piezoelectric substrate falling in the area 4-3-1-1 had a SAW velocity of at most 3100 m/s, an electromechanical coupling factor ($k^2$) of greater than 0.4%, and a good temperature coefficient of frequency (TCF).

EXAMPLE 35

Table 36 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 5-1 (excluding the area 5-1-1).

TABLE 36

(AREA 5-1)

| SAMPLE No. | φ | θ | ψ | SAW Velocity (m/s) | K² (%) | TCF (ppm/C. °) |
|---|---|---|---|---|---|---|
| 5-1(A) | 20° | 30° | −75° | 3028 | 0.20 | 9 |
| 5-1(B) | 20° | 30° | −60° | 2995 | 0.27 | 14 |
| 5-1(C) | 20° | 35° | −25° | 2889 | 0.24 | 3 |
| 5-1(D) | 20° | 55° | −30° | 2866 | 0.26 | −18 |
| 5-1(E) | 20° | 65° | −50° | 2887 | 0.26 | 5 |
| 5-1(F) | 20° | 65° | −80° | 2978 | 0.20 | 35 |

As shown in Table 36, every specimen using a piezoelectric substrate falling in the area 5-1 (excluding the area 5-1-1) had a SAW velocity of at most 3100 m/s, an electromechanical coupling factor ($k^2$) of greater than 0.2%, and a good temperature coefficient of frequency (TCF).

EXAMPLE 36

Table 37 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 5-1-1 (excluding the area 5-1-1-1).

TABLE 37

(AREA 5-1-1)

| SAMPLE No. | φ | θ | ψ | SAW Velocity (m/s) | K² (%) | TCF (ppm/C. °) |
|---|---|---|---|---|---|---|
| 5-1-1(A) | 20° | 35° | −75° | 3043 | 0.30 | 0 |
| 5-1-1(B) | 20° | 35° | −40° | 2936 | 0.31 | 0 |
| 5-1-1(C) | 20° | 40° | −35° | 2914 | 0.32 | −10 |
| 5-1-1(D) | 20° | 60° | −45° | 2891 | 0.30 | −6 |
| 5-1-1(E) | 20° | 60° | −60° | 2937 | 0.36 | 5 |
| 5-1-1(F) | 20° | 60° | −75° | 2986 | 0.32 | 21 |

As shown in Table 37, every specimen using a piezoelectric substrate falling in the area 5-1-1 (excluding the area 5-1-1-1) had a SAW velocity of at most 3100 m/s, an electromechanical coupling factor ($k^2$) of greater than 0.3%, and a good temperature coefficient of frequency (TCF).

EXAMPLE 37

Table 38 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 5-1-1-1.

TABLE 38

(AREA 5-1-1-1)

| SAMPLE No. | φ | θ | ψ | SAW Velocity (m/s) | K² (%) | TCF (ppm/C. °) |
|---|---|---|---|---|---|---|
| 5-1-1-1(A) | 20° | 35° | −65° | 3024 | 0.42 | −5 |
| 5-1-1-1(B) | 20° | 35° | −55° | 2991 | 0.41 | −3 |
| 5-1-1-1(C) | 20° | 40° | −50° | 2971 | 0.46 | −12 |

TABLE 38-continued (AREA 5-1-1-1)

| SAMPLE No. | φ | θ | ψ | SAW Velocity (m/s) | K² (%) | TCF (ppm/C. °) |
|---|---|---|---|---|---|---|
| 5-1-1-1(D) | 20° | 45° | −45° | 2941 | 0.43 | −16 |
| 5-1-1-1(E) | 20° | 50° | −65° | 2998 | 0.51 | −7 |
| 5-1-1-1(F) | 20° | 55° | −70° | 2993 | 0.42 | 6 |

As shown in Table 38, every specimen using a piezoelectric substrate falling in the area 5-1-1-1 had a SAW velocity of at most 3100 m/s, an electromechanical coupling factor (k²) of greater than 0.4%, and a good temperature coefficient of frequency (TCF).

EXAMPLE 38

Table 39 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 5-2 (excluding the area 5-2-1).

TABLE 39

(AREA 5-2)

| SAMPLE No. | φ | θ | ψ | SAW Velocity (m/s) | K² (%) | TCF (ppm/C. °) |
|---|---|---|---|---|---|---|
| 5-2(A) | 20° | 30° | −5° | 2860 | 0.20 | 24 |
| 5-2(B) | 20° | 40° | −20° | 2872 | 0.27 | −6 |
| 5-2(C) | 20° | 65° | 40° | 2889 | 0.20 | −20 |
| 5-2(D) | 20° | 80° | 30° | 2858 | 0.27 | −26 |
| 5-2(E) | 20° | 95° | 0° | 2824 | 0.21 | −26 |
| 5-2(F) | 20° | 100° | 10° | 2833 | 0.24 | −27 |

As shown in Table 39, every specimen using a piezoelectric substrate falling in the area 5-2 (excluding the area 5-2-1) had a SAW velocity of at most 2900 m/s, an electromechanical coupling factor (k²) of greater than 0.2%, and a good temperature coefficient of frequency (TCF).

EXAMPLE 39

Table 40 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 5-2-1.

TABLE 40

(AREA 5-2-1)

| SAMPLE No. | φ | θ | ψ | SAW Velocity (m/s) | K² (%) | TCF (ppm/C. °) |
|---|---|---|---|---|---|---|
| 5-2-1(A) | 20° | 45° | −15° | 2856 | 0.30 | −13 |
| 5-2-1(B) | 20° | 50° | 5° | 2839 | 0.33 | −10 |
| 5-2-1(C) | 20° | 55° | 0° | 2833 | 0.36 | −20 |
| 5-2-1(D) | 20° | 75° | 25° | 2858 | 0.31 | −31 |
| 5-2-1(E) | 20° | 85° | 15° | 2841 | 0.33 | −37 |

As shown in Table 40, every specimen using a piezoelectric substrate falling in the area 5-2-1 had a SAW velocity of at most 2900 m/s, an electromechanical coupling factor (k²) of greater than 0.3%, and a good temperature coefficient of frequency (TCF).

EXAMPLE 40

Table 41 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 5-3 (excluding the area 5-3-1).

TABLE 41

(AREA 5-3)

| SAMPLE No. | φ | θ | ψ | SAW Velocity (m/s) | K² (%) | TCF (ppm/C. °) |
|---|---|---|---|---|---|---|
| 5-3(A) | 20° | 115° | −80° | 2971 | 0.21 | 52 |
| 5-3(B) | 20° | 135° | −50° | 2933 | 0.24 | 12 |
| 5-3(C) | 20° | 150° | −60° | 2992 | 0.23 | −1 |
| 5-3(D) | 20° | 150° | −70° | 3025 | 0.23 | 0 |

As shown in Table 41, every specimen using a piezoelectric substrate falling in the area 5-3 (excluding the area 5-3-1) had a SAW velocity of at most 3100 m/s, an electromechanical coupling factor (k²) of greater than 0.2%, and a good temperature coefficient of frequency (TCF).

EXAMPLE 41

Table 42 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 5-3-1 (excluding the area 5-3-1-1).

TABLE 42

(AREA 5-3-1)

| SAMPLE No. | φ | θ | ψ | SAW Velocity (m/s) | K² (%) | TCF (ppm/C. °) |
|---|---|---|---|---|---|---|
| 5-3-1(A) | 20° | 120° | −70° | 2955 | 0.31 | 44 |
| 5-3-1(B) | 20° | 120° | −80° | 3001 | 0.33 | 39 |
| 5-3-1(C) | 20° | 140° | −55° | 2969 | 0.32 | 4 |
| 5-3-1(D) | 20° | 145° | −60° | 2998 | 0.35 | −5 |

As shown in Table 42, every specimen using a piezoelectric substrate falling in the area 5-3-1 (excluding the area 5-3-1-1) had a SAW velocity of at most 3100 m/s, an electromechanical coupling factor (k²) of greater than 0.3%, and a good temperature coefficient of frequency (TCF).

EXAMPLE 42

Table 43 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 5-3-1-1.

TABLE 43

(AREA 5-3-1-1)

| SAMPLE No. | φ | θ | ψ | SAW Velocity (m/s) | K² (%) | TCF (ppm/C. °) |
|---|---|---|---|---|---|---|
| 5-3-1-1(A) | 20° | 125° | −80° | 3030 | 0.45 | 23 |
| 5-3-1-1(B) | 20° | 135° | −75° | 3049 | 0.59 | −2 |
| 5-3-1-1(C) | 20° | 140° | −70° | 3039 | 0.54 | −8 |

TABLE 43-continued (AREA 5-3-1-1)

| SAMPLE No. | φ | θ | ψ | SAW Velocity (m/s) | K² (%) | TCF (ppm/C. °) |
|---|---|---|---|---|---|---|
| 5-3-1-1(D) | 20° | 145° | −65° | 3020 | 0.40 | −9 |
| 5-3-1-1(E) | 20° | 145° | −80° | 3076 | 0.45 | −16 |

As shown in Table 43, every specimen using a piezoelectric substrate falling in the area 5-3-1-1 had a SAW velocity of at most 3100 m/s, an electromechanical coupling factor ($k^2$) of greater than 0.4%, and a good temperature coefficient of frequency (TCF).

EXAMPLE 43

Table 44 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 6-1 (excluding the area 6-1-1).

TABLE 44

(AREA 6-1)

| SAMPLE No. | φ | θ | ψ | SAW Velocity (m/s) | K² (%) | TCF (ppm/C. °) |
|---|---|---|---|---|---|---|
| 6-1(A) | 25° | 30° | −35° | 2916 | 0.20 | 8 |
| 6-1(B) | 25° | 45° | −25° | 2873 | 0.24 | −11 |
| 6-1(C) | 25° | 65° | −45° | 2868 | 0.20 | 16 |
| 6-1(D) | 25° | 65° | −60° | 2910 | 0.26 | 29 |
| 6-1(E) | 25° | 65° | −80° | 2977 | 0.21 | 36 |

As shown in Table 44, every specimen using a piezoelectric substrate falling in the area 6-1 (excluding the area 6-1-1) had a SAW velocity of at most 3100 m/s, an electromechanical coupling factor ($k^2$) of greater than 0.2%, and a good temperature coefficient of frequency (TCF).

EXAMPLE 44

Table 45 shows the measured SAW velocities, electromechanical coupling factors ($K^2$), and temperature coefficient of frequencies (TCFs) of several surface acoustic wave device specimens whose Euler's angles (φ, θ, ψ) of the piezoelectric substrates were included in the area 6-1-1 (excluding the area 6-1-1-1).

TABLE 45

(AREA 6-1-1)

| SAMPLE No. | φ | θ | ψ | SAW Velocity (m/s) | K² (%) | TCF (ppm/C. °) |
|---|---|---|---|---|---|---|
| 6-1-1(A) | 25° | 35° | −45° | 2951 | 0.32 | −7 |
| 6-1-1(B) | 25° | 55° | −80° | 3027 | 0.38 | 12 |
| 6-1-1(C) | 25° | 60° | −55° | 2915 | 0.32 | 16 |
| 6-1-1(D) | 25° | 60° | −70° | 2968 | 0.36 | 21 |

As shown in Table 45, every specimen using a piezoelectric substrate falling in the area 6-1-1 (excluding the area 6-1-1-1) had a SAW velocity of at most 3100 m/s, an electromechanical coupling factor ($k^2$) of greater than 0.3%, and a good temperature coefficient of frequency (TCF).

EXAMPLE 45

Table 46 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 6-1-1-1.

TABLE 46

(AREA 6-1-1-1)

| SAMPLE No. | φ | θ | ψ | SAW Velocity (m/s) | K² (%) | TCF (ppm/C. °) |
|---|---|---|---|---|---|---|
| 6-1-1-1(A) | 25° | 35° | −60° | 3009 | 0.43 | −9 |
| 6-1-1-1(B) | 25° | 40° | −70° | 3042 | 0.54 | −18 |
| 6-1-1-1(C) | 25° | 45° | −50° | 2954 | 0.44 | −10 |
| 6-1-1-1(D) | 25° | 50° | −65° | 2996 | 0.53 | −4 |
| 6-1-1-1(E) | 25° | 55° | −75° | 3011 | 0.44 | 8 |

As shown in Table 46, every specimen using a piezoelectric substrate falling in the area 6-1-1-1 had a SAW velocity of at most 3100 m/s, an electromechanical coupling factor ($k^2$) of greater than 0.4%, and a good temperature coefficient of frequency (TCF).

EXAMPLE 46

Table 47 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 6-2 (excluding the area 6-2-1).

TABLE 47

(AREA 6-2)

| SAMPLE No. | φ | θ | ψ | SAW Velocity (m/s) | K² (%) | TCF (ppm/C. °) |
|---|---|---|---|---|---|---|
| 6-2(A) | 25° | 35° | −15° | 2867 | 0.23 | 12 |
| 6-2(B) | 25° | 40° | 5° | 2845 | 0.22 | 23 |
| 6-2(C) | 25° | 85° | 35° | 2859 | 0.21 | −27 |
| 6-2(D) | 25° | 100° | 25° | 2851 | 0.25 | −35 |
| 6-2(E) | 25° | 125° | −5° | 2827 | 0.22 | 2 |
| 6-2(F) | 25° | 145° | −20° | 2873 | 0.20 | 14 |

As shown in Table 47, every specimen using a piezoelectric substrate falling in the area 6-2 (excluding the area 6-2-1) had a SAW velocity of at most 2900 m/s, an electromechanical coupling factor ($k^2$) of greater than 0.2%, and a good temperature coefficient of frequency (TCF).

EXAMPLE 47

Table 48 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 6-2-1.

TABLE 48

(AREA 6-2-1)

| SAMPLE No. | φ | θ | ψ | SAW Velocity (m/s) | K² (%) | TCF (ppm/C. °) |
|---|---|---|---|---|---|---|
| 6-2-1(A) | 25° | 50° | −10° | 2841 | 0.30 | −8 |
| 6-2-1(B) | 25° | 60° | 0° | 2828 | 0.32 | −12 |

TABLE 48-continued (AREA 6-2-1)

| SAMPLE No. | φ | θ | ψ | SAW Velocity (m/s) | K² (%) | TCF (ppm/C. °) |
|---|---|---|---|---|---|---|
| 6-2-1(C) | 25° | 70° | 5° | 2831 | 0.32 | −26 |
| 6-2-1(D) | 25° | 80° | 15° | 2844 | 0.33 | −40 |
| 6-2-1(E) | 25° | 9° | 20° | 2847 | 0.30 | −40 |

As shown in Table 48, every specimen using a piezoelectric substrate falling in the area 6-2-1 had a SAW velocity of at most 2900 m/s, an electromechanical coupling factor (k²) of greater than 0.3%, and a good temperature coefficient of frequency (TCF).

EXAMPLE 48

Table 49 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 6-3 (excluding the area 6-3-1).

TABLE 49

(AREA 6-3)

| SAMPLE No. | φ | θ | ψ | SAW Velocity (m/s) | K² (%) | TCF (ppm/C. °) |
|---|---|---|---|---|---|---|
| 6-3(A) | 25° | 115° | −80° | 2973 | 0.21 | 42 |
| 6-3(B) | 25° | 120° | −85° | 3027 | 0.28 | 26 |
| 6-3(C) | 25° | 135° | −45° | 2921 | 0.25 | −2 |
| 6-3(D) | 25° | 140° | −40° | 2917 | 0.21 | −6 |
| 6-3(E) | 25° | 150° | −75° | 3039 | 0.23 | 8 |

As shown in Table 49, every specimen using a piezoelectric substrate falling in the area 6-3 (excluding the area 6-3-1) had a SAW velocity of at most 3100 m/s, an electromechanical coupling factor (k²) of greater than 0.2%, and a good temperature coefficient of frequency (TCF).

EXAMPLE 49

Table 50 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 6-3-1 (excluding the area 6-3-1-1).

TABLE 50

(AREA 6-3-1)

| SAMPLE No. | φ | θ | ψ | SAW Velocity (m/s) | K² (%) | TCF (ppm/C. °) |
|---|---|---|---|---|---|---|
| 6-3-1(A) | 25° | 125° | −80° | 3004 | 0.33 | 27 |
| 6-3-1(B) | 25° | 135° | −55° | 2961 | 0.39 | −3 |
| 6-3-1(C) | 25° | 140° | −50° | 2954 | 0.32 | −8 |

As shown in Table 50, every specimen using a piezoelectric substrate falling in the area 6-3-1 (excluding the area 6-3-1-1) had a SAW velocity of at most 3100 m/s, an electromechanical coupling factor (k²) of greater than 0.3%, and a good temperature coefficient of frequency (TCF).

EXAMPLE 50

Table 51 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 6-3-1-1.

TABLE 51

(AREA 6-3-1-1)

| SAMPLE No. | φ | θ | ψ | SAW Velocity (m/s) | K² (%) | TCF (ppm/C. °) |
|---|---|---|---|---|---|---|
| 6-3-1-1(A) | 25° | 125° | −75° | 3009 | 0.46 | 14 |
| 6-3-1-1(B) | 25° | 130° | −65° | 2987 | 0.48 | 4 |
| 6-3-1-1(C) | 25° | 135° | −70° | 3030 | 0.58 | −10 |
| 6-3-1-1(D) | 25° | 140° | −60° | 2998 | 0.47 | −12 |
| 6-3-1-1(E) | 25° | 145° | −80° | 3072 | 0.42 | −20 |

As shown in Table 51, every specimen using a piezoelectric substrate falling in the area 6-3-1-1 had a SAW velocity of at most 3100 m/s, an electromechanical coupling factor (k²) of greater than 0.4%, and a good temperature coefficient of frequency (TCF).

EXAMPLE 51

Table 52 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 7-1 (excluding the area 7-1-1).

TABLE 52

(AREA 7-1)

| SAMPLE No. | φ | θ | ψ | SAW Velocity (m/s) | K² (%) | TCF (ppm/C. °) |
|---|---|---|---|---|---|---|
| 7-1(A) | 30° | 30° | −65° | 3011 | 0.26 | 6 |
| 7-1(B) | 30° | 40° | −35° | 2906 | 0.22 | −8 |
| 7-1(C) | 30° | 50° | −40° | 2895 | 0.24 | −2 |
| 7-1(D) | 30° | 65° | −55° | 2889 | 0.21 | 30 |
| 7-1(E) | 30° | 65° | −80° | 2976 | 0.22 | 39 |

As shown in Table 52, every specimen using a piezoelectric substrate falling in the area 7-1 (excluding the area 7-1-1) had a SAW velocity of at most 3100 m/s, an electromechanical coupling factor (k²) of greater than 0.2%, and a good temperature coefficient of frequency (TCF).

EXAMPLE 52

Table 53 shows the measured SAW velocities, electromechanical coupling factors (k²), and temperature coefficient of frequencies (TCFs) of several surface acoustic wave device specimens whose Euler's angles (φ, θ, ψ) of the piezoelectric substrates were included in the area 7-1-1 (excluding the area 7-1-1-1).

TABLE 53

(AREA 7-1-1)

| SAMPLE No. | φ | θ | ψ | SAW Velocity (m/s) | K² (%) | TCF (ppm/C. °) |
|---|---|---|---|---|---|---|
| 7-1-1(A) | 30° | 35° | −50° | 2966 | 0.33 | −8 |
| 7-1-1(B) | 30° | 45° | −45° | 2928 | 0.31 | −7 |
| 7-1-1(C) | 30° | 60° | −65° | 2945 | 0.34 | 25 |
| 7-1-1(D) | 30° | 60° | −80° | 3005 | 0.33 | 24 |

As shown in Table 53, every specimen using a piezoelectric substrate falling in the area 7-1-1 (excluding the area 7-1-1-1) had a SAW velocity of at most 3100 m/s, an electromechanical coupling factor ($k^2$) of greater than 0.3%, and a good temperature coefficient of frequency (TCF).

EXAMPLE 53

Table 54 shows the measured SAW velocities, electromechanical coupling factors ($k^2$), and temperature coefficient of frequencies (TCFs) of several surface acoustic wave device specimens whose Euler's angles ($\phi$, $\theta$, $\psi$) of the piezoelectric substrates were included in the area 7-1-1-1.

TABLE 54

(AREA 7-1-1-1)

| SAMPLE No. | $\phi$ | $\theta$ | $\psi$ | SAW Velocity (m/s) | $K^2$ (%) | TCF (ppm/C. °) |
|---|---|---|---|---|---|---|
| 7-1-1-1(A) | 30° | 35° | −65° | 3026 | 0.45 | −11 |
| 7-1-1-1(B) | 30° | 40° | −55° | 2982 | 0.45 | −12 |
| 7-1-1-1(C) | 30° | 45° | −75° | 3050 | 0.56 | −14 |
| 7-1-1-1(D) | 30° | 50° | −80° | 3047 | 0.44 | 0 |
| 7-1-1-1(E) | 30° | 55° | −70° | 2990 | 0.46 | 12 |

As shown in Table 54, every specimen using a piezoelectric substrate falling in the area 7-1-1-1 had a SAW velocity of at most 3100 m/s, an electromechanical coupling factor ($k^2$) of greater than 0.4%, and a good temperature coefficient of frequency (TCF).

EXAMPLE 54

Table 55 shows the measured SAW velocities, electromechanical coupling factors ($k^2$), and temperature coefficient of frequencies (TCFs) of several surface acoustic wave device specimens whose Euler's angles ($\phi$, $\theta$, $\psi$) of the piezoelectric substrates were included in the area 7-2 (excluding the area 7-2-1).

TABLE 55

(AREA 7-2)

| SAMPLE No. | $\phi$ | $\theta$ | $\psi$ | SAW Velocity (m/s) | $K^2$ (%) | TCF (ppm/C. °) |
|---|---|---|---|---|---|---|
| 7-2(A) | 30° | 35° | −30° | 2899 | 0.20 | 0 |
| 7-2(B) | 30° | 60° | −5° | 2826 | 0.27 | −10 |
| 7-2(C) | 30° | 90° | 35° | 2858 | 0.21 | −27 |
| 7-2(D) | 30° | 125° | 5° | 2831 | 0.24 | 4 |
| 7-2(E) | 30° | 140° | −20° | 2869 | 0.23 | 0 |

As shown in Table 55, every specimen using a piezoelectric substrate falling in the area 7-2 (excluding the area 7-2-1) had a SAW velocity of at most 2900 m/s, an electromechanical coupling factor ($k^2$) of greater than 0.2%, and a good temperature coefficient of frequency (TCF).

Example 55

Table 56 shows the measured SAW velocities, electromechanical coupling factors ($k^2$), and temperature coefficient of frequencies (TCFs) of several surface acoustic wave device specimens whose Euler's angles ($\phi$, $\theta$, $\psi$) of the piezoelectric substrates were included in the area 7-2-1.

TABLE 56

(AREA 7-2-1)

| SAMPLE No. | $\phi$ | $\theta$ | $\psi$ | SAW Velocity (m/s) | $K^2$ (%) | TCF (ppm/C. °) |
|---|---|---|---|---|---|---|
| 7-2-1(A) | 30° | 80° | 20° | 2849 | 0.30 | −39 |
| 7-2-1(B) | 30° | 90° | 10° | 2839 | 0.32 | −42 |
| 7-2-1(C) | 30° | 100° | 15° | 2844 | 0.31 | −39 |

As shown in Table 56, every specimen using a piezoelectric substrate falling in the area 7-2-1 had a SAW velocity of at most 2900 m/s, an electromechanical coupling factor ($k^2$) of greater than 0.3%, and a good temperature coefficient of frequency (TCF).

EXAMPLE 56

Table 57 shows the measured SAW velocities, electromechanical coupling factors ($k^2$), and temperature coefficient of frequencies (TCFs) of several surface acoustic wave device specimens whose Euler's angles ($\phi$, $\theta$, $\psi$) of the piezoelectric substrates were included in the area 7-3 (excluding the area 7-3-1).

TABLE 57

(AREA 7-3)

| SAMPLE No. | $\phi$ | $\theta$ | $\psi$ | SAW Velocity (m/s) | $K^2$ (%) | TCF (ppm/C. °) |
|---|---|---|---|---|---|---|
| 7-3(A) | 30° | 115° | −80° | 2976 | 0.22 | 39 |
| 7-3(B) | 30° | 115° | −55° | 2889 | 0.21 | 30 |
| 7-3(C) | 30° | 130° | −40° | 2895 | 0.24 | −2 |
| 7-3(D) | 30° | 140° | −35° | 2906 | 0.22 | −8 |
| 7-3(E) | 30° | 150° | −65° | 3011 | 0.26 | 6 |

As shown in Table 57, every specimen using a piezoelectric substrate falling in the area 7-3 (excluding the area 7-3-1) had a SAW velocity of at most 3100 m/s, an electromechanical coupling factor ($k^2$) of greater than 0.2%, and a good temperature coefficient of frequency (TCF).

EXAMPLE 57

Table 58 shows the measured SAW velocities, electromechanical coupling factors ($k^2$), and temperature coefficient of frequencies (TCFs) of several surface acoustic wave device specimens whose Euler's angles ($\phi$, $\theta$, $\psi$) of the piezoelectric substrates were included in the area 7-3-1 (excluding the area 7-3-1-1).

TABLE 58

(AREA 7-3-1)

| SAMPLE No. | $\phi$ | $\theta$ | $\psi$ | SAW Velocity (m/s) | $K^2$ (%) | TCF (ppm/C. °) |
|---|---|---|---|---|---|---|
| 7-3-1(A) | 30° | 120° | −80° | 3005 | 0.33 | 24 |
| 7-3-1(B) | 30° | 120° | −65° | 2945 | 0.34 | 25 |
| 7-3-1(C) | 30° | 135° | −45° | 2928 | 0.31 | −7 |
| 7-3-1(D) | 30° | 145° | −50° | 2966 | 0.33 | −8 |

As shown in Table 58, every specimen using a piezoelectric substrate falling in the area 7-3-1 (excluding the area 7-3-1-1) had a SAW velocity of at most 3100 m/s, an electromechanical coupling factor ($k^2$) of greater than 0.3%, and a good temperature coefficient of frequency (TCF).

EXAMPLE 58

Table 59 shows the measured SAW velocities, electromechanical coupling factors ($k^2$), and temperature coefficient of frequencies (TCFs) of several surface acoustic wave device specimens whose Euler's angles (φ, θ, ψ) of the piezoelectric substrates were included in the area 7-3-1-1.

TABLE 59

(AREA 7-3-1-1)

| SAMPLE No. | φ | θ | ψ | SAW Velocity (m/s) | $K^2$ (%) | TCF (ppm/C. °) |
|---|---|---|---|---|---|---|
| 7-3-1-1(A) | 30° | 125° | −70° | 2990 | 0.46 | 12 |
| 7-3-1-1(B) | 30° | 130° | −80° | 3047 | 0.44 | 0 |
| 7-3-1-1(C) | 30° | 135° | −75° | 3050 | 0.56 | −14 |
| 7-3-1-1(D) | 30° | 140° | −55° | 2982 | 0.45 | −12 |
| 7-3-1-1(E) | 30° | 145° | −65° | 3026 | 0.45 | −11 |

As shown in Table 59, every specimen using a piezoelectric substrate falling in the area 7-3-1-1 had a SAW velocity of at most 3100 m/s, an electromechanical coupling factor ($k^2$) of greater than 0.4%, and a good temperature coefficient of frequency (TCF).

The present invention has thus been shown and described with reference to specific embodiments. However, it should be noted that the present invention is in no way limited to the details of the described arrangements but changes and modifications may be made without departing from the scope of the appended claims.

As described above, according to the present invention, a compact and wide band surface acoustic wave device for intermediate-frequency can be provided. Further, according to the present invention, a piezoelectric substrate for use in a surface acoustic wave device having high electromechanical coupling factor and low SAW velocity can be also provided.

What is claimed is:

1. A surface acoustic wave device comprising a piezoelectric substrate and inter-digital electrodes formed on the piezoelectric substrate, wherein:
   the piezoelectric substrate has a crystal structure of the $Ca_3Ga_2Ge_4O_{14}$ type and is represented by the chemical formula, $Ca_3TaGa_3Si_2O_{14}$; and
   a cut angle of the piezoelectric substrate cut out of the single crystal and a direction of propagation of surface acoustic waves on the piezoelectric substrate represented in terms of Euler's angles (φ, θ, ψ) are found in an area represented by −2.5°≦φ≦2.5°, 30°≦θ≦90°, and −65°≦ψ≦65°.

2. The surface acoustic wave device as claimed in claim 1, wherein θ ranges from 35° to 80° and ψ ranges from −55° to 55°.

3. The surface acoustic wave device as claimed in claim 2, wherein θ ranges from 45° to 70° and ψ ranges from −15° to 15°.

4. The surface acoustic wave device as claimed in claim 2, wherein θ ranges from 40° to 60° and ψ ranges from 15° to 50°.

5. The surface acoustic wave device as claimed in claim 2, wherein θ ranges from 40° to 60° and ψ ranges from −50° to −15°.

6. A surface acoustic wave device comprising a piezoelectric substrate and inter-digital electrodes formed on the piezoelectric substrate, wherein:
   the piezoelectric substrate has a crystal structure of the $Ca_3Ga_2Ge_4O_{14}$ type and is represented by the chemical formula, $Ca_3TaGa_3Si_2O_{14}$; and
   a cut angle of the piezoelectric substrate cut out of the single crystal and a direction of propagation of surface acoustic waves on the piezoelectric substrate represented in terms of Euler's angles (φ, θ, ψ) are found in an area represented by −2.5°≦φ≦2.5°, 120°≦θ≦155°, and 65°≦ψ≦85°.

7. The surface acoustic wave device as claimed in claim 6, wherein θ ranges from 125° to 145° and ψ ranges from 75° to 85°.

8. A surface acoustic wave device comprising a piezoelectric substrate and inter-digital electrodes formed on the piezoelectric substrate, wherein:
   the piezoelectric substrate has a crystal structure of the $Ca_3Ga_2Ge_4O_{14}$ type and is represented by the chemical formula, $Ca_3TaGa_3Si_2O_{14}$; and
   a cut angle of the piezoelectric substrate cut out of the single crystal and a direction of propagation of surface acoustic waves on the piezoelectric substrate represented in terms of Euler's angles (φ, θ, ψ) are found in an area represented by −2.5°≦φ≦2.5°, 120°≦θ≦155°, and −85°≦ψ≦−65°.

9. The surface acoustic wave device as claimed in claim 8, wherein θ ranges from 125° to 145° and ψ ranges from −85° to −75°.

10. A surface acoustic wave device comprising a piezoelectric substrate and inter-digital electrodes formed on the piezoelectric substrate, wherein:
    the piezoelectric substrate has a crystal structure of the $Ca_3Ga_2Ge_4O_{14}$ type and is represented by the chemical formula, $Ca_3TaGa_3Si_2O_{14}$; and
    a cut angle of the piezoelectric substrate cut out of the single crystal and a direction of propagation of surface acoustic waves on the piezoelectric substrate represented in terms of Euler's angles (φ, θ, ψ) are found in an area represented by 2.5°≦φ≦7.5°, 30°≦θ≦90°, and −75°≦ψ≦60°.

11. The surface acoustic wave device as claimed in claim 10, wherein θ ranges from 35° to 80° and ψ ranges from −65° to 50°.

12. The surface acoustic wave device as claimed in claim 11, wherein θ ranges from 45° to 70° and ψ ranges from −10° to 20°.

13. The surface acoustic wave device as claimed in claim 11, wherein θ ranges from 35° to 60° and ψ ranges from −60° to −25°.

14. A surface acoustic wave device comprising a piezoelectric substrate and inter-digital electrodes formed on the piezoelectric substrate, wherein:
    the piezoelectric substrate has a crystal structure of the $Ca_3Ga_2Ge_4O_{14}$ type and is represented by the chemical formula, $Ca_3TaGa_3Si_2O_{14}$; and
    a cut angle of the piezoelectric substrate cut out of the single crystal and a direction of propagation of surface acoustic waves on the piezoelectric substrate represented in terms of Euler's angles (φ, θ, ψ) are found in an area represented by 2.5°≦φ≦7.5°, 120°≦θ≦150°, and 75°≦ψ≦85°.

15. The surface acoustic wave device as claimed in claim 14, wherein θ ranges from 125° to 145° and ψ ranges from 80° to 85°.

16. A surface acoustic wave device comprising a piezoelectric substrate and inter-digital electrodes formed on the piezoelectric substrate, wherein:
    the piezoelectric substrate has a crystal structure of the $Ca_3Ga_2Ge_4O_{14}$ type and is represented by the chemical formula, $Ca_3TaGa_3Si_2O_{14}$; and
    a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $2.5° \leq \phi \leq 7.5°$, $120° \leq \theta \leq 155°$, and $-85° \leq \psi \leq -60°$.

17. The surface acoustic wave device as claimed in claim 16, wherein $\theta$ ranges from 120° to 145° and $\psi$ ranges from −85° to −70°.

18. The surface acoustic wave device as claimed in claim 17, wherein $\theta$ ranges from 130° to 140° and $\psi$ ranges from −80° to −75°.

19. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $7.5° \leq \phi \leq 12.5°$, $30° \leq \theta \leq 100°$, and $-80° \leq \psi \leq 55°$.

20. The surface acoustic wave device as claimed in claim 19, wherein $\theta$ ranges from 30° to 85° and $\psi$ ranges from −75° to 40°.

21. The surface acoustic wave device as claimed in claim 20, wherein $\theta$ ranges from 45° to 70° and $\psi$ ranges from −10° to 20°.

22. The surface acoustic wave device as claimed in claim 20, wherein $\theta$ ranges from 35° to 60° and $\psi$ ranges from −60° to −30°.

23. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $7.5° \leq \phi \leq 12.5°$, $120° \leq \theta \leq 145°$, and $75° \leq \psi \leq 85°$.

24. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $7.5° \leq \phi \leq 12.5°$, $110° \leq \theta \leq 155°$, and $-85° \leq \psi \leq -55°$.

25. The surface acoustic wave device as claimed in claim 24, wherein $\theta$ ranges from 125° to 145° and $\psi$ ranges from −85° to −65°.

26. The surface acoustic wave device as claimed in claim 25, wherein $\theta$ ranges from 125° to 145° and $\psi$ ranges from −80° to −70°.

27. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $12.5° \leq \phi \leq 17.5°$, $20° \leq \theta \leq 105°$, and $-85° \leq \psi \leq 50°$.

28. The surface acoustic wave device as claimed in claim 27, wherein $\theta$ ranges from 35° to 90° and $\psi$ ranges from −10° to 30°.

29. The surface acoustic wave device as claimed in claim 27, wherein $\theta$ ranges from 35° to 60° and $\psi$ ranges from −70° to −15°.

30. The surface acoustic wave device as claimed in claim 29, wherein $\theta$ ranges from 40° to 55° and $\psi$ ranges from −70° to −40°.

31. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $12.5° \leq \phi \leq 17.5°$, $125° \leq \theta \leq 140°$, and $80° \leq \psi \leq 85°$.

32. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $12.5° \leq \phi \leq 17.5°$, $115° \leq \theta \leq 155°$, and $-85° \leq \psi \leq -50°$.

33. The surface acoustic wave device as claimed in claim 32, wherein $\theta$ ranges from 120° to 145° and $\psi$ ranges from −80° to −60°.

34. The surface acoustic wave device as claimed in claim 33, wherein $\theta$ ranges from 125° to 145° and $\psi$ ranges from −80° to −65°.

35. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $17.5° \leq \phi \leq 22.5°$, $25° \leq \theta \leq 70°$, and $-80° \leq \psi \leq -20°$.

36. The surface acoustic wave device as claimed in claim 35, wherein $\theta$ ranges from 35° to 60° and $\psi$ ranges from −75° to −35°.

37. The surface acoustic wave device as claimed in claim 36, wherein $\theta$ ranges from 35° to 55° and $\psi$ ranges from −70° to −45°.

38. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $17.5° \leq \phi \leq 22.5°$, $25° \leq \theta \leq 110°$, and $-20° \leq \psi \leq 40°$.

39. The surface acoustic wave device as claimed in claim 38, wherein $\theta$ ranges from 45° to 90° and $\psi$ ranges from −15° to 25°.

40. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $17.5° \leq \phi \leq 22.5°$, $115° \leq \psi \leq 155°$, and $-80° \leq \psi \leq -45°$.

41. The surface acoustic wave device as claimed in claim 40, wherein $\theta$ ranges from 120° to 145° and $\psi$ ranges from −80° to −55°.

42. The surface acoustic wave device as claimed in claim 41, wherein $\theta$ ranges from 125° to 145° and $\psi$ ranges from −80° to −65°.

43. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $22.5° \leq \phi \leq 27.5°$, $25° \leq \theta \leq 70°$, and $-85° \leq \psi \leq -20°$.

44. The surface acoustic wave device as claimed in claim 43, wherein $\theta$ ranges from 30° to 60° and $\psi$ ranges from −80° to −40°.

45. The surface acoustic wave device as claimed in claim 44, wherein $\theta$ ranges from 35° to 55° and $\psi$ ranges from −75° to −50°.

46. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $22.5° \leq \phi \leq 27.5°$, $25° \leq \theta \leq 145°$, and $-20 \leq \psi \leq 40°$.

47. The surface acoustic wave device as claimed in claim 46, wherein $\theta$ ranges from 50° to 95° and $\psi$ ranges from −10° to 20°.

48. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $22.5° \leq \phi \leq 27.5°$, $110° \leq \theta \leq 155°$, and $-80° \leq \psi \leq -40°$.

49. The surface acoustic wave device as claimed in claim 48, wherein $\theta$ ranges from 120° to 145° and $\psi$ ranges from −80° to −50°.

50. The surface acoustic wave device as claimed in claim 49, wherein $\theta$ ranges from 125° to 145° and $\psi$ ranges from −80° to −60°.

51. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $27.5° \leq \phi \leq 32.5°$, $25° \leq \theta \leq 70°$, and $-85° \leq \psi \leq -30°$.

52. The surface acoustic wave device as claimed in claim 51, wherein $\theta$ ranges from 35° to 60° and $\psi$ ranges from −80° to −45°.

53. The surface acoustic wave device as claimed in claim 52, wherein $\theta$ ranges from 35° to 55° and $\psi$ ranges from −80° to −55°.

54. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $27.5° \leq \phi \leq 32.5°$, $30° \leq \theta \leq 150°$, and $-30° \leq \psi \leq 40°$.

55. The surface acoustic wave device as claimed in claim 54, wherein $\theta$ ranges from 80° to 100° and $\psi$ ranges from 10° to 20°.

56. A surface acoustic wave device comprising a piezoelectric substrate and inter-digital electrodes formed on the piezoelectric substrate, wherein:

the piezoelectric substrate has a crystal structure of the $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in an area represented by $27.5° \leq \phi \leq 32.5°$, $110° \leq \theta \leq 155°$, and $-85° \leq \psi \leq -30°$.

57. The surface acoustic wave device as claimed in claim 56, wherein $\theta$ ranges from 120° to 145° and $\psi$ ranges from −80° to −45°.

58. The surface acoustic wave device as claimed in claim 57, wherein $\theta$ ranges from 125° to 145° and $\psi$ ranges from −80° to −55°.

59. A piezoelectric substrate for use in a surface acoustic wave device, characterized in that the piezoelectric substrate has a crystal structure of $Ca_3Ga_2Ge_4O_{14}$ type and is represented by the chemical formula, $Ca_3TaGa_3Si_2O_{14}$; and a cut angle of the piezoelectric substrate cut out of the single crystal and a direction of propagation of surface acoustic waves on the piezoelectric substrate represented in terms of Euler's angles ($\phi$, $\theta$, $\psi$) are found in one of a first area represented by $-2.5° \leq \phi \leq 2.5°$, $30° \leq \theta \leq 90°$, and $-65° \leq \psi \leq 65°$, a second area represented by $-2.5° \leq \phi \leq 2.5°$, $120° \leq \theta \leq 155°$, and $65° \leq \psi \leq 85°$, a third area represented by $-2.5° \leq \phi 2.5°$, $120° \leq \theta \leq 155°$, and $-85° \leq \psi \leq -65°$, a fourth area represented by $2.5° \leq \phi \leq 7.5°$, $30° \leq \theta \leq 90°$, and $-75° \leq \psi \leq 60°$, a fifth area represented by $2.5° \leq \phi \leq 7.5°$, $120° \leq \theta \leq 150°$, and $75° \leq \psi \leq 85°$, a sixth area represented by $2.5° \leq \phi \leq 7.5°$, $120° \leq \theta \leq 155°$, and $-85° \leq \psi \leq -60°$, a seventh area represented by $7.5° \leq \phi \leq 12.5°$, $30° \leq \theta \leq 100°$, and $-80° \leq \psi \leq 55°$, an eighth area represented by $7.5° \leq \phi \leq 12.5°$, $120° \leq \theta \leq 150°$, and $75° \leq \psi 85°$, a ninth area represented by $7.5° \leq \phi \leq 12.5°$, $110° \leq \theta \leq 155°$, and $-85° \leq \psi \leq -55°$, a tenth area represented by $12.5° \leq \phi \leq 17.5°$, $20° \leq \theta \leq 105°$, and $-85° \leq \psi \leq -50°$, an eleventh area represented by $12.5° \leq \phi \leq 17.5°$, $125° \leq \theta \leq 140°$, and $80° \leq \psi \leq 85°$, a twelfth area represented by $12.5° \leq \phi \leq 17.5°$, $115° \leq \theta \leq 155°$, and $-85° \leq \psi \leq -50°$, a thirteenth area represented by $17.5° \leq \phi \leq 22.5°$, $25° \leq \theta \leq 70°$, and $-80° \leq \psi \leq -20°$, a fourteenth area represented by $17.5° \leq \phi \leq 22.5°$, $25° \leq \theta \leq 110°$, and $-20° \leq \psi \leq 40°$, a fifteenth area represented by $17.5° \leq \phi \leq 22.5°$, $115° \leq \theta \leq 155°$, and $-80° \leq \psi \leq -45°$, a sixteenth area represented by $22.5° \leq \phi \leq 27.5°$, $25° \leq \theta \leq 70°$, and $-85° \leq \psi \leq -20°$, a seventeenth area represented by $22.5° \leq \phi \leq 27.5°$, $25° \leq \theta \leq 145°$, and $-20° \leq \psi \leq -40°$, an eighteenth area represented by $22.5° \leq \phi \leq 27.5°$, $110° \leq \theta \leq 155°$, and $-80° \leq \psi \leq -40°$, a nineteenth area represented by $27.5° \leq \phi \leq 32.5°$, $25° \leq \theta \leq 70°$, and $-85° \leq \psi \leq -30°$, a twentieth area represented by $27.5° \leq \phi \leq 32.5°$, $30° \leq \theta \leq 150°$, and $-30° \leq \psi \leq 40°$, and a twenty-first area represented by $27.5° \leq \phi \leq 32.5°$, $110° \leq \theta \leq 155°$, and $-85° \leq \psi \leq -30°$.

* * * * *

UNITED STATES PATENT AND TRADEMARK OFFICE
CERTIFICATE OF CORRECTION

PATENT NO. : 6,700,300 B2
APPLICATION NO. : 09/968820
DATED : March 2, 2004
INVENTOR(S) : Kenji Inoue et al.

It is certified that error appears in the above-identified patent and that said Letters Patent is hereby corrected as shown below:

Title page,
Item [56], References Cited, OTHER PUBLICATIONS, "Yasutaka Shimizu" reference, change "vol." to -- v. --.

Column 4,
Line 42, change "120° ≤θ150°" to -- 120° ≤θ≤150° --.
Line 49, change "-85°≤ψ≤50°" to -- -85°≤ψ≤ -50° --.
Line 55, change "25°≤ψ≤70°" to -- 25°≤θ≤70 --.

Column 13,
Line 9, change "65°" to -- -65° --.
Line 16, change "55°" to -- -55° --.

Column 17,
Line 55, change "50" to -- -50° --.

Column 20,
Line 2, change "A" to -- $\lambda$ --.
Line 29, delete the period after "-20° C".
Line 29, delete the period after "80° C".

Column 47,
Line 24, change "115°≤φ≤155°" to -- 115°≤θ≤155° --.
Line 42, change "22.5° ≤27.5°" to -- 22.5° ≤θ≤27.5 --.

Column 49,
Line 12, change "-2.5°≤θ2.5°" to -- -2.5°≤θ≤2.5° --.
Line 19, change "75°≤ψ85°" to -- 75°≤ψ≤85° --.

UNITED STATES PATENT AND TRADEMARK OFFICE
CERTIFICATE OF CORRECTION

PATENT NO. : 6,700,300 B2
APPLICATION NO. : 09/968820
DATED : March 2, 2004
INVENTOR(S) : Kenji Inoue et al.

It is certified that error appears in the above-identified patent and that said Letters Patent is hereby corrected as shown below:

Column 50,
Line 12, change "$-20°\leq\psi\leq-40°$" to -- $-20°\leq\psi\leq40°$ --.

Signed and Sealed this

Twentieth Day of June, 2006

JON W. DUDAS
*Director of the United States Patent and Trademark Office*